United States Patent
Mathuriya et al.

(10) Patent No.: US 11,888,479 B1
(45) Date of Patent: Jan. 30, 2024

(54) NON-LINEAR POLAR MATERIAL BASED LOW POWER MULTIPLIER WITH NOR AND NAND GATE BASED RESET MECHANISM

(71) Applicant: Kepler Computing Inc., San Francisco, CA (US)

(72) Inventors: Amrita Mathuriya, Portland, OR (US); Rafael Rios, Austin, TX (US); Ikenna Odinaka, Durham, NC (US); Rajeev Kumar Dokania, Beaverton, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 47 days.

(21) Appl. No.: 17/449,783

(22) Filed: Oct. 1, 2021

Related U.S. Application Data

(63) Continuation of application No. 17/449,748, filed on Oct. 1, 2021.

(51) Int. Cl.
*H03K 19/23* (2006.01)
*H03K 19/0185* (2006.01)
(Continued)

(52) U.S. Cl.
CPC ........... *H03K 19/23* (2013.01); *G06F 7/4876* (2013.01); *G06F 7/501* (2013.01);
(Continued)

(58) Field of Classification Search
CPC . G06F 7/4876; G06F 7/501; H03K 19/01742; H03K 19/018521; H03K 19/1774; H03K 19/23
See application file for complete search history.

(56) References Cited

U.S. PATENT DOCUMENTS

| 3,260,863 A | 7/1966 | Burns et al. |
| 6,043,675 A | 3/2000 | Miyamoto |

(Continued)

OTHER PUBLICATIONS

"Kepler Logic", Named for Amalie Emmy Noether @ https://en.wikipedia.org/wiki/Emmy_Noether. Downloaded from Internet on Jan. 10, 2020.
Fichtner, S. et al., "AlScN: A III-V semiconductor based ferroelectric", Journal of Applied Physics 125, 114103 (2019); https://doi.org/10.1063/1.5084945, 2019, 28 pages.
Final Office Actiond dated Dec. 15, 2021 for U.S. Appl. No. 17/129,824.
(Continued)

*Primary Examiner* — Kurtis R Bahr
(74) *Attorney, Agent, or Firm* — MUGHAL GAUDRY & FRANKLIN PC

(57) ABSTRACT

A multiplier cell is derived from a 1-bit full adder and an AND gate. The 1-bit full adder is derived from majority and/or minority gates. The majority and/or minority gates include non-linear polar material (e.g., ferroelectric or paraelectric material). A reset mechanism is provided to reset the nodes across the non-linear polar material. The multiplier cell is a hybrid of majority and/or minority gates and complementary metal oxide semiconductor (CMOS) based inverters and/or buffers. The adder uses a non-linear polar capacitor to retain charge with fewer transistors than traditional CMOS sequential circuits. The non-linear polar capacitor includes ferroelectric material, paraelectric material, or non-linear dielectric. Input signals are received by respective terminals of capacitors having non-linear polar material. The other terminals of these capacitors are coupled to a node where the majority function takes place for the inputs.

20 Claims, 35 Drawing Sheets

(51) Int. Cl.
    *G06F 7/487*     (2006.01)
    *H03K 19/017*     (2006.01)
    *G06F 7/501*     (2006.01)
    *H03K 19/17736*     (2020.01)

(52) U.S. Cl.
    CPC .............. *H03K 19/01742* (2013.01); *H03K 19/018521* (2013.01); *H03K 19/1774* (2013.01)

(56) References Cited

U.S. PATENT DOCUMENTS

| | | | |
|---|---|---|---|
| 6,166,583 | A | 12/2000 | Kochi et al. |
| 9,305,929 | B1 | 4/2016 | Karda et al. |
| 9,912,323 | B1 | 3/2018 | Ardalan |
| 10,446,214 | B1 | 10/2019 | Vincenzo et al. |
| 10,944,404 | B1 * | 3/2021 | Manipatruni ........... G06F 7/501 |
| 11,043,259 | B2 | 6/2021 | Wentzlaff et al. |
| 2001/0052619 | A1 | 12/2001 | Inoue et al. |
| 2002/0163058 | A1 | 11/2002 | Chen et al. |
| 2017/0337983 | A1 * | 11/2017 | Wang ..................... G11C 11/221 |
| 2018/0025766 | A1 | 1/2018 | Dietrich et al. |
| 2019/0074295 | A1 | 3/2019 | Schröder |
| 2020/0091407 | A1 | 3/2020 | Liu et al. |
| 2020/0091414 | A1 * | 3/2020 | Liu ..................... G11C 11/1675 |
| 2021/0203324 | A1 * | 7/2021 | Manipatruni ........... H01L 28/55 |
| 2022/0200600 | A1 * | 6/2022 | Manipatruni .......... H03K 19/23 |

OTHER PUBLICATIONS

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Non-Final Office Action dated Jan. 24, 2022 for U.S. Appl. No. 17/327,648.

Non-Final Office Action dated Jan. 24, 2022 for U.S. Appl. No. 17/327,659.

Non-Final Office Action dated Sep. 16, 2021 for U.S. Appl. No. 17/129,824.

Notice of Allowance dated Mar. 2, 2022 for U.S. Appl. No. 17/129,821.

Notice of Allowance dated Mar. 7, 2022 for U.S. Appl. No. 17/327,659.

Notice of Allowance dated Mar. 11, 2022 for U.S. Appl. No. 17/327,648.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Notice of Allowance dated Dec. 13, 2022 for U.S. Appl. No. 17/449,798.

\* cited by examiner

NON-LINEAR POLAR MATERIAL BASED LOW POWER MULTIPLIER WITH NOR AND NAND GATE BASED RESET MECHANISM

CLAIM OF PRIORITY

This application is a continuation of U.S. patent application Ser. No. 17/449,748 titled "NON-LINEAR POLAR MATERIAL BASED Low POWER MULTIPLIER WITH TRANSMISSION-GATE BASED RESET MECHANISM," filed Oct. 1, 2021, which is incorporated by reference in its entirety.

BACKGROUND

Typical multiplier cell includes a 1-bit full adder and an AND gate. The 1-bit full adder receives three or more inputs and may consist of several logic gates such as AND gate, OR, gate, XOR gates, inverters, and buffers. In complementary metal oxide semiconductor (CMOS) logic, a 2-input AND gate derived from a 2-input NAND gate and an inverter consists of six transistors. A 2-input OR gate derived from a 2-input NOR gate and an inverter consists of six transistors. A 2-input XOR gate may consist of at least six transistors. As the number of transistors increases, power consumption and area also increase. As devices are pushing down the power envelope to save battery power, existing circuit architecture for a multiplier cell presents challenges to the goal of lower power consumption.

The background description provided here is for the purpose of generally presenting the context of the disclosure. Unless otherwise indicated here, the material described in this section is not prior art to the claims in this application and are not admitted being prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
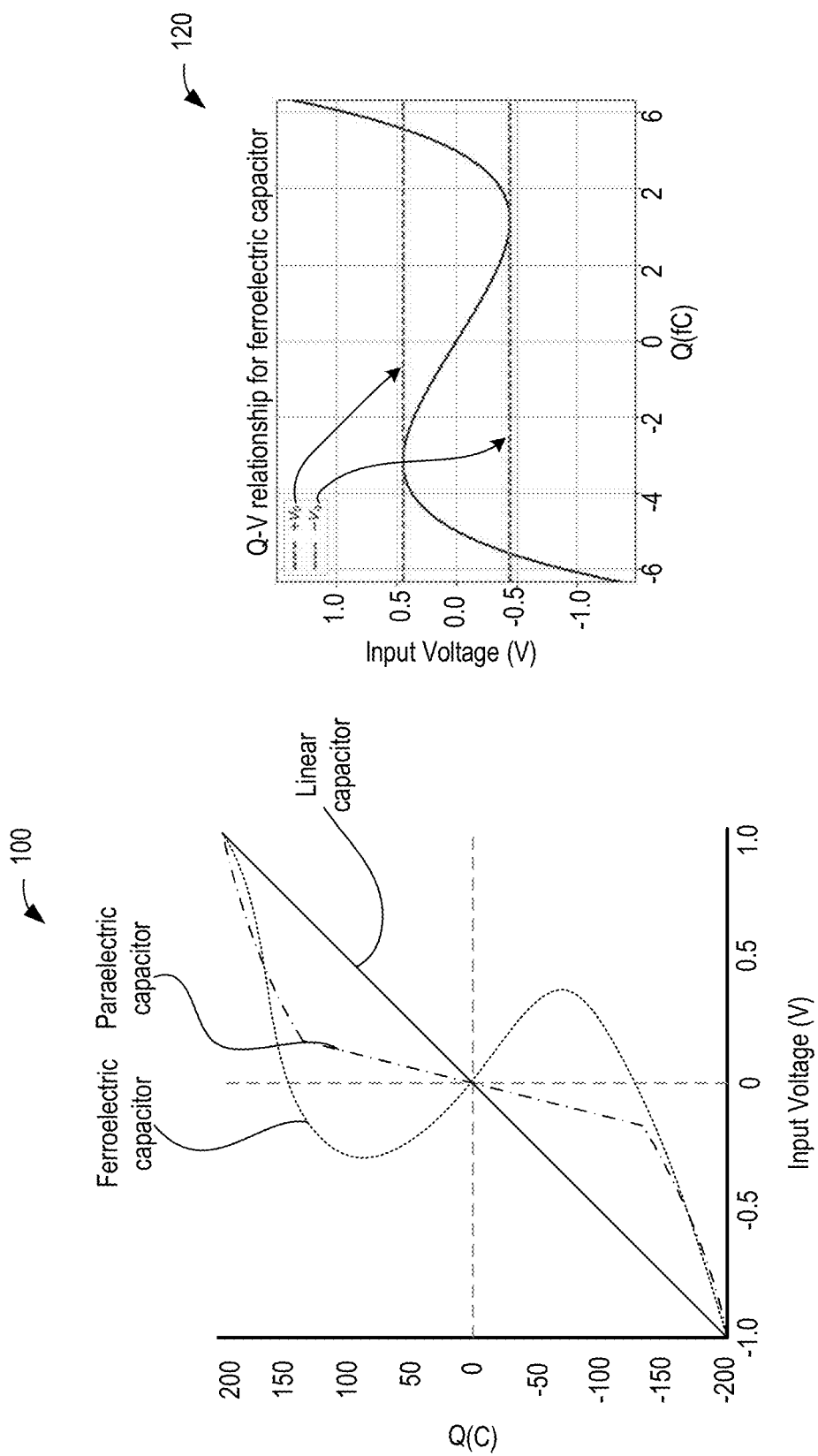
FIG. 1 illustrates a set of plots showing behavior of a ferroelectric capacitor, a paraelectric capacitor, and a linear capacitor.

In some embodiments, a multiplier cell is derived from a 1-bit full adder and an AND gate. In various embodiments, the 1-bit full adder is derived from majority and/or minority gates. In some embodiments, the majority and/or minority gates include non-linear polar material (e.g., ferroelectric or paraelectric material). In some embodiments, the multiplier cell is a hybrid of majority and/or minority gates and complementary metal oxide semiconductor (CMOS) based inverters and/or buffers.

A full adder adds binary numbers. A 1-bit full adder adds three one-bit numbers, A, B, and $C_{in}$, where A and B are the operands, and $C_{in}$ is a carry-in bit which is carried in from a previous, less-significant stage. A full adder is usually derived as a cascade of adders. These adders add, for example, 8, 16, 32, etc. bit binary numbers. The output of a 1-bit full adder circuit produces a 2-bit output. One of the output bits is a carry output and the other output bit is a sum. The carry is typically represented by signal Cout while the sum is typically represented by signal S, where the sum equals $2C_{out}+S$. Implementing a 1-bit adder requires many logic gates such as AND logic gate, OR logic gate, inverters, and sometime state elements such as flip-flops.

Some embodiments describe a new class of logic gates that use non-linear polar material. These new class of logic gates becomes the basis of a 1-bit full adder, and hence the basis of a multiplier cell. The logic gates include multi-input minority gates, majority gates, and threshold gates. Input signals are received by respective terminals of capacitors having the non-linear polar material. The other terminals of these capacitors are coupled to a node where the majority function takes place for the inputs. The output from the majority function can then be directly used in a subsequent logic (e.g., another majority, minority, or threshold gate) or a driver circuitry. The driver circuitry can be any suitable logic gate such as a buffer, inverter, multiplexer, NAND gate, NOR gate, etc. As such, the majority gate, the minority gate, or the threshold gate of various embodiments can be combined with existing transistor technologies such as complementary metal oxide semiconductor (CMOS), tunneling field effect transistor (TFET), GaAs based transistors, bipolar junction transistors (BJTs), Bi-CMOS transistors, etc.

In various embodiments, the multiplier cell comprises majority and/or minority gates. Each of these gates includes a floating node (also referred to as the summing node). The floating node connects to the capacitors of the majority and/or minority gates, wherein the capacitors comprise non-linear polar material. A particular charge balance may be needed to be maintained at the floating node to get the majority (or minority) function. However, over time, the charge on the floating node leaks away due to the leakage of the various components present in a system comprising the multiplier cell. Source of this leakage can be leakage from a gate of a transistor coupled to the floating node. The source of the leakage can also be from the capacitors themselves and any other components coupled to the floating node. In some embodiments, a reset mechanism is provided which reestablishes the charge balance on the floating node for correct functionality. In some embodiments, the reset mechanism is enabled after a predetermined or programmable period. For example, the reset mechanism is enabled every 1 to 2 microseconds.

In some embodiments, the multiplier cell includes a 1-bit full adder coupled to an AND gate. In some embodiments, the AND gate comprises a majority gate or a minority gate having non-linear polar material. In some embodiments, the 1-bit full adder comprises a majority gate or a minority gate coupled to the AND gate, wherein the 1-bit full adder comprises non-linear polar material. In some embodiments, the AND gate receives a multiplier and a multiplicand. The AND gate may include a first 3-input majority gate with 3 non-linear input capacitors. The 1-bit adder comprises a second 3-input majority gate and a 5-input majority gate. Note, some or all the majority gates can be replaced with minority gates, in accordance with some embodiments. The 5-input majority gate includes five non-linear capacitors. In some embodiments, the multiplier cell comprises a reset mechanism to reset nodes coupled to the non-linear polar material during a reset phase separate from an evaluation phase. The specific implementation choice of the reset mechanism can depend on the type of the non-linear polar material, in accordance with some embodiments.

In some embodiments, when the non-linear polar material is a ferroelectric material, the inputs are set such that one of the multiplier and multiplicand inputs is set to logic 0 while the other is set to logic 1. The carry input and sum input are also set to 0. The reset mechanism then sets voltages on the floating nodes of the multiplier cell during a reset phase. Once the reset phase expires, the normal phase (or evaluation phase) begins. During the evaluation phase, the reset mechanism is disabled. The reset mechanism includes pull-up and pull-down devices coupled to the floating nodes. In some embodiments, when the non-linear polar material is a ferroelectric material, the three capacitors of the 3-input majority gates are input 0, 0, and 1, respectively. In that case, the reset mechanism first pulls up the floating nodes and then pulls down the floating nodes, in accordance with some embodiments. In some embodiments, when the non-linear polar material is a ferroelectric material, the five capacitors of the 5-input majority gates are input 0, 0, 0, 1, and 1 respectively. These inputs can be forced by the reset mechanism or provided from external source (e.g., by setting the voltages of sum input and carry input) and/or using transistors to force a value. Under these conditions for the input voltages of the non-linear capacitors, the reset mechanism first pulls up the floating nodes and then pulls down the floating nodes, in accordance with some embodiments.

In some embodiments, the sequence of pulling up and pulling down the floating nodes can be flipped after changing the input voltages to the capacitors of the majority or minority gates of the multiplier cell. For example, in some embodiments, when the non-linear polar material is a ferroelectric material, the three capacitors of the 3-input majority gates are input 0, 1, and 1, respectively. In that case, the reset mechanism first pulls down the floating nodes and then pulls up the floating nodes, in accordance with some embodiments. In some embodiments, when the non-linear polar material is a ferroelectric material, the five capacitors of the 5-input majority gates are input 1, 1, 1, 0, and 0 respectively. These inputs can be forced by the reset mechanism or provided from external source (e.g., by setting the voltages of sum input and carry input) and/or using transistor(s) to force a value. Under these conditions for the input voltages of the non-linear capacitors, the reset mechanism first pulls down the floating nodes and then pulls up the floating nodes, in accordance with some embodiments. The reset mechanism may comprise transmission gates, pull-up devices, pull-down devices, NAND gates, and/or NOR gates or a combination of them as shown with reference to various exemplary embodiments. In various embodiments, the reset sequence for different gates (e.g., majority gate, minority gate, or any other capacitive input gate) may depend upon their own inputs and this reset sequence can be different for different gates with different reset control signals.

In some embodiments, when the non-linear polar material is a paraelectric material, all inputs to the multiplier cell are set to 0. The reset mechanism is simpler for a multiplier cell when the multiplier cell comprises capacitors with paraelectric material. In some embodiments, when the non-linear polar material is a paraelectric material, the reset mechanism comprises pull-down devices to pull-down the floating nodes during the reset phase. In some embodiments, when the inputs to the multiplier cell are set to 1 during the reset, the reset mechanisms pull-up the floating nodes during the reset phase. Once the reset phase is over (e.g., when the normal phase or evaluation phase begins), the reset mechanism is disabled. In various embodiments, the pull-up or pull-down events on the floating nodes depends on the conditioning of inputs of the paraelectric or ferroelectric based capacitors of the majority or minority gates.

There are many technical effects of the various embodiments. For example, extremely compact multiplier circuitry is formed using the design of various embodiments. The non-linear polar material used in the multiplier can be ferroelectric material, para-electric material, or non-linear dielectric. The majority gate, minority gate and/or threshold gate of various embodiments lowers the power consumption of the multiplier circuit because the majority gate, minority gate and/or threshold gate do not use switching transistors and the interconnect routings are much fewer than the interconnect routings used in transitional CMOS logic gates. For example, 10x less interconnect length is used by the majority gate and threshold gate of various embodiments than traditional CMOS circuits for the same function and performance. The capacitor with non-linear polar material provides non-volatility that allows for intermittent operation and zero power drain when not in use.

For example, a processor having such multiplier circuits can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material can be used with any type of transistor. For example, the capacitor with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates.

The reset mechanism of various embodiments controls the voltage at the inputs of the non-linear capacitors and/or the floating node (also referred to as the summation node) simultaneously. In some embodiments, the voltage across the non-linear capacitors is controlled on both terminals of the non-linear capacitors. In some embodiments, one terminal of the non-linear capacitors is applied to preset input signal with a desired or known voltage during reset. In some embodiments, the other terminal of the non-linear capacitors, which is connected to the floating node, is pull-up and/or pull-down in a sequence depending on the input voltage conditioning and/or type of non-linear polar material (e.g., ferroelectric vs. paraelectric). As such, deterministic voltages are established on both ends or terminals of the non-linear capacitors. By controlling the voltages at both ends or terminals of the capacitors and setting it accordingly to establish a majority function at the floating node, correct polarization state is established for the non-linear capacitors. As such, a charge balance is created on the floating node such that logic gates of the multiplier cell work as majority gates until a sufficient charge leaks out through various components needing a reset phase again. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots 100 and 120 showing behavior of a ferroelectric capacitor, a paraelectric capacitor, and a linear capacitor. Plot 100 compares the transfer function for a linear capacitor, a paraelectric (PE) capacitor (a non-linear capacitor) and a ferroelectric (FE) capacitor (a non-linear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 20 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 2:
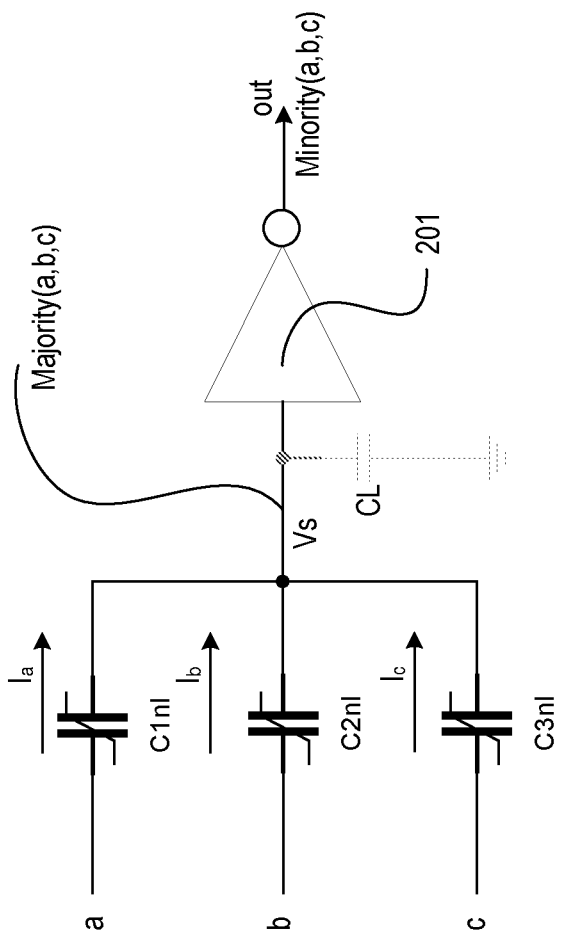
FIG. 2 illustrates a 3-input majority or minority gate with non-linear input capacitors, in accordance with some embodiments.

FIG. 2 illustrates a 3-input majority gate 200 (or minority gate) with non-linear input capacitors, in accordance with some embodiments. In some embodiments, 3-input majority gate 200 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 200 comprises a driver circuitry 201. In this example, driver circuitry 201 is an inverter. In other embodiments, other types of driver circuitries can be used such as NAND gate, NOR gate, multiplexer, buffer, and other logic gates. The majority function is performed at summing node Vs as Majority (a, b, c). In this example, since driver circuitry 201 is an inverter, minority function is performed at output "out" as Minority (a, b, c).

In some embodiments, in addition to the gate capacitance of driver circuitry 201, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfO, $ABO_3$ perovskites, nitrides, oxy-fluorides, oxides, etc. A paraelectric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, and/or PMN-PT based relaxor ferroelectrics. A dielectric capacitor comprises first and second metal plates with non-linear dielectric capacitor between them. The range for dielectric constant is 1.2 to 10000.

In some embodiments, the non-linear polar material of the capacitors includes one of: ferroelectric (FE) material, paraelectric material, relaxor ferroelectric, or non-linear dielectric. In various embodiments, paraelectric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O, and/or La-substituted PbTiO3, PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, a perovskite includes one of: BaTiO3, PbTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A; it can be an element from the Lanthanides series. B' is a dopant for atomic site B; it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO), and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, the FE material includes one of: $Al(1-x)Sc(x)N$, $Ga(1-x)Sc(x)N$, $Al(1-x)Y(x)N$, or $Al(1-x-y)Mg(x)Nb(y)N$, y doped HfO2, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO), lead zirconate titanate (PZT), BFO with doping material, or PZT with doping material, wherein the doping material is one of Nb or; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, the FE material includes lead zirconium titanate (PZT), or PZT with a doping material, wherein the doping material is one of La, Nb. In some embodiments, the FE material includes a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), and/or Barium Titanium-Barium Strontium Titanium (BT-BST).

In some embodiments, the FE material includes Hafnium oxides of the form, $Hf1-x Ex Oy$ where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor. In various embodiments, there is enough capacitance on node Vs that the capacitor CL is not needed.

In some embodiments, the non-linear input capacitors C1$n$1, C2$n$1, and C3$n$1 comprise non-linear polar material. In some embodiments, the non-linear polar material includes one of: ferroelectric (FE) material, paraelectric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

The majority function is performed at the summing node Vs, and the resulting voltage is projected on to capacitance of driver circuitry 201. Table 3 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 200. Any suitable driver can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 2 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 200 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configure the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 201 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$$f(x_1, x_2, \ldots x_n) = V_{c1,c2,\ldots,cn} f(x_1, x_2, \ldots x_n) \Delta x_1^{c1} \Delta x_2^{c2} \Delta x_3^{c3} \Delta x_n^{cn}$$

where $C_1$ is either 0 or 1. When $C_1$ is 1, $x_i^{ci}=x_i$ (the input is used in its original form). When $C_1$ is 0, $x_i^{ci}=\overline{x_i}$ (the input is used in its inverted form). The first level of logic is represented by at most $2^n$ AND gates (Δ), one for each of the $2^n$ possible combinations of 0 and 1 for $C_1, C_2 \ldots C_n$. The second level of logic is represented by a single OR gate (V). Each operand of the OR gate is a representation of a row in the truth table for $$f(x_1, x_2, \ldots x_n).$$

A (2N−1)-input majority gate can represent an N-input AND gate, by tying (N-1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 3A:
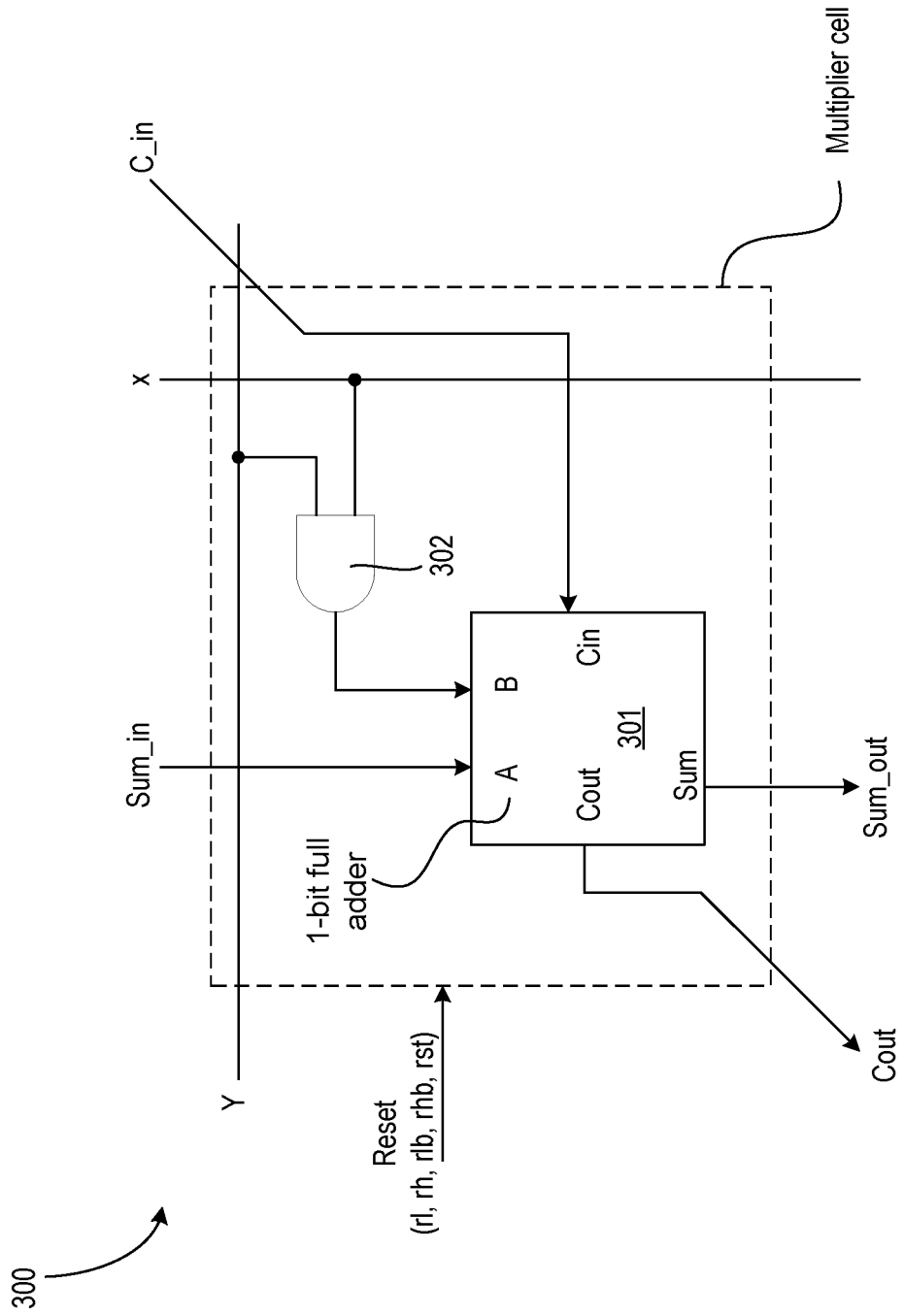
FIG. 3A illustrates a multiplier cell comprising a 1-bit full adder and an AND gate, wherein the multiplier cell comprises a reset mechanism, wherein at least one of the 1-bit full adder and/or the AND gate comprise ferroelectric or paraelectric material, in accordance with some embodiments.

FIG. 3A illustrates multiplier cell 300 comprising a 1-bit full adder and an AND gate, wherein the multiplier cell comprises a reset mechanism, wherein at least one of the 1-bit full adder and/or the AND gate comprise ferroelectric or paraelectric material, in accordance with some embodiments. Multiplier cell 300 comprises 1-bit full adder 301 and AND gate 302. 1-bit full adder 301 receives inputs A and B along with carry-in (Cin). Input A is a Sum_in input and C_in is a carry-in input from another multiplier cell. In an array of multipliers, for a first multiplier cell, Sum_in and C_in have fixed values (e.g., logical 0). The two inputs X and Y are multiplied in view of Sum_in (sum input) and C_in (carry_in) inputs. AND gate 302 receives the two inputs X and Y and provides an output which is received as input B by 1-bit full adder 301.

In some embodiments, AND gate 302 is a CMOS (or any other transistor technology) based AND gate (e.g., a NAND gate followed by an inverter). In some embodiments, AND gate 302 is a threshold gate. In some embodiments, AND gate 302 is a majority only gate. In some embodiments, AND gate is a hybrid gate which is a mix of majority gate and CMOS based devices. In some embodiments, the AND gate comprises two capacitors with non-linear polar material. These two capacitors are coupled to the inputs of the AND gate. For example, a first capacitor is coupled to a first input, while a second capacitor is coupled to a second input. The other terminals of the first capacitor and the second capacitor are coupled to a common node, which is a summation node or floating node. In the case where AND gate 302 has two capacitors, there may be no need to have a third capacitor in the AND gate with its input coupled to ground. AND gate 302 produces a partial multiplication result of multiplying X and Y, while adder 301 adds that partial multiplication result with a multiplication result Sum_in from a previous multiplier cell (not shown) to generate a full multiplication result as Sum_out. The Carry-out (Cout) of adder 301 becomes the Cin for the subsequent multiplier cell (not shown). Sum_out can be used as a result and/or as Sum_in for a subsequent multiplier cell. As such, an N×N multiplier is made using the basic multiplier cell 300 repeated N×N times and connected as discussed herein. In various embodiments, adder 301 and/or AND gate 302 include non-linear polar material.

In various embodiments, multiplier cell 300 receives a Reset to preset (e.g., pre-discharge and/or pre-charge) the floating nodes in the majority or minority gates of the multiplier cell. The reset is part of a reset mechanism which is specific to the kind of non-linear capacitor material. The reset mechanism of various embodiments controls the voltage at the inputs (e.g., Sum_in, C_in_X, and/or Y) of the non-linear capacitors and the floating node (also referred to as the summation node) simultaneously. If AND gate 302 is a CMOS AND gate, then input Y may not be preconditioned during the reset phase. If AND gate 302 is a majority gate, then input Y is preset as described with reference to various embodiments. In some embodiments, the voltage across the non-linear capacitors is controlled on both terminals of the non-linear capacitors. In some embodiments, one terminal of the non-linear capacitors is applied to preset input signal with a desired or known voltage during reset. In some embodiments, the other terminal of the non-linear capacitors, which is connected to the floating node, is pull-up and/or pull-down in a sequence depending on the input voltage conditioning and/or type of non-linear polar material (e.g., ferroelectric vs. paraelectric). As such, deterministic voltages are established on both ends or terminals of the non-linear capacitors. By controlling the voltages at both ends or terminals of the capacitors and setting it accordingly to establish a majority function at the floating node, correct polarization state is established for the non-linear capacitors. As such, a charge balance is created on the floating node such that logic gates of the multiplier cell work as majority gates until a sufficient charge leaks out through various components needing a reset phase again. Here, a sufficient amount of charge is an amount of charge that when leaks out, the logic gate loses correct functionality and starts to produce incorrect results. In one example, the loss of this sufficient charge can take a up to a couple of microseconds to happen depending upon the leakage of the capacitors involved and the transistor components.

Figure 3B:
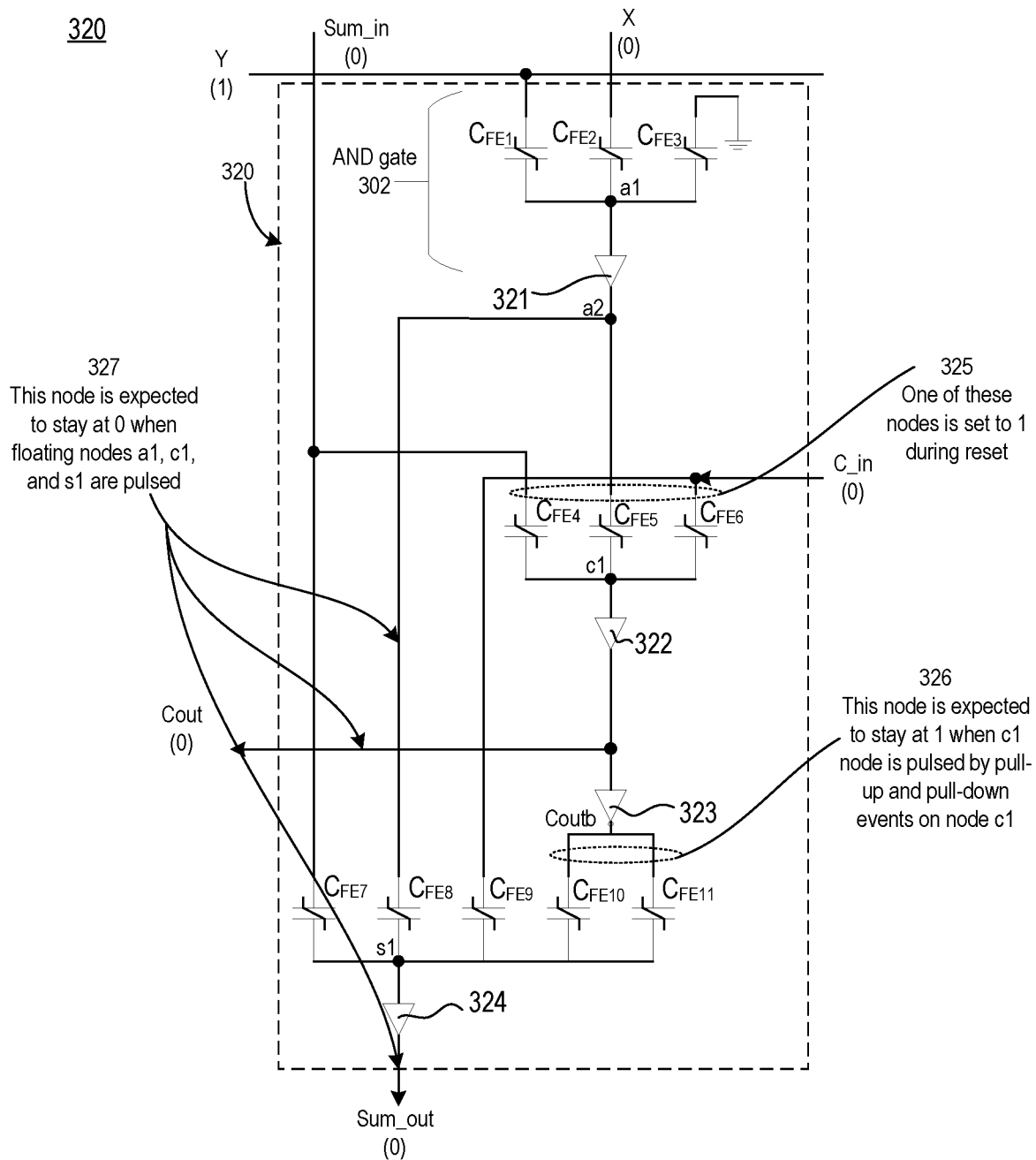
FIG. 3B illustrates a multiplier cell having a 1-bit full adder and an AND gate using majority or minority gates with non-linear input capacitors (e.g., ferroelectric capacitor), in accordance with some embodiments.

FIG. 3B illustrates multiplier cell 320 having a 1-bit full adder and an AND gate using majority or minority gates with non-linear input capacitors (e.g., ferroelectric capacitor), in accordance with some embodiments. In some embodiments, multiplier cell 320 comprises an AND gate 302 comprising a 3-input majority gate having input capacitors $C_{FE1}$, $C_{FE2}$, and $C_{FE3}$ with non-linear polar material. A first terminal of capacitor $C_{FE1}$ is coupled to input Y. A first terminal of capacitor $C_{FE2}$ is coupled to input X. A first terminal of capacitor $C_{FE3}$ is coupled to ground. In various embodiments, the second terminal of capacitors $C_{FE1}$, $C_{FE2}$, and $C_{FE3}$ is coupled to a common node a1 (which is also referred to as a majority node). At node a1, a majority function of inputs Y, X, and ground take place. This majority function is an AND function. As such, node a1 provides the output of the AND gate. In some embodiments, buffer 321 is coupled to node a1 to buffer the output to node a2. Node a2 is coupled to the 1-bit full adder, in accordance with various embodiments.

In some embodiments, the 1-bit full adder comprises 3-input minority gate followed by a 5-input majority gate. In some embodiments, the 3-input minority gate comprises input capacitors $C_{FE4}$, $C_{FE5}$, and $C_{FE6}$ with non-linear polar material. A first terminal of capacitor $C_{FE4}$ is coupled to input Sum_in. A first terminal of capacitor $C_{FE5}$ is coupled to node a2. A first terminal of capacitor $C_{FE6}$ is coupled to C_in. In various embodiments, the second terminal of capacitors $C_{FE4}$, $C_{FE5}$, and $C_{FE6}$ is coupled to a common node c1 (which is also referred to as a majority node). At node c1, a majority function of inputs Sum_in, voltage on node a2, and input C_in take place. In some embodiments, buffer 322 is coupled to node c1 to drive output $C_{out}$. In some embodiments, the output of buffer 322 is coupled to inverter 323. The output of inverter 323 provides a minority function of inputs Sum_in, voltage on node a2, and input C_in. The output of inverter 323, Sum_in, node a2, and C_in are received by the 5-input majority gate.

In some embodiments, the 5-input minority gate comprises input capacitors $C_{FE7}$, $C_{FE8}$, $C_{FE9}$, $C_{FE10}$, and $C_{FE11}$ with non-linear polar material. A first terminal of capacitor $C_{FE7}$ is coupled to input Sum_in. A first terminal of capacitor $C_{FE8}$ is coupled to node a2. A first terminal of capacitor $C_{FE9}$ is coupled to C_in. A first terminal of capacitor $C_{FE10}$ and a first terminal of $C_{FE11}$ is coupled to the output of inverter 323. In various embodiments, the second terminal of capacitors $C_{FE7}$, $C_{FE8}$, $C_{FE9}$, $C_{FE10}$, and $C_{FE11}$ with is coupled to a common node s1 (which is also referred to as a majority node). At node s1, a majority function of inputs Sum_in, voltage on node a2, input C_in, and two times the output of inverter 323 take place. In some embodiments, buffer 324 is coupled to node s1 to drive output Sum_out. Compared to traditional multiplier cells, fewer transistors are used here. Further, the capacitors can be formed above an active region, thus reducing an overall footprint of multiplier cell 320 compared to traditional CMOS only multiplier cells. The power consumption of multiplier cell 320 is also smaller than power consumption of traditional CMOS only multiplier cells.

A particular charge balance may be needed to be maintained at the floating nodes a1, c1, and s1 to get the expected majority (or minority) function. However, over time, the charge on the floating nodes a1, c1, and s1 leaks away due to the leakage of the various components present in a system comprising the multiplier cell. Source of this leakage can be leakage from gates of a transistors of buffers 321, 322, and 324 and/r inverter 323 coupled to the floating nodes. The source of the leakage can also be from the capacitors themselves. In some embodiments, a reset mechanism is provided which reestablishes the charge balance on the floating nodes a1, c1, and s1 for correct functionality of the majority (or minority) functions. In some embodiments, when the capacitors of multiplier cell 320 are made from ferroelectric material, then input X is set to 0, input Y is set to 1, input Sum_in is set to 0, and input C_in is set to 0. The voltages on inputs X and Y can be flipped so long as one of the inputs is a zero and the other input is a logic 1. In various embodiments, the reset mechanism ensures that nodes indicated by identifier 325 are set to logic 1 during a reset phase. In various embodiments, during reset, nodes indicated by identifier 326 is expected to stay at logic 1 when c1 node is pulsed by pull-up and pull-down events on node c1. In various embodiments, the reset mechanism ensures that nodes indicated by identifier 327 are to be at logic 0 when floating nodes a1, c1, and s1 are pulsed. For example, when floating nodes a1, c1, and s1 are pulsed by pull-up and pull-down events on those nodes, then during reset phase nodes a2, Cout, and Sum_out are expected to by at logic 0.

In some embodiments, the reset of the ferroelectric based capacitors of multiplier cell 320 can be performed in multiple cycles while keeping the inputs X, Y, Sum_in, and C_in at 0, 1, 0, and 0 logic levels, respectively. In some embodiments, the reset of the ferroelectric based capacitors of multiplier cell 320 can be performed in multiple cycles while one or more inputs X, Y, Sum_in, and C_in. In some embodiments, reset of the ferroelectric based capacitors of multiplier cell 320 can be performed with inputs (X, Y, Sum_in, and C_in) inconsistent with to the multiplier state and waiting for one or more cycles after removing the rest signal to let the inputs settle down.

Figure 4:
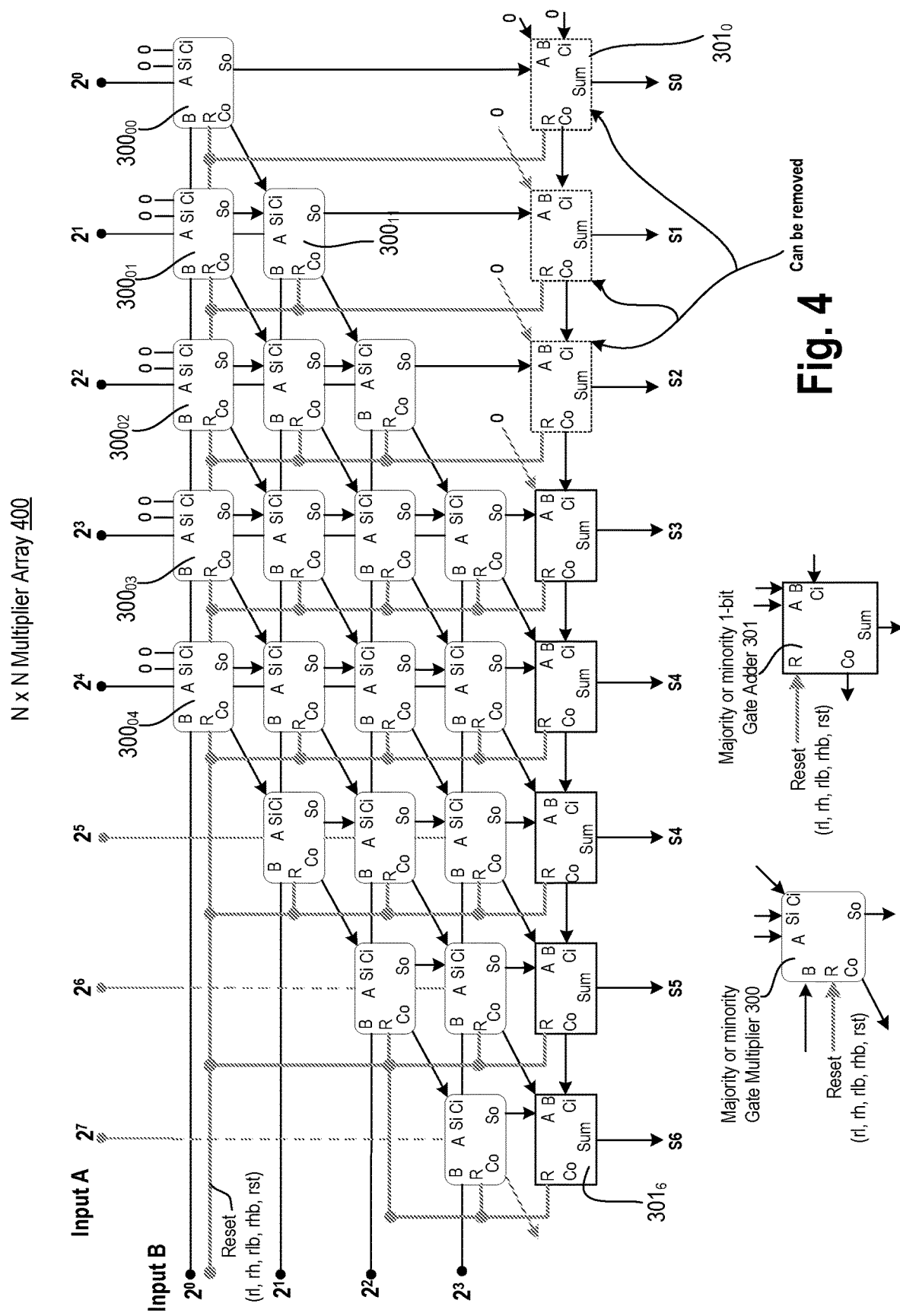
FIG. 4 illustrates an N×N multiplier array, wherein each cell of the array includes a 1-bit full adder and an AND gate, wherein at least one of the 1-bit full adder and/or the AND gate comprise ferroelectric or paraelectric material, in accordance with some embodiments.

FIG. 4 illustrates an N×N multiplier array 400, wherein each cell of the array includes a 1-bit full adder and an AND gate, wherein at least one of the 1-bit full adder and/or the AND gate comprise ferroelectric or paraelectric material, in accordance with some embodiments. To form N×N multiplier 400, multiplier cells are organized in an array (e.g., rows and columns), where N is a number. Inputs A are shown as columns while input B are shown as rows. In some embodiments, the first row of majority gate multipliers with integrated AND functions (e.g., $300_{00}$ to $300_{04}$) have sum input (Si) and carry-in input (Ci) that are set to predetermined or programmable values (e.g., 0). In some embodiments, full 1-bit adders that do not receive input B from another multiplier cell, have that input set to a predetermined or programmable value (e.g., 0). Such full 1-bit adders can be replaced with half adders. In some embodiments, adders in the next row (e.g., $300_{11}$) are 1-bit full adders. The values can be programmed by software (e.g., firmware, operating system) or hardware (e.g., fuses, registers).

1-bit full adder is provided for each column that sums a locally computed partial product (X Y), an input passed into the majority or minority gate multiplier cell from above (Sum In), and a carry Ci passed from a majority or minority gate multiplier cell diagonally above. It generates a carry-out (Cout or Co) and a new sum (Sum Out or So). N x N multiplier 400 shows the interconnection of 16 of these majority or minority gate multiplier cells to implement the full multiplier function. However, any number of majority or minority gate multiplier cells can be used. The input Ai values are distributed along cell diagonals and the input Bi values are passed along rows. This implementation uses the same gate count as the previous one: 16 AND gates and 12 adders. In various embodiments, the top row may not use adders. The outputs S0 though S6 of 1-bit adders $301_0$ through $301_6$ are the results of the bit-wise multiplication. In some embodiments, adders $301_0$ through $301_2$ (shown as dotted boxes) can be removed since they are simply adding zero to the input A. In one such example, the output of $300_0$ is S0 and the output of $300_{11}$ is S1. Various figures here describe the different implementations of multiplier cell 300 and 1-bit full adder 301 with their reset mechanism.

In various embodiments, each multiplier cell 300 and adder 301 receive reset signals (e.g., rl, rh, rlb, rhb, rst) to reset the floating nodes of the multiplier cell 300 and adder 301. Depending on the type of non-linear polar material (e.g., ferroelectric or paraelectric) for the capacitors of multiplier cell 300 and adder 301, different types of reset mechanisms can be used.

Figure 5A:
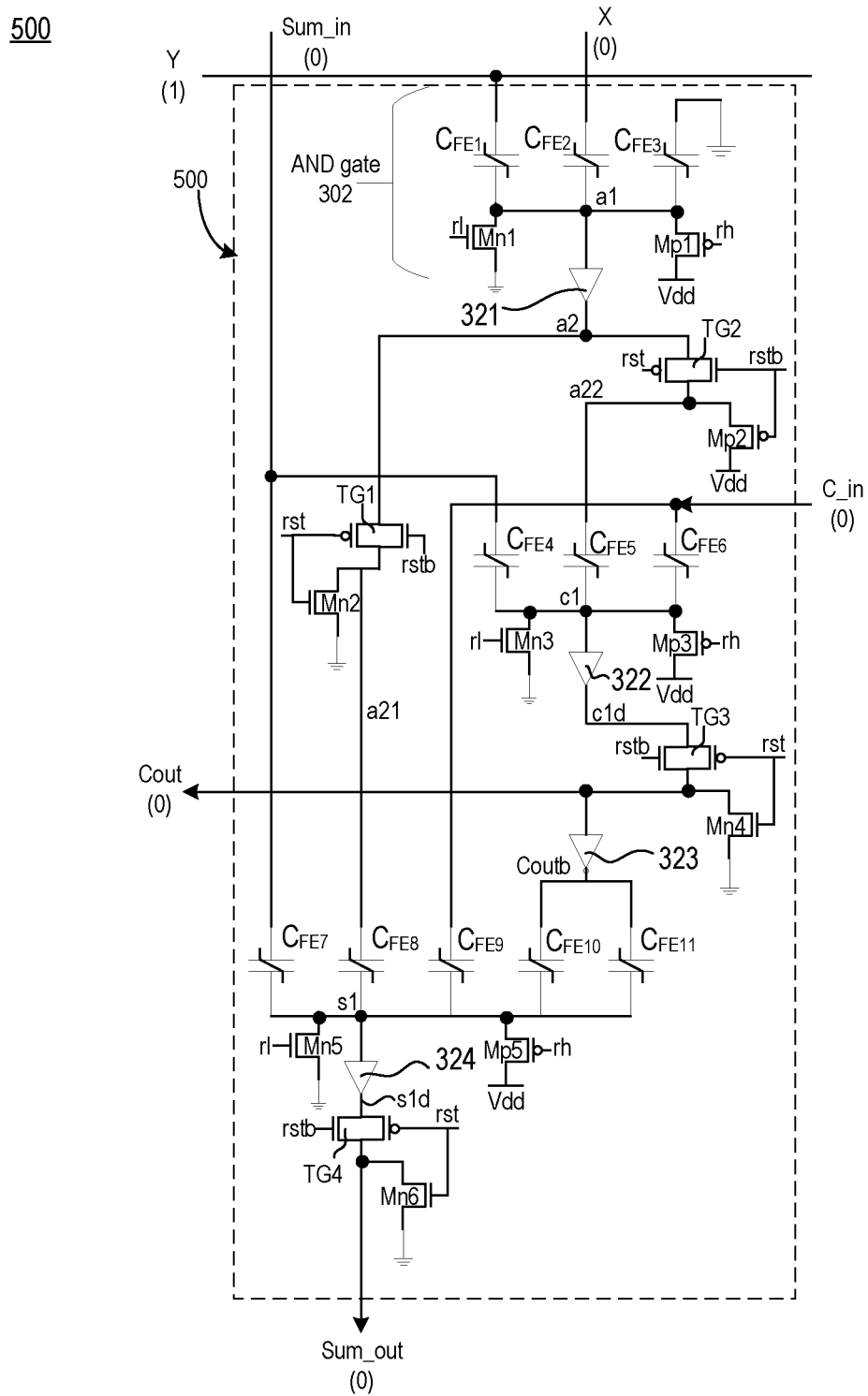
FIG. 5A illustrates a multiplier cell having a 1-bit full adder and an AND gate using majority or minority gates with ferroelectric capacitors, wherein the multiplier cell includes a reset mechanism, in accordance with some embodiments.

FIG. 5A illustrates multiplier cell 500 having a 1-bit full adder and an AND gate using majority or minority gates with ferroelectric capacitors, wherein the multiplier cell includes a reset mechanism, in accordance with some embodiments. Multiplier cell 500 is like multiplier 320 but for the circuitry (reset mechanism) to reset or preset the floating nodes a1, c1, and s1, and inputs of the capacitors (e.g., terminals which are not connected to the floating nodes). In some embodiments, floating node a1 is coupled to pull-up device Mp1 (p-type transistor) and pull-down device Mn1 (n-type transistor). In various embodiments, pull-up device Mp1 is coupled to supply node Vdd and controlled by rh. In some embodiments, pull-down device Mn1 is coupled to ground and controllable by rl. In some embodiments, floating node c1 is coupled to pull-up device Mp3 (p-type transistor) and pull-down device Mn3 (n-type transistor). In various embodiments, pull-up device Mp3 is coupled to supply node Vdd and controlled by rh. In some embodiments, pull-down device Mn3 is coupled to ground and controllable by rl. In some embodiments, floating node s1 is coupled to pull-up device Mp5 (p-type transistor) and pull-down device Mn5 (n-type transistor). In various embodiments, pull-up device Mp5 is coupled to supply node Vdd and controlled by rh. In some embodiments, pull-down device Mn5 is coupled to ground and controllable by rl.

In some embodiments, node a2 is coupled to first transmission gate TG1, which is controllable by reset signals rst and rstb, where rstb is inverse of rst. In some embodiments, first transmission gate TG1 connects nodes a2 to node a21, where node a21 is coupled to capacitor $C_{FE8}$ of the 5-input majority gate of the 1-bit full adder. In some embodiments, n-type transistor Mn2 is coupled to node a21 to pull the node to ground according to a logic level of rst signal.

In some embodiments, node a2 is coupled to second transmission gate TG2, which is controllable by reset signals rst and rstb, where rstb is inverse of rst. In some embodiments, second transmission gate TG2 connects nodes a2 to node a22, where node a22 is coupled to capacitor $C_{FE5}$ of the 3-input majority gate of the 1-bit full adder. In some embodiments, p-type transistor Mp2 is coupled to node a22 to pull the node up to Vdd according to a logic level of rstb signal.

In some embodiments, node c1d is coupled to third transmission gate TG3, which is controllable by reset signals rst and rstb, where rstb is inverse of rst. In some embodiments, third transmission gate TG3 connects nodes c1d to node $C_{out}$, where node $C_{out}$ is coupled to capacitors $C_{FE10}$ and $C_{FE11}$ via inverter 323 of the 1-bit full adder. In some embodiments, n-type transistor Mn4 is coupled to node $C_{out}$ to pull the node down to ground according to a logic level of rst signal.

In some embodiments, node s1d is coupled to fourth transmission gate TG4, which is controllable by reset signals rst and rstb, where rstb is inverse of rst. In some embodiments, fourth transmission gate TG4 connects nodes s1d to node Sum_out of the 1-bit full adder. In some embodiments, n-type transistor Mn6 is coupled to node Sum_out to pull the node down to ground according to a logic level of rst signal. The reset phase may occur every 1-2 microseconds after an evaluation phase. By controlling the voltages at both ends or terminals of the non-linear capacitors to establish a majority function at the floating node, correct polarization state is established for the non-linear capacitors. As such, a charge balance is created on the floating nodes a1, c1, and s1 such that logic gates of multiplier cell 300 work as majority gates until a sufficient charge leaks out through various components needing a reset phase again.

In some embodiments, the first and second 3-input majority gates get an input sequence of 0,0,1, and reset for the floating gates of those majority gates involves first pulling up the floating nodes followed by pulling-down the floating nodes. When rst=1, reset phase begins. When rst=0, reset phase ends and evaluation phase begins.

In some embodiments, the reset mechanism resets or pulses the floating nodes by a pull-down event followed by a pull-up event. In some embodiments, when the non-linear polar material for the capacitors is a ferroelectric material, the three capacitors ($C_{FE1}$, $C_{FE2}$, and $C_{FE3}$, and $C_{FE4}$, $C_{FE5}$, $C_{FE6}$) of the 3-input majority gates are input 0, 1, and 1, respectively. In some embodiments, when the non-linear polar material is a ferroelectric material, the five capacitors of the 5-input majority gates are input 1, 1, 1, 0, and 0 respectively. These inputs can be forced by the reset mechanism or provided from external source (e.g., by setting the voltages of sum input and carry input) and/or using transistor(s) to force a value. For example, during reset, pass-gates TG1, TG2, TG3, and TG4 are opened and input terminals to the capacitor are forced with a known value. In this example, node a21 is forced to ground by transistor Mn2, node a22 is pulled up to Vdd by transistor Mp2, $C_{out}$ node is pulled to ground by transistor Mn4 to condition the inputs of capacitors $C_{FE10}$ and $C_{FE11}$, and node Sum_out is forced to ground by transistor Mn6.

In some embodiments, after the input terminals of the capacitors are conditioned to logic states for reset, the floating nodes a1, c1, and s1 are pulled down and then pulled up. For example, floating node a1 is pulled down by transistor Mn1 by asserting reset signal rl, and then the same node a1 is pulled up to Vdd by transistor Mp1 by de-asserting reset signal rh. Likewise, floating node c1 is pulled down by transistor Mn3 by asserting reset signal rl, and then the same node c1 is pulled up to Vdd by transistor Mp3 by de-asserting reset signal rh. In a similar manner, floating node s1 is pulled down by transistor Mn5 by asserting reset signal rl, and then the same node s1 is pulled up to Vdd by transistor Mp5 by de-asserting reset signal rh. In various embodiments, the pull-down event and pull-up event do not happen simultaneously, but sequentially to avoid crossbar current or short between Vdd and ground. Under these conditions for the input voltages of the non-linear capacitors, the reset mechanism first pulls down the floating nodes and then pulls up the floating nodes to establish correct polarization state is for the non-linear capacitors so that the majority functions are performed as expected, in accordance with some embodiments. In some embodiments, the order of the pull-down and pull-up events on the floating nodes depends on the logic states at the input of the capacitors.

In some embodiments, the reset mechanism resets or pulses the floating nodes by a pull-up event followed by a pull-down event. For example, compared to the previous example, the sequence of pulling up and pulling down the floating nodes can be flipped after changing the input voltages to the capacitors of the majority or minority gates of the multiplier cell. For instance, when the non-linear polar material is a ferroelectric material, the inputs are set such that one of the multiplier and multiplicand inputs is set to logic 0 while the other is set to logic 1. The carry input and sum input are also set to 0. The reset mechanism then sets voltages on the floating nodes of the multiplier cell during a reset phase. Once the reset phase expires, the normal phase (or evaluation phase) begins. During the evaluation phase, the reset mechanism is disabled. The reset mechanism includes pull-up and pull-down devices coupled to the floating nodes. In some embodiments, when the non-linear polar material is a ferroelectric material, the three capacitors of the 3-input majority gates are input 0, 0, and 1, respectively. In some embodiments, when the non-linear polar material is a ferroelectric material, the five capacitors of the 5-input majority gates are input 0, 0, 0, 1, and 1 respectively. These inputs can be forced by the reset mechanism or provided from external source (e.g., by setting the voltages of sum input and carry input) and/or using transistors to force a value. Under these conditions for the input voltages of the non-linear capacitors, the reset mechanism first pulls up the floating nodes and then pulls down the floating nodes, in accordance with some embodiments.

Figure 5B:
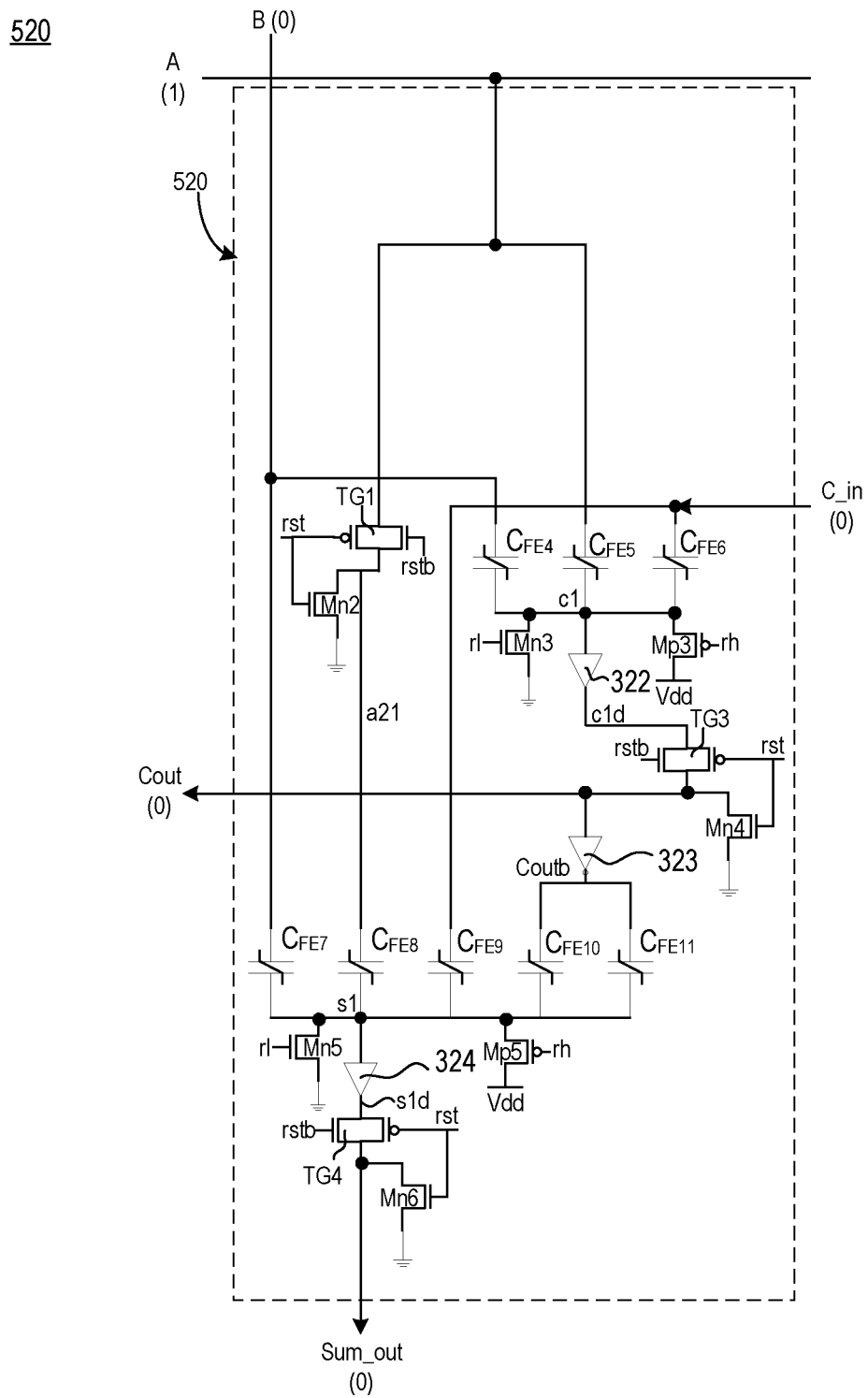
FIG. 5B illustrates a 1-bit full adder with a reset mechanism having NOR gates, wherein the 1-bit-full adder includes majority or minority gates with ferroelectric capacitors, in accordance with some embodiments.

FIG. 5B illustrates 1-bit full adder 520 with a reset mechanism having NOR gates, wherein the 1-bit-full adder includes majority or minority gates with ferroelectric capacitors, in accordance with some embodiments. 1-bit full adder 520 is derived from multiplier cell 500 after AND gate 302, pull-up device MP1, pull-down device MN1, buffer 321, TG2, and pull-up device MP2 are removed. Inputs X, Y, and Sum_in are repurposed. For example, input Sum_in is removed, input Y is relabeled as 'A' and input B is relabeled as 'B'. During reset phase, rst is asserted and rstb is de-asserted, and inputs A, B, and C_in are conditioned as 0, 1, and 0, respectively. Note, A, B, and $C_{in}$ are symmetric and can be swapped with one another. In this example, input terminals of capacitors $C_{FE4}$, $C_{FE5}$, and $C_{FE6}$ are conditioned to 0, 1, and 0, respectively while input terminals of capacitors $C_{FE7}$, $C_{FE8}$, $C_{FE9}$, $C_{FE10}$, and $C_{FE11}$ are conditioned to 0, 0, 0, 1, and 1 respectively. Floating nodes c1 and s1 are then pulled up and then pulled down, in accordance with various embodiments. During the reset phase the outputs $C_{out}$ and Sum_out are forced to logical 0 outputs. After the reset phase is over, evaluation phase begins. In various embodiments, the evaluation phase begins after one or more cycles (or a 1 or more microseconds) to allow charges on both terminals of the ferroelectric capacitors to settle or stabilize.

Figure 5C:
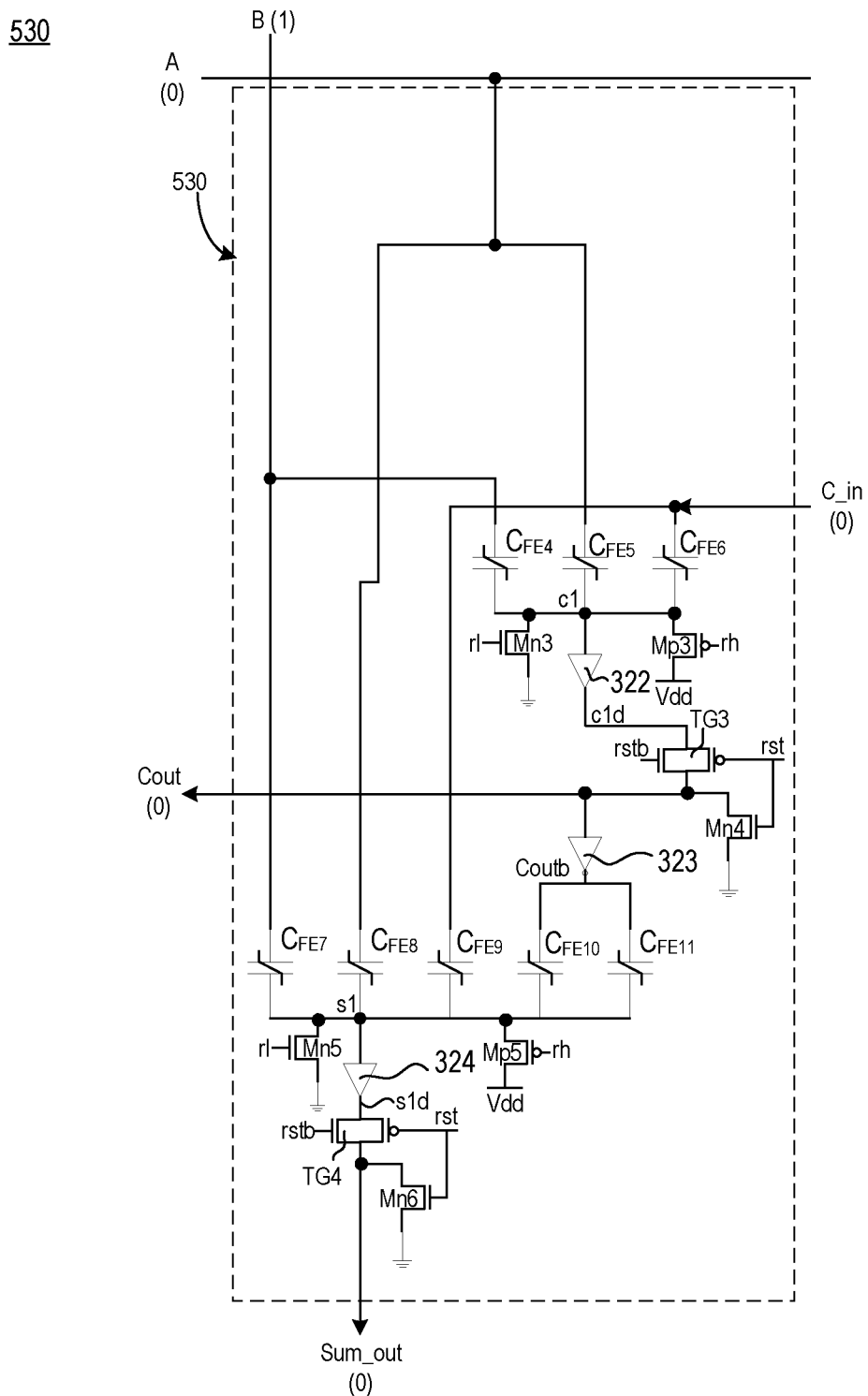
FIG. 5C illustrates a 1-bit full adder with a reset mechanism having transmission gates, wherein the 1-bit-full adder includes majority or minority gates with ferroelectric capacitors, in accordance with some embodiments.

FIG. 5C illustrates 1-bit full adder 530 with a reset mechanism having transmission gates, wherein the 1-bit full adder includes majority or minority gates with ferroelectric capacitors, in accordance with some embodiments. 1-bit full adder 530 is derived from multiplier cell 500 after AND gate 302, pull-up device MP1, pull-down device MN1, buffer 321, TF1, and pull-down device Mn2, TG2, and pull-up device MP2 are removed. Inputs X, Y, and Sum_in are repurposed. For example, input Sum_in is removed, input Y is relabeled as 'A' and input B is relabeled as 'B'. During reset phase, rst is asserted and rstb is de-asserted, and inputs A, B, and C_in are conditioned as 0, 1, and 0, respectively. Note, A, B, and $C_{in}$ are symmetric and can be swapped with one another. In this example, input terminals of capacitors $C_{FE4}$, $C_{FE5}$, and $C_{FE6}$ are conditioned to 0, 1, and 0, respectively while input terminals of capacitors $C_{FE7}$, $C_{FE8}$, $C_{FE9}$, $C_{FE10}$, and $C_{FE11}$ are conditioned to 0, 0, 1, 1, and 1 respectively. Floating node c1 is then pulled up and then pulled down, in accordance with various embodiments. In some embodiments, floating node s1 is pulled down and then pulled up at the same time (or substantially the same time) when floating node c1 is being pulled up and pulled down. During the reset phase the outputs $C_{out}$ and Sum_out are forced to logical 0 outputs. After the reset phase is over, evaluation phase begins. In various embodiments, the evaluation phase begins after one or more cycles (or a 1 or more microseconds) to allow charges on both terminals of the ferroelectric capacitors to settle or stabilize.

Figure 6A:
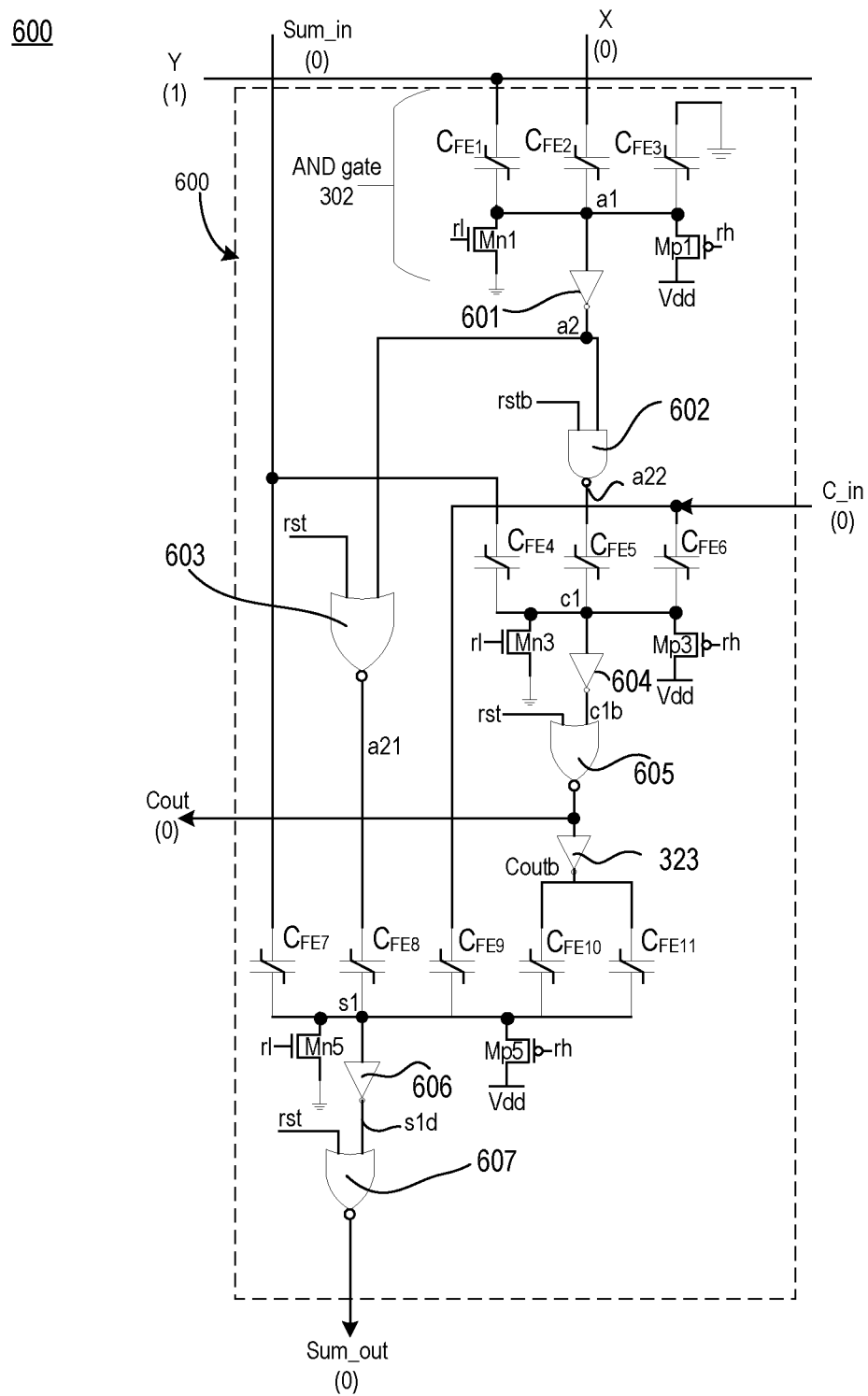
FIG. 6A illustrates a multiplier cell having a 1-bit full adder and an AND gate using majority or minority gates with ferroelectric capacitors and with reset mechanism comprising transmission gates, in accordance with some embodiments.

FIG. 6A illustrates multiplier cell 600 having a 1-bit full adder and an AND gate using majority or minority gates with ferroelectric capacitors and with reset mechanism comprising transmission gates, in accordance with some embodiments. Compared to multiplier cell 500, here transmission gates TG1, TG2, TG3, and TG4 are removed, and their technical effect is achieved by NAND and NOR gates, and inverters. As such, multiplier 600 comprises inverter 601, NAND gate 602, NOR gate 603, inverter 604, NOR gate 605, inverter 606, and NOR gate 607 coupled as shown.

In some embodiments, NAND gate 602 is provided having a first input coupled to rstb and a second input coupled to node a2, where an output of NAND gate 602 is coupled to an input terminal of capacitor $C_{FE5}$. In various embodiments, inverter 601 is provided which couples to nodes a1 and a2, and is used to provide the correct polarity to NAND gate 602 and NOR gate 603. In some embodiments, NOR gate 603 is provided having a first input coupled to rst and a second input coupled to node a2. The output a21 of NOR gate 603 is coupled to an input terminal of capacitor $C_{FE8}$. In some embodiments, NOR gate 605 is provided having a first input coupled to rst and a second input coupled to node c1b (inverse of c1). In various embodiments, an inverter 604 is coupled to nodes c1 and c1b to create the correct polarity for the input of NOR gate 605. The output $C_{out}$ of NOR gate 605 is coupled to an input of inverter 323, which in turn drives input terminals of capacitors $C_{FE10}$ and $C_{FE11}$. In some embodiments, NOR gate 607 is provided having a first input coupled to rst and a second input coupled to node s1d. In various embodiments, inverter 606 is coupled to codes s1 and s1d to create the correct polarity for NOR gate 607.

The function of the NAND gate and the NOR gates to precondition or force logic values on nodes a22, a21, $C_{out}$, and Sum_out during reset phase. In the evaluation phase, the outputs of the NAND gate and the NOR gates are an inverted version of their inputs because in the evaluation phase the NAND gate and the NOR gates are configured as inverters. In some embodiments, the pull-down and pull-up devices are sequentially turned on and off to pull-down and pull-up the voltages on the floating nodes a1, c1, and s1 during reset phase. In various embodiments, the pull-down and pull-up events at each floating nodes is done at the same time or substantially at the same time, while the pull-down and pull-up events per floating node are performed sequentially. Depending on the input conditioning of signals X, Y, Sum_in and $C_{in}$, either pull-down event is done first or pull-up event is done first. After the reset phase, the evaluation phase begins which continues the normal operation of multiplier cell 600. In various embodiments, the reset phase can be performed for a number of multiplier cells simultaneously. As such, the same reset signals can be routed to a number of multiplier cells, in accordance with some embodiments.

Figure 6B:
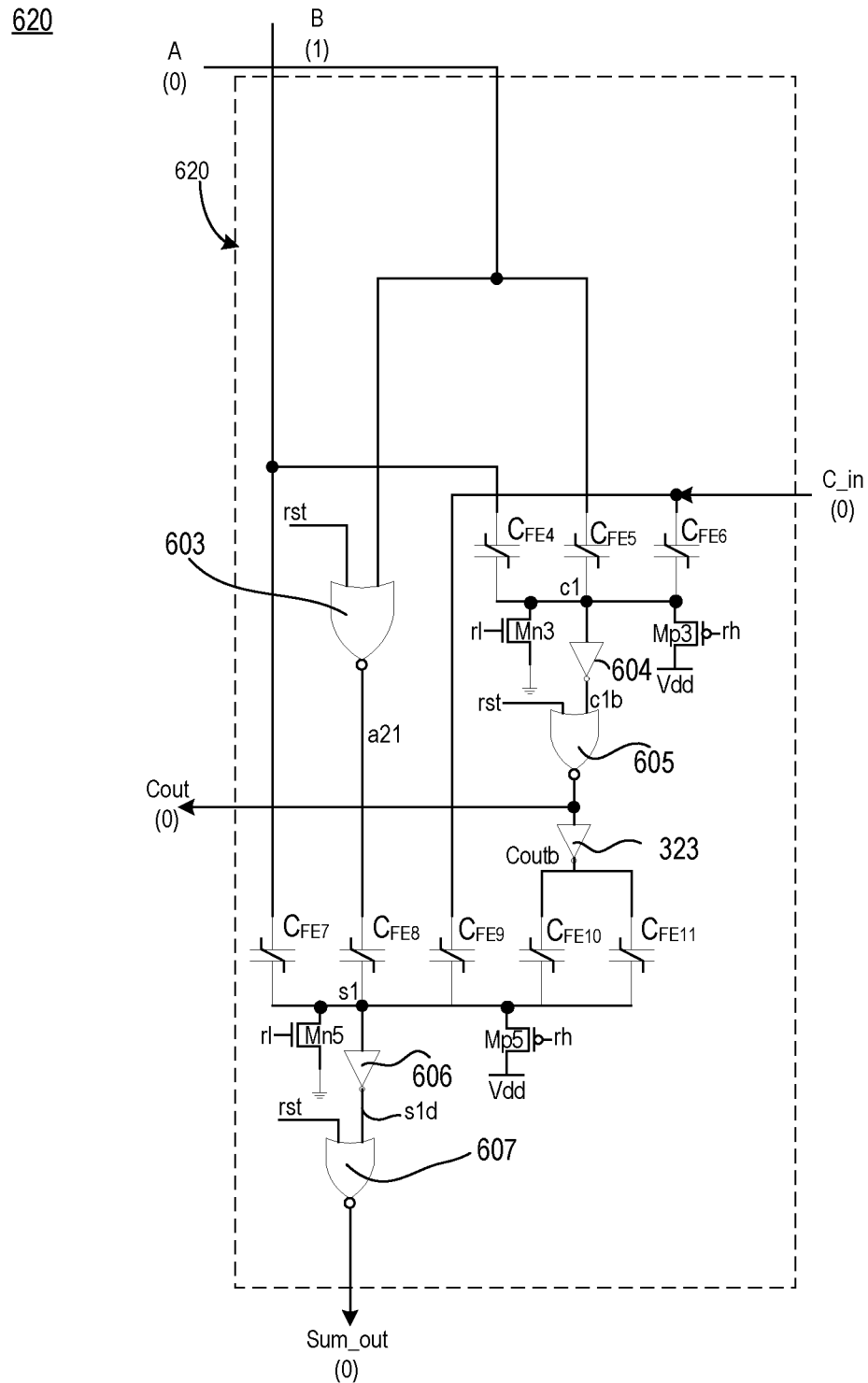
FIG. 6B illustrates a 1-bit full adder with a reset mechanism having three NOR gates, wherein the 1-bit-full adder includes majority or minority gates with ferroelectric capacitors, in accordance with some embodiments.

FIG. 6B illustrates 1-bit full adder 620 with a reset mechanism having three NOR gates, wherein the 1-bit full adder includes majority or minority gates with ferroelectric capacitors, in accordance with some embodiments. 1-bit full adder 620 is derived from multiplier cell 600 after AND gate 302, pull-up device MP1, pull-down device MN1, inverter 601, and NAND gate 602 are removed. Inputs X, Y, and Sum_in are repurposed. For example, input Sum_in is removed, input Y is relabeled as 'A' and input B is relabeled as 'B'. During reset phase, rst is asserted, and inputs A, B, and C_in are conditioned as 0, 1, and 0, respectively. Note, A, B, and $C_{in}$ are symmetric and can be swapped with one another. In this example, input terminals of capacitors $C_{FE4}$, $C_{FE5}$, and $C_{FE6}$ are conditioned to 0, 1, and 0, respectively while input terminals of capacitors $C_{FE7}$, $C_{FE8}$, $C_{FE9}$, $C_{FE10}$, and $C_{FE11}$ are conditioned to 0, 0, 0, 1, and 1 respectively. Floating node c1 is then pulled up and then pulled down, in accordance with various embodiments. In some embodiments, floating node s1 is pulled up and then pulled down at the same time (or substantially the same time) when floating node c1 is being pulled up and pulled down. During the reset phase the outputs $C_{out}$ and Sum_out are forced to logical 0 outputs. After the reset phase is over, evaluation phase begins. In various embodiments, the evaluation phase begins after one or more cycles (or a 1 or more microseconds) to allow charges on both terminals of the ferroelectric capacitors to settle or stabilize.

Figure 7A:
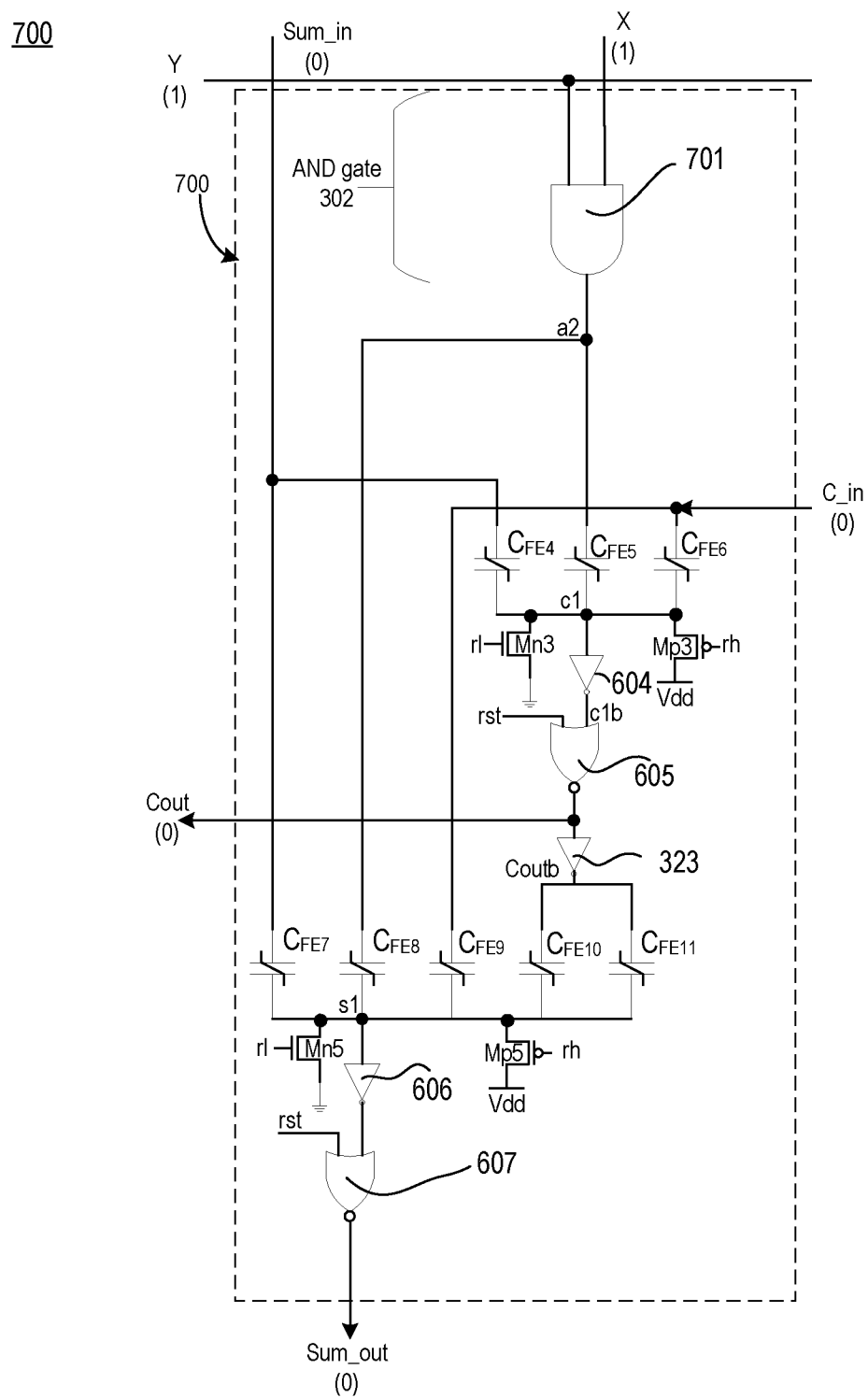
FIG. 7A illustrates a multiplier cell having a 1-bit full adder comprising CMOS based AND and NOR gates, and other majority gates, in accordance with some embodiments.

FIG. 7A illustrates multiplier cell 700 having a 1-bit full adder comprising CMOS based AND and NOR gates, and other majority gates, in accordance with some embodiments. Multiplier cell 700 is a simplified version of multiplier cell 600. Here, AND gate 202 is implemented as CMOS gate 701 instead of a majority (or minority gate). Further, NOR gate 603 is removed and node a2 is directly connected to the input of capacitor $C_{FEB}$. In some embodiments, during reset, X is set to logic 1, Y is set to logic 1, Sum_in is set to logic 0, and C_in is set to 0. In various embodiments, the pull-down devices (e.g., Mn3 and Mn5) and pull-up devices (e.g., Mp3 and Mp5) are sequentially turned on and off to pull-down and pull-up the voltages on the floating nodes c1 and s1 during reset phase. Depending on the input conditioning of signals X, Y, Sum_in and $C_{in}$, either pull-down event is done first or pull-up event is done first. After the reset phase, the evaluation phase begins which continues the normal operation of multiplier cell 700. In various embodiments, the reset phase can be performed for a number of multiplier cells simultaneously. As such, the same reset signals can be routed to a number of multiplier cells, in accordance with some embodiments.

Figure 7B:
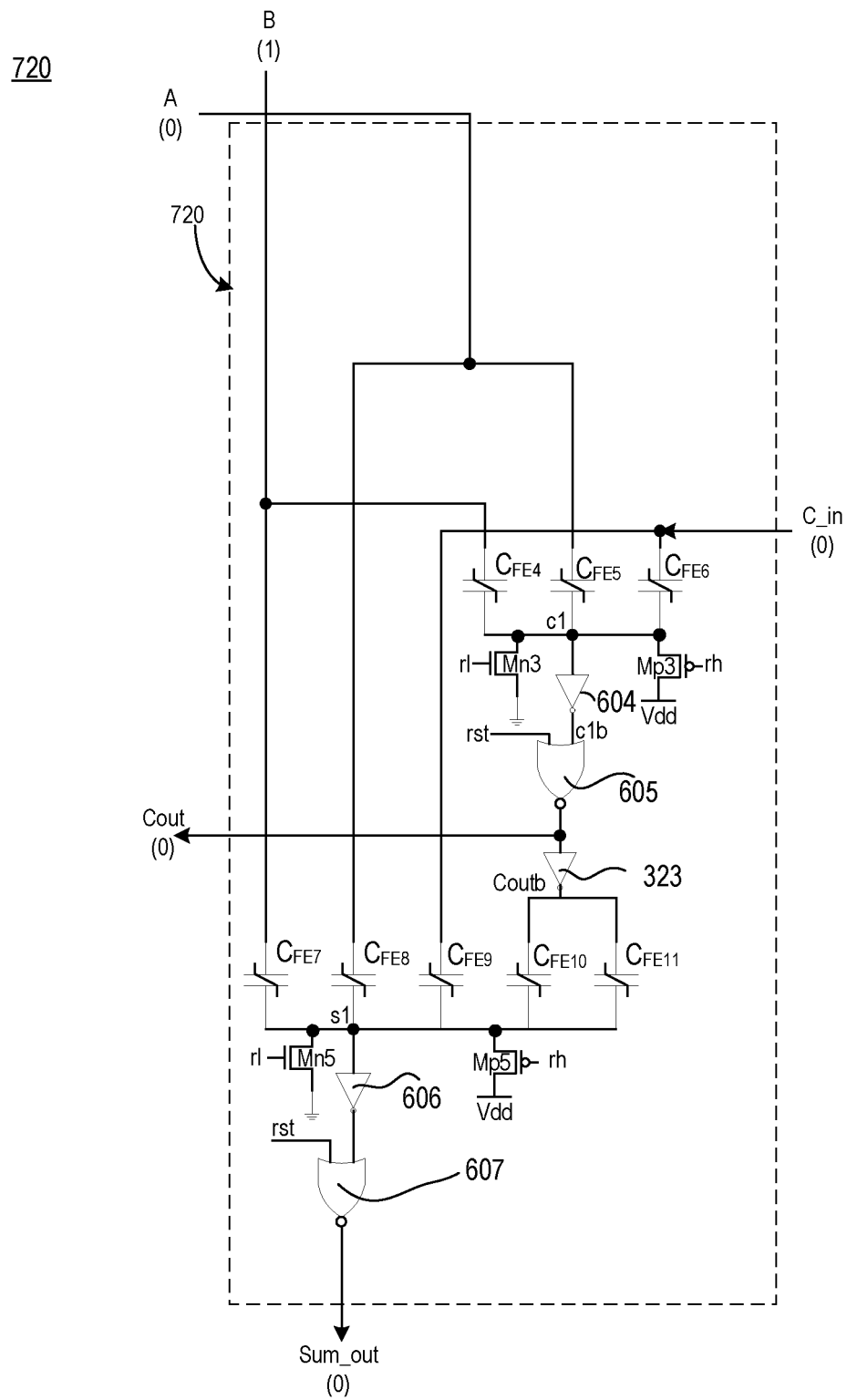
FIG. 7B illustrates a 1-bit full adder with a reset mechanism having two NOR gates, wherein the 1-bit-full adder includes majority or minority gates with ferroelectric capacitors, in accordance with some embodiments.

FIG. 7B illustrates 1-bit full adder 720 with a reset mechanism having two NOR gates, wherein the 1-bit full adder includes majority or minority gates with ferroelectric capacitors, in accordance with some embodiments. 1-bit full adder 720 is derived from multiplier cell 700 after AND gate 701 (e.g., AND gate 302) is removed. Inputs X, Y, and Sum_in are repurposed. For example, input Sum_in is removed, input Y is relabeled as 'A' and input B is relabeled as 'B'. During reset phase, rst is asserted, and inputs A, B, and C_in are conditioned as 0, 1, and 0, respectively. Note, A, B, and $C_{in}$ are symmetric and can be swapped with one another. In this example, input terminals of capacitors $C_{FE4}$, $C_{FE5}$, and $C_{FE6}$ are conditioned to 0, 1, and 0, respectively while input terminals of capacitors $C_{FE7}$, $C_{FE8}$, $C_{FE9}$, $C_{FE10}$, and $C_{FE11}$ are conditioned to 0, 0, 0, 1, and 1 respectively. Floating node c1 is then pulled up and then pulled down by devices Mp3 and Mn3 via rh and rl, respectively, in accordance with various embodiments. In some embodiments, floating node s1 is pulled up and then pulled down at the same time (or substantially the same time) when floating node c1 is being pulled up and pulled down. Floating node c1 is pulled up and pulled down by Mp5 and Mn5 via rh and rl, respectively. During the reset phase the outputs $C_{out}$ and Sum_out are forced to logical 0 outputs. After the reset phase is over, the evaluation phase begins. In various embodiments, the evaluation phase begins after one or more cycles (or a 1 or more microseconds) to allow charges on both terminals of the ferroelectric capacitors to settle or stabilize.

Figure 8A:
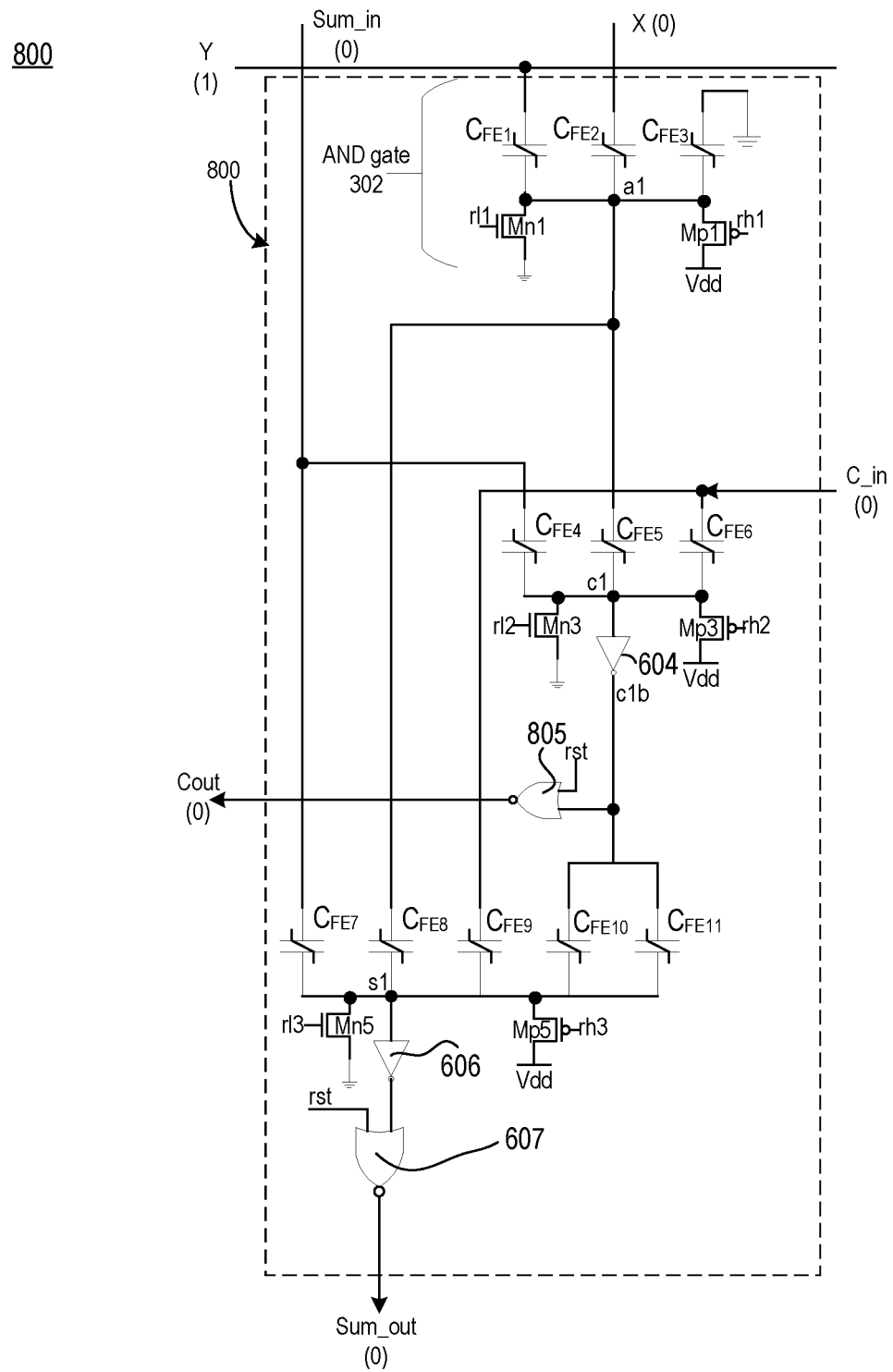
FIG. 8A illustrates a multiplier cell having a 1-bit full adder using majority or minority gates with ferroelectric capacitors and with reset mechanism comprising NOR gates that are sequentially reset, in accordance with some embodiments.

FIG. 8A illustrates multiplier cell 800 having a 1-bit full adder using majority or minority gates with ferroelectric capacitors and with reset mechanism comprising NOR gates, in accordance with some embodiments. In this case, floating node a1 is directly connected to capacitors $C_{FE5}$ and $C_{FE8}$, in accordance with some embodiments. In some embodiments, output c1b inverter 604 is input to NOR gate 805 and capacitors $C_{FE10}$ and $C_{FE11}$. NOR gate 805 is also controlled by reset signal rst. The output of NOR gate 805 is carry out $C_{out}$.

In various embodiments, the pull-down and pull-up devices are sequentially turned on and off to pull-down and pull-up the voltages on the floating nodes a1, c1, and s1 during reset phase. This sequence happens over a first reset cycle followed by a second reset cycle or third reset cycle as discussed with reference to FIG. 8B. For example, when X=0 and Y=1, pull-up device Mp1 is first turned on and then pull-down device Mn1 is turned on by rh1 and rl1 reset controls, respectively. At any one time, one of the pull-up device or pull-down device on a floating node is turned on during the first reset cycle. After floating node a1 is pulsed (e.g., after the pull-up and pull-down events on node a1), floating node c1 is pulsed. Floating node c1 is pulled by turned on pull-up device Mp3 and then turned on pull-down device Mn3 by controls rh2 and rl2, respectively. After floating node c1 is pulsed (e.g., after the pull-up and pull-down events on node c1), floating node s1 is pulsed. Floating node s1 is pulled up by turning on pull-up device Mp5 and then pulled down by turning on pull-down device Mn5 by controls rh3 and rl3, respectively.

Depending on the input conditioning of signals X, Y, Sum_in and $C_{in}$, either pull-down event is done first or pull-up event is done first. After the reset phase, the evaluation phase begins which continues the normal operation of multiplier cell 800. In various embodiments, the reset phase can be performed for a number of multiplier cells simultaneously. As such, the same reset signals can be routed to a number of multiplier cells, in accordance with some embodiments. In some embodiments, when input X is set to logic 1 and input Y is set to logic 1, then the reset sequence after the first reset cycle (where a1 node is pulled down) will be like the one described with reference to FIG. 8C. In that case, node a1 is pulled up during the entire reset phase after the first reset cycle as described herein. In another example, node a1 is kept floating during the entire reset phase after the first reset cycle.

Figure 8B:
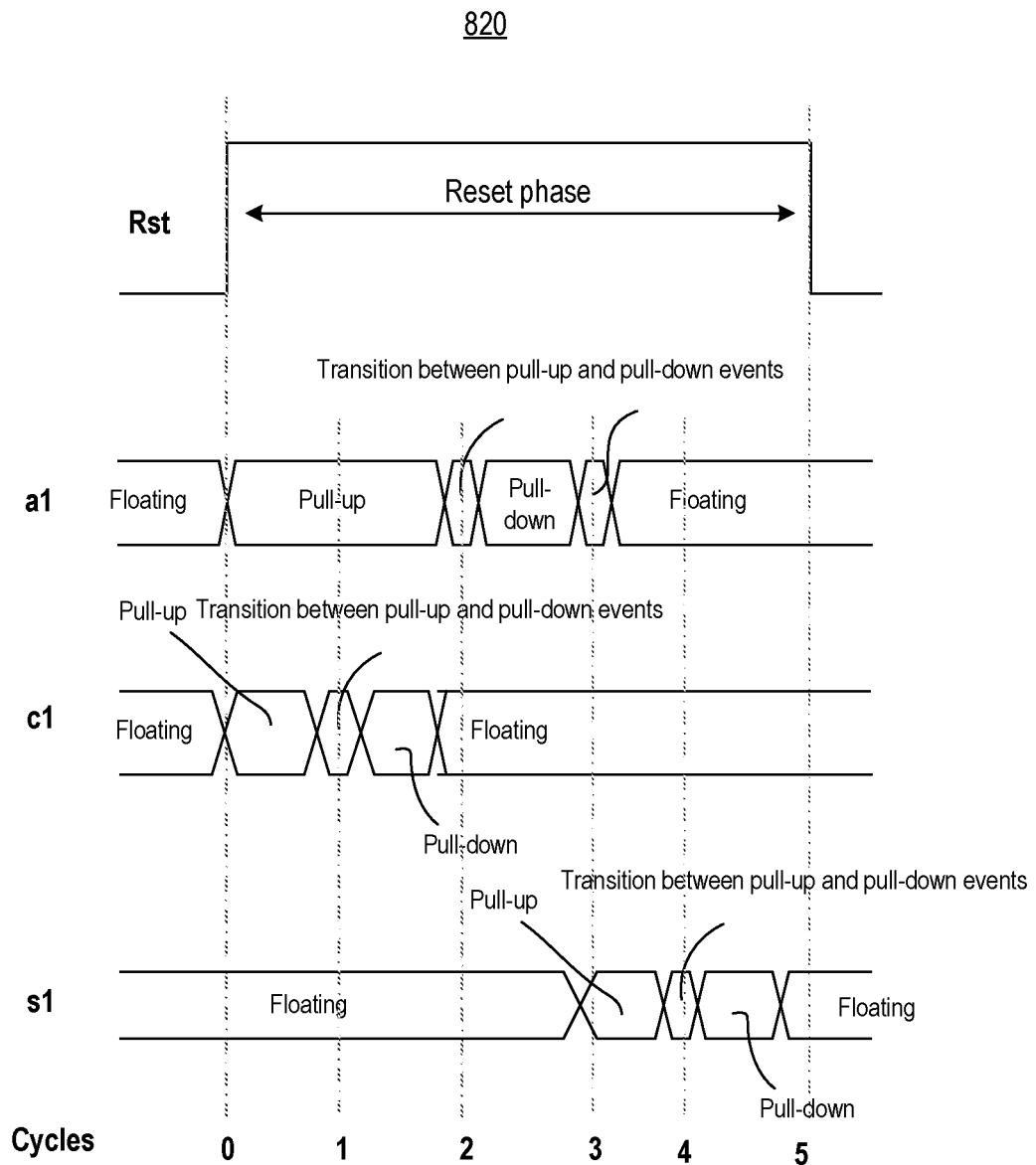
FIG. 8B illustrates a timing diagram for pull-up and pull-down events on the summation node of the majority or minority gates.

FIG. 8B illustrates timing diagram 820 for pull-up and pull-down events on the summation node of the majority or minority gates. Timing diagram 820 summarizes the sequence of resetting the floating nodes and holding or conditioning inputs and outputs during the reset phase. The reset phase starts after a one or few microseconds (e.g., 1 to 2 microseconds) after an evaluation phase. In some embodiments, the reset phase may start immediately (e.g., 0 to few picoseconds) after evaluation phase. For example, the evaluation phase may start instantaneously after the reset phase or wait for a few picoseconds. Similarly, other types of sequential reset phase can be derived where external inputs are changed to other values and reset pull-up and reset pull-down sequences on the floating nodes are derived according to the inputs received at each majority gate or minority gate. For example, both X and Y inputs of AND gate 302 and the AND gate of the 1-bit full adder can be made logical 1, providing the inputs of first majority based AND gate logic values of 0, 1, and 1. The floating node a1 can then be reset with a pull-down event followed by pull-up event sequence. The reset phase here is indicated by the Rst pulse. During this pulse width of Rst, floating nodes a1, c1, and s1 are reset as described with reference to various embodiments.

In some embodiments, when the non-linear polar material is a ferroelectric material, the inputs are set such that one of the multiplier X and multiplicand Y inputs is set to logic 0 while the other is set to logic 1. The carry input C_in and sum input Sum_in are also set to 0. The reset mechanism then sets voltages on the floating nodes a1, c1, and s1 of the multiplier cell (e.g., cell 500, 600, 700, 800) during a reset phase. Note, cell 700 does not have floating node a1. Once the reset phase expires, the normal phase (or evaluation phase) begins. During the evaluation phase, the reset mechanism is disabled.

The reset mechanism includes pull-up and pull-down devices coupled to the floating nodes. In some embodiments, when the non-linear polar material is a ferroelectric material, the three capacitors $C_{FE1}$, $C_{FE2}$, and $C_{FE3}$ of 3-input majority gate 302 and the three capacitors $C_{FE4}$, $C_{FE5}$, and $C_{FE6}$ of the 3-input majority gate of the 1-bit full adder are input 0, 0, and 1, respectively. In some embodiments, when the non-linear polar material is a ferroelectric material, five capacitors $C_{FE7}$, $C_{FE8}$, $C_{FE9}$, $C_{FE10}$, and $C_{FE11}$ of the 5-input majority gate of the full adder are input 0, 0, 0, 1, and 1, respectively. These inputs are forced by the reset mechanism or provided from an external source (e.g., by setting the voltages of sum input and carry input) and/or using transistors to force a value. Under these conditions for the input voltages of the non-linear capacitors, the reset mechanism first pulls up the floating nodes a1, c1, and s1 and then pulls down the floating nodes a1, c1, and s1 as shown in timing diagram 820, in accordance with some embodiments.

In some embodiments, there may be a transition period between pull-up and pull-down events. This transition period may be long enough that there is no crowbar current from supply Vdd to ground. After the pull-up and pull-down events, the floating nodes a1, c1, and s1 are allowed to float again (i.e., pull-up and pull-down devices are disabled by their respective control signals). In various embodiments, the pull-up and pull-down sequence for floating node c1 occurs between which floating node a1 is being pulled up. In some embodiments, the pull-up and pull-down sequence for floating node s1 occurs after the pull-down event for floating node a1 is over.

In this example of FIG. 8B, floating node a1 is pulled up to Vdd and kept like that for 2 cycles. This is done to allow the inputs for capacitors $C_{FE5}$ and $C_{FE8}$ to have a stable logical value of 1. During the first two cycles, capacitors $C_{FE4}$, $C_{FE5}$, and $C_{FE6}$ receive logic inputs of 0, 1, and 0 respectively. In some embodiments, floating node c1 is pulsed in these two cycles to Vdd and ground, and this completes the reset of floating node c1. During the third cycle, the reset of floating node a1 is completed by pulling this node down to ground. During the fourth and fifth cycles, both nodes a1 an c1 are kept floating, and capacitors $C_{FE7}$, $C_{FE8}$, $C_{FE9}$, $C_{FE10}$, and $C_{FE11}$ receive logic values of 0, 0, 0, 1, and 1, respectively. During the fourth cycle, floating node s1 is pulled up to Vdd and then pulled down to ground in the fifth cycle. And, this way during the fourth and fifth cycles, reset of the floating node s1 node is completed. Thereafter, Rst signal is removed (or de-asserted) and the evaluation phase can begin either immediately or after allowing a period of a 1 to 10 cycles to allow the voltage across various nodes to stabilize, in accordance with some embodiments.

In some embodiments, the sequence of pulling up and pulling down the floating nodes a1, c1, and s1 can be flipped after changing the input voltages to the capacitors of the majority or minority gates of the multiplier cell. For example, in some embodiments, when the non-linear polar material is a ferroelectric material, the three capacitors $C_{FE1}$, $C_{FE2}$, and $C_{FE2}$ of 3-input majority gate 302 and the three capacitors $C_{FE4}$, $C_{FE5}$, and $C_{FE6}$ of the 3-input majority gate of the 1-bit full adder are input 0, 1, and 1, respectively. In some embodiments, when the non-linear polar material is a ferroelectric material, the five capacitors $C_{FE7}$, $C_{FE8}$, $C_{FE9}$, $C_{FE10}$, and $C_{FE11}$ of the 5-input majority gate are input 1, 1, 1, 0, and 0 respectively. These inputs can be forced by the reset mechanism or provided from external source (e.g., by setting the voltages of sum input and carry input) and/or using transistor(s) to force a value. Under these conditions for the input voltages of the non-linear capacitors, the reset mechanism first pulls down the floating nodes and then pulls up the floating nodes, in accordance with some embodiments. The reset mechanism may comprise transmission gates, pull-up devices, pull-down devices, NAND gates, or NOR gates or a combination of them as shown with reference to various exemplary embodiments.

Figure 8C:
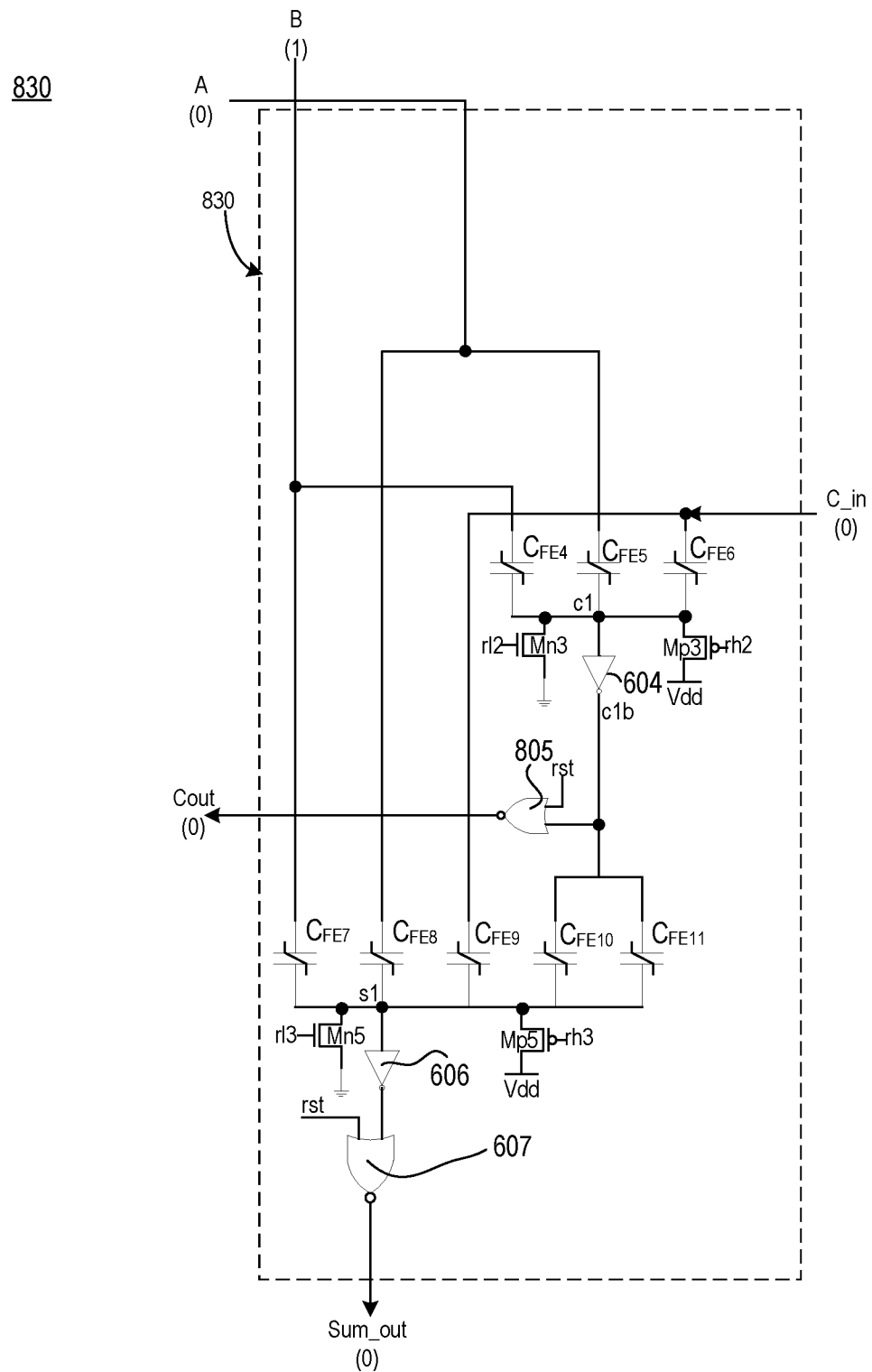
FIG. 8C illustrates a 1-bit full adder with a reset mechanism having two NOR gates, wherein the 1-bit-full adder includes majority or minority gates with ferroelectric capacitors that are sequentially reset, in accordance with some embodiments.

FIG. 8C illustrates 1-bit full adder 830 with a reset mechanism having two NOR gates, wherein the 1-bit full adder includes majority or minority gates with ferroelectric capacitors that are sequentially reset, in accordance with some embodiments. 1-bit full adder 830 is derived from multiplier cell 800 after AND gate 302, pull-up device MP1, and pull-down device MN1 are removed. Inputs X, Y, and Sum_in are repurposed. For example, input Sum_in is removed, input Y is relabeled as 'A' and input B is relabeled as 'B'. During reset phase, rst is asserted, and inputs A, B, and C_in are conditioned as 0, 1, and 0, respectively. Note, A, B, and $C_{in}$ are symmetric and can be swapped with one another. In this example, input terminals of capacitors $C_{FE4}$, $C_{FE5}$, and $C_{FE6}$ are conditioned to 0, 1, and 0, respectively while input terminals of capacitors $C_{FE7}$, $C_{FE8}$, $C_{FE9}$, $C_{FE10}$, and $C_{FE11}$ are conditioned to 0, 0, 0, 1, and 1 respectively. Floating node c1 is then pulled up and then pulled down using rh2 and r12, respectively, in accordance with various embodiments. In some embodiments, floating node s1 is pulled up and then pulled down using rh3 and r13, respectively. In some embodiments, floating node s1 is pulled up and then pulled down after floating node c1 is being pulled up and pulled down. In this case, the floating nodes are reset in a sequence. During the reset phase the outputs $C_{out}$ and Sum_out are forced to logical 0 outputs.

In various embodiments, the reset signal rst is enabled at the start of the reset phase. During reset, $C_{out}$ and Sum_out (e.g., the outputs of the 1-bit full adder) is logic 0 during the reset phase since the output for both the majority (or minority) gates of the 1-bit full adder are controlled by the reset signal rst to NOR gate 805 and NOR gate 607, which has one of the signals as rst.

In some embodiments, during the first reset cycle of the reset phase, charges on the input terminals capacitors $C_{FE4}$, $C_{FE5}$, $C_{FE6}$ are conditioned to 0, 1, and 0, respectively. During the first reset cycle, c1 node is pulled up by Mp3, which makes the values of ferroelectric capacitors $C_{FE10}$ and $C_{FE11}$ as logic 0. In this case, the subsequent 5-input majority gate receives logic levels 1, 0, 0, 0, and 0 on the input terminals of $C_{FE7}$, $C_{FE8}$, $C_{FE9}$, $C_{FE10}$, and $C_{FE11}$, respectively, which may not be a correct condition for resetting this 5-input majority gate. Therefore, the node s1 is kept floating during the first reset cycle in accordance with some embodiments.

During the second reset cycle, c1 node is pulled down by Mp3, and that makes the logic values on the input terminals of capacitors $C_{FE10}$ and $C_{FE11}$ as logic 1 and logic 1, respectively. In the second reset cycle, s1 node is pulled down as well by Mn5. This way, the reset of both the 3-input majority gate and the 5-input majority gate of the 1-bit full adder overlaps during the second cycle. In the second reset cycle, the reset of the 3-input majority gate is complete and node c1 is kept floating after the second cycle.

In some embodiments, during the third reset cycle, the 5-input majority gate receives logic levels 1, 0, 0, 1, and 1 on the input terminals of $C_{FE7}$, $C_{FE8}$, $C_{FE9}$, $C_{FE10}$, and $C_{FE11}$, respectively and s1 node is pulled up by Mp5. With this, the reset of the entire circuit 830 is complete. Starting from the fourth cycle, rst signal is set to logic 0, and the outputs $C_{out}$ and Sum_out can change according to the input values applied to the circuit. Both c1 and s1 nodes are kept floating. For example, after the reset phase is over, evaluation phase begins. In various embodiments, the evaluation phase begins after one or more cycles (or a 1 or more microseconds) to allow charges on both terminals of the ferroelectric capacitors to settle or stabilize.

Figure 9:
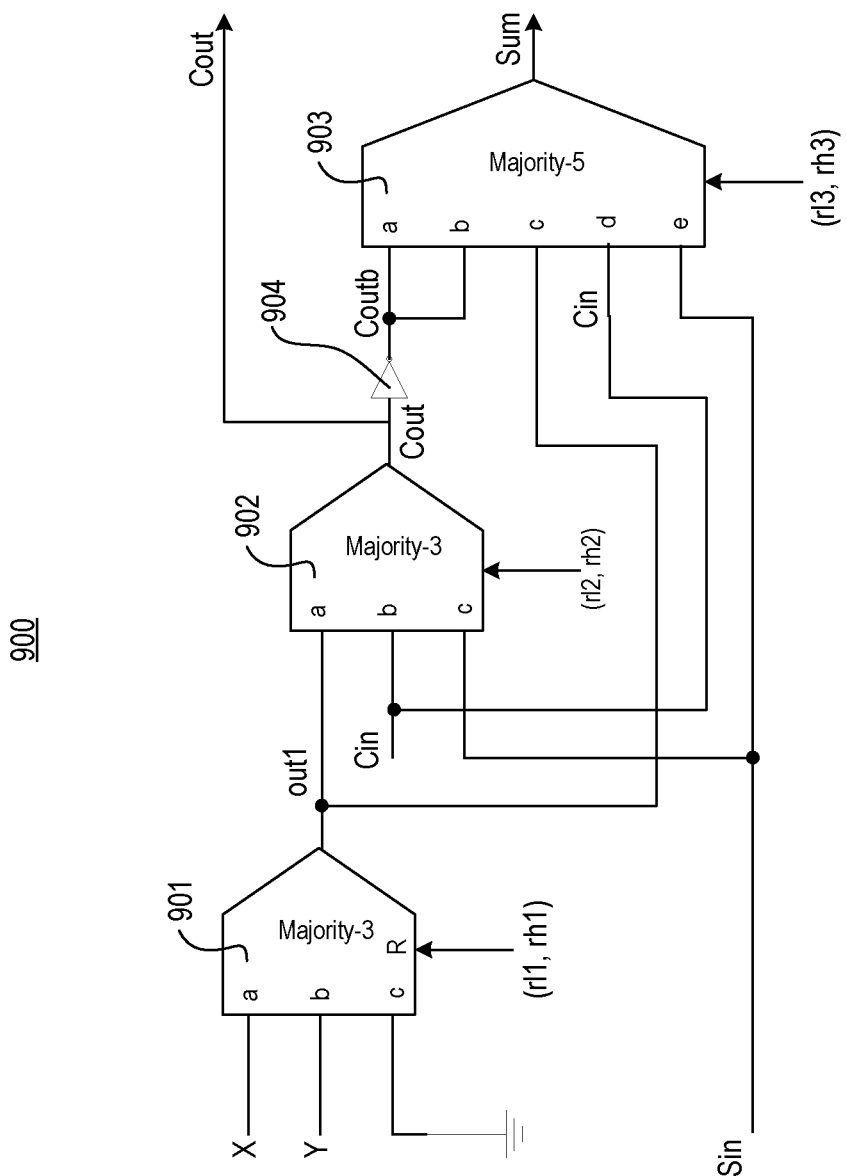
FIG. 9 illustrates a high-level majority-gate implementation of a multiplier-cell that is reset in multiple cycles, in accordance with some embodiments.

FIG. 9 illustrates high-level majority gate implementation of a multiplier cell 900 that is reset in multiple cycles, in accordance with some embodiments. In some embodiments, multiplier cell 900 comprises 3-input majority gate 901, 3-input majority gate 902, 5-input majority gate 903, and inverter 904 coupled as shown. Each majority gate may receive its respective reset signals such as [r11, rh1], [r12, rh2], and [r13, rh3] as shown. In some embodiments, the reset signals are shared between gates 901, 902, and 903. For example, r11=r12, rh1=rh2, r13 is inverse of r11, and rh3 is inverse of rh1. In various embodiments, multiplier cell 900 is reset in two cycles without using NAND or NOR gates with reset controls.

Multiplier cell 900 is one of 500, 600, or 800. The inputs 'a', 'b', and 'c' of gate 901 are inputs to the capacitors $C_{FE1}$, $C_{FE2}$, and $C_{FE2}$, respectively, of 3-input majority gate 901. The inputs 'a', 'b', and 'c' of gate 902 are inputs to the capacitors $C_{FE4}$, $C_{FE5}$, and $C_{FE6}$, respectively, of 3-input majority gate 902. The inputs 'a', 'b', 'c', 'd', and 'e' of gate 903 are inputs to the capacitors $C_{FE7}$, $C_{FE8}$, $C_{FE9}$, $C_{FE10}$, and $C_{FE11}$, respectively. Input 'a' of majority gate 901 is coupled to multiplier input X, input 'b' of majority gate 901 is coupled to multiplicand Y, and input 'c' is coupled to ground. By coupling one of the inputs (here, 'c') to ground, majority gate 901 is configured as an AND gate. The output of this AND gate is out1 which is input to input 'a' of majority gate 901 and input 'c' of majority gate 903. Input 'b' of majority gate 902 receives carry input $C_{in}$, which is also provided as input 'd' to majority gate 903. Input 'c' of majority gate 902 receives sum input Sin, which is also provided as input 'e' to majority gate 903. The output $C_{out}$ of majority gate 902 is inverted by inverter 904 to generate Coutb. Coutb is also provided as input to inputs 'a' and 'b' of majority gate 903. The output of majority gate 902 is Sum.

In some embodiments, after reset is released (e.g., when reset ends), the evaluation phase may begin after 1 or 2 cycles to allow charges of various nodes to stabilize. In some embodiments, the reset process is a sequential process that is sequentially performed on majority gates 901, 902, and 903, and in two cycles.

In multiplier cell 900, inputs $C_{in}$ (carry input) and Sin (sum input) change over two separate cycles as shown in Table2. Inputs $C_{in}$ and Sin are kept consistent with their respective outputs which are $C_{out}$ and Sum. By changing the inputs $C_{in}$ and Sin over two separate cycles, the AND plus full adder cell is seamlessly put in a multiplier where the entire multiplier can be set in two cycles. In some embodiments, a few cycles (e.g., 1 to 10), may be lapsed between the two cycles of the reset. This is done to let the outputs of the otherwise floating nodes inside the majority or minority gates to stabilize for the subsequent gates before the second cycle for a reset is applied. One advantage of such an approach where inputs to the majority or minority gates can change between the two reset cycles while keeping the outputs of the cell consistent with their respective inputs when placed in a complex circuit is better power, performance, and area (PPA). In some embodiments, the reset architecture of FIG. 9 NAND, NOR, or transmission gates to separate out two cells to stabilize the next cell's inputs for reset. As such, the reset architecture of FIG. 9 reduces a total number of cycles needed for reset and provides better area and energy advantage.

Table 2 summarizes the reset mechanism.

TABLE 2

|  | Majority gate 901 | Majority gate 902 | Majority gate 903 |
| --- | --- | --- | --- |
| Reset Cycle 1 | Set [X, Y] = [1, 1] Set [a, b, c] = [1, 1, 0] Pull-down floating node a1 (i.e., rh1 = 1, rl1 = 1) Output: Cout = Cin Output: Sout = Sin | Set [Cin] = 0 Set [a, b, c] = [0, 0, 1] Pull-down floating node c1 (i.e., rh2 = 1, rl2 = 1) Output: Cout = Cin Output: Sout = Sin | Set [Sin] = 1 Set [a, b, c, d, e] = [1, 1, 0, 0, 1] Pull-up floating node s1 (i.e., rh3 = 0, rl3 = 0) Output: Cout = Cin Output: Sout = Sin |
| Reset Cycle 2 | Set [X, Y] = [1, 1] Set [a, b, c] = [1, 1, 0] Pull-up floating node a1 (i.e., rh1 = 0, rl1 = 0) Output: Cout = Cin Output: Sout = Sin | Set [Cin] = 1 Set [a, b, c] = [1, 1, 0] Pull-up floating node c1 (i.e., rh2 = 0, rl2 = 0) Output: Cout = Cin Output: Sout = Sin | Set [Sin] = 0 Set [a, b, c, d, e] = [0, 0, 1, 1, 0] Pull-down floating node s1 (i.e., rh3 = 1, rl3 = 1) Output: Cout = Cin Output: Sout = Sin |

In the first cycle, inputs a, b, and c of majority gate 901 are set to logical levels 1, 1, and 0, respectively. Thereafter, the floating node a1 of majority gate 901 is pulled down by the pull-down transistor Mn1 via ill. In the first cycle, inputs a, b, and c of majority gate 902 are set to logical levels 0, 0, and 1, respectively. Thereafter, the floating node c1 of majority gate 902 is pulled down by the pull-down transistor Mn3 via r12. In the first cycle, inputs a, b, c, d, e, and f of majority gate 903 are set to logical levels 1, 1, 0, 0, and 1, respectively. Thereafter, the floating node s1 of majority gate 903 is pulled up by the pull-up transistor Mp5 via rh3.

In the second cycle, inputs a, b, and c of majority gate 901 are set to logical levels 1, 1, and 0, respectively. Thereafter, the floating node a1 of majority gate 901 is pull-up by the pull-up transistor Mp1 via rh1. In the second cycle, inputs a, b, and c of majority gate 902 are set to logical levels 1, 1, and 0, respectively. Thereafter, the floating node c1 of majority gate 902 is pulled up by the pull-up transistor Mp3 rh2. In the second cycle, inputs a, b, c, d, e, and f of majority gate 903 are set to logical levels 0, 0, 1, 1, and 0, respectively. Thereafter, the floating node s1 of majority gate 903 is pulled down by the pull-down transistor Mn5 via r13. In various embodiments, setting inputs and performing pull-up (and pull-down) of each floating node occurs in a sequence from majority gate 901, followed by gate 902, and then gate 903. After cycle 2, the evaluation phase begins. In some embodiments, evaluation phase occurs after cycle 3 to allow charges of the various nodes to settle.

Figure 10:
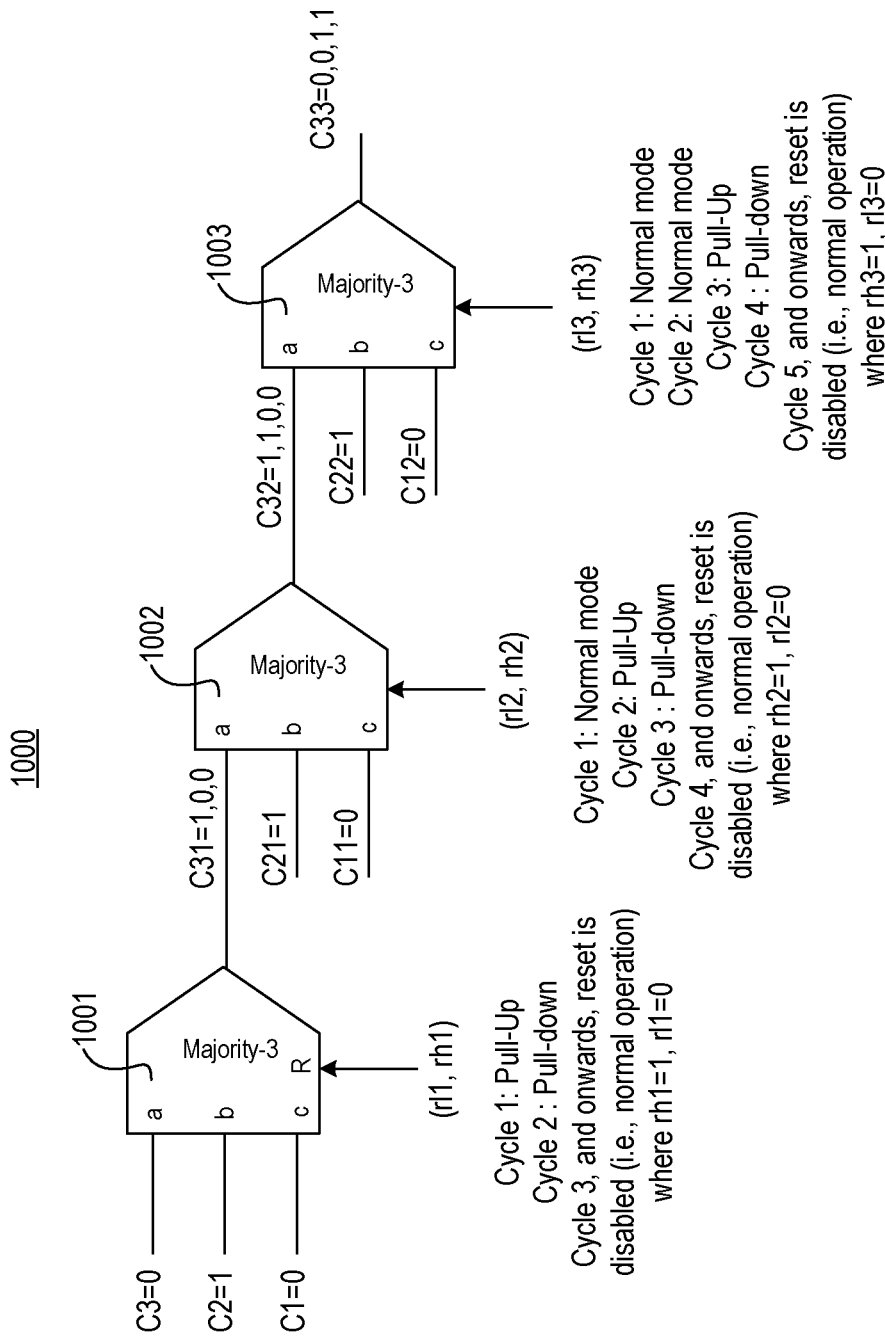
FIG. 10 illustrates a majority-gate chain comprising ferroelectric capacitors, wherein the majority-gate chain is sequentially reset, in accordance with some embodiments.

FIG. 10 illustrates majority-gate chain 1000 comprising ferroelectric capacitors, wherein the majority-gate chain is sequentially reset, in accordance with some embodiments. Chain 1000 comprises majority gate 1001 coupled to majority gate 1002, which in turn is coupled to majority gate 1003. The output of majority gate 1001 is coupled to input 'a' of majority gate 1002. The majority gates can be like the majority gate used for AND gate 302, and include the pull-up and pull-down transistors as discussed with reference to various embodiments. While the sequential reset scheme is illustrated for 3-input majority gates, the embodiments are applicable to any odd input majority gate chain. The output of majority gate 1002 is coupled to to input 'a' of majority gate 1003. In various embodiments, each majority gate receives its respective reset signal. For example, majority gate 1001 is reset by r11 and rh1, majority gate 1002 is reset by r12 and rh2, and majority gate 1003 is reset by r13 and rh3. In some embodiments, the non-linear polar material (e.g., ferroelectric material) for the majority gates 1001, 1002, and 1003 are the same. In some embodiments, the non-linear polar material (e.g., ferroelectric material) for the majority gates 1001, 1002, and 1003 are different. For example, majority gate 1001 may use Bismuth ferrite (BFO), with a doping material where in the doping material is one of Lanthanum, or elements from lanthanide series of periodic table, while majority gate 1002 may use relaxor ferroelectric.

To reset majority-gate chain 1000, inputs a, b, and c of majority gate 1001 are conditioned to C3=0, C2=1, and C1=0 logical states, respectively. Thereafter, at cycle 1, pull-up device Mp1 is turned on by rh1, and then at cycle 2 pull-down device Mn1 is turned on ill. Note, when pull-down device Mn1 is turned on, pull-up device Mp1 is turned off. At cycle 3, r11 and rh2 are disabled (e.g., rh1=1 and r11=0) and majority gate 1001 is allowed to operate in normal mode.

To reset majority-gate chain 1000, inputs a, b, and c of majority gate 1002 are conditioned to C31=0, C21=1, and C11=0 logical states, respectively. In cycle 1, majority gate 1002 operates in normal mode because majority gate 1001 is being reset in cycle 1. Thereafter, at cycle 2, pull-up device Mp3 is turned on by rh2, and then at cycle 3 pull-down device Mn1 is turned on by r12. Note, when pull-down device Mn3 is turned on, pull-up device Mp3 is turned off. At cycle 4 and onwards, rh2 and r12 are disabled (e.g., rh2=1 and rh2=0) and majority gate 1002 is allowed to operate in normal mode.

To reset majority-gate chain 1000, inputs a, b, and c of majority gate 1003 are conditioned to C32=0, C22=1, and C21=0 logical states, respectively. In cycles 1 and 2, majority gate 1003 operates in normal mode because majority gate 1001 and majority gate 1002 are being reset in cycles 1 and 2. Thereafter, at cycle 3, pull-up device Mp5 is turned on by rh3, and then at cycle 4 pull-down device Mn5 is turned on by r13. Note, when pull-down device Mn5 is turned on, pull-up device Mp3 is turned off. At cycle 5 and onwards, rh3 and r13 are disabled (e.g., rh3=1 and rh3=0) and majority gate 1003 is allowed to operate in normal mode. As such, chain 1000 is reset. This reset may happen after 1 to 2 microseconds of evaluation phase, in accordance with some embodiments.

In various embodiments, in a chain of majority gates having ferroelectric capacitors (e.g., the arrangement shown in FIG. 10), the reset mechanism sets the three inputs of the first minority gate to 1, 0, and 0 respectively. In that case, the summation node or floating node of the minority gates is then pulled-up and then pulled-down for every stage (every majority gate) sequentially.

Figure 11:
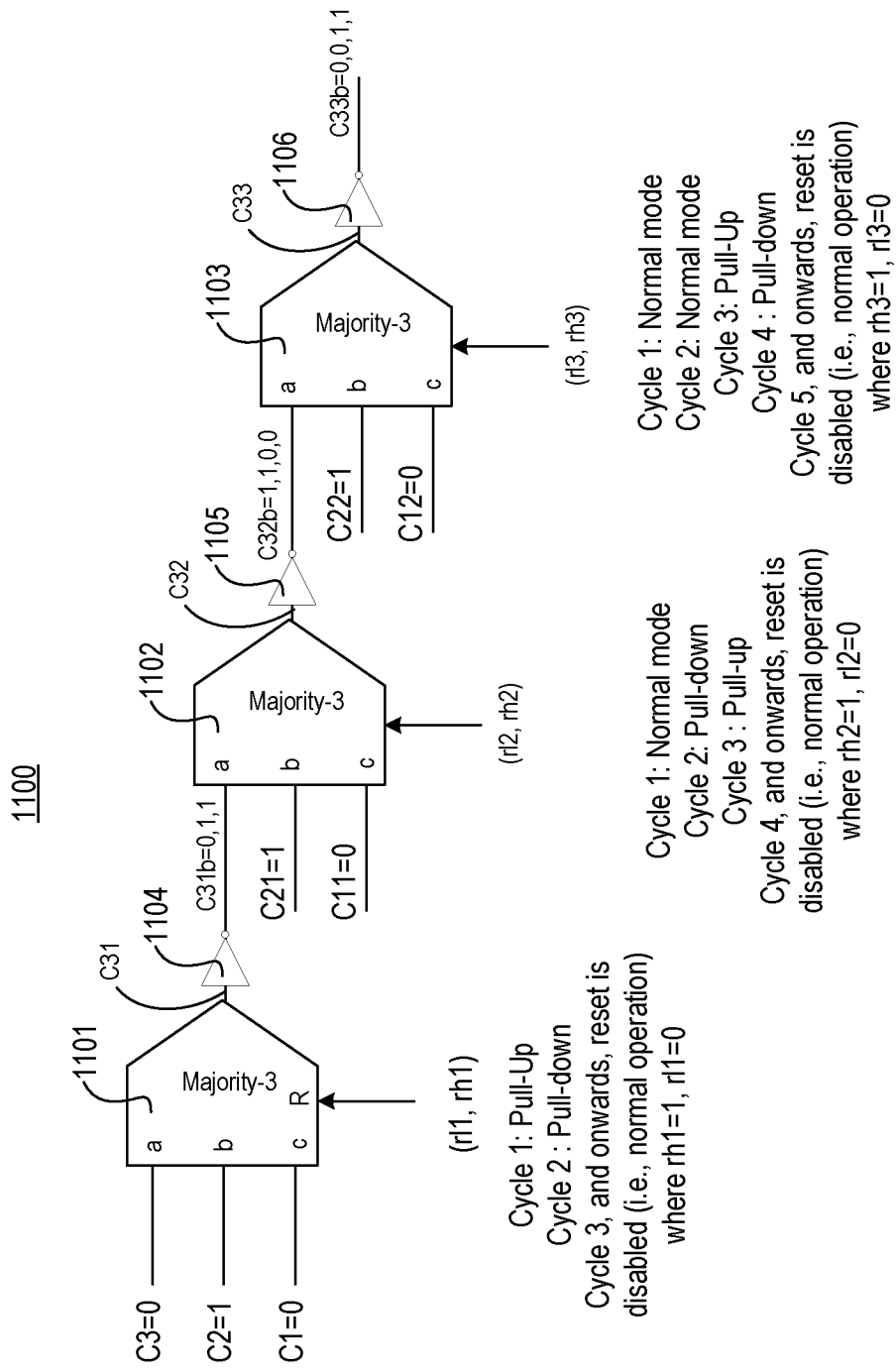
FIG. 11 illustrates a minority-gate chain comprising ferroelectric capacitors, wherein the minority-gate chain is sequentially reset, in accordance with some embodiments.

FIG. 11 illustrates minority-gate chain 1100 comprising ferroelectric capacitors, wherein the minority-gate chain is sequentially reset, in accordance with some embodiments. A minority gate is a majority gate followed by an inverter. Chain 1100 comprises majority gates 1101, 1102, 1103 and inverters 1104, 1105, and 1106 coupled to the outputs of majority gates 1101, 1102, 1103, respectively. Output C31 of majority gate 1101 is inverted by inverter 1104 to generate output C31b. Output C32 of majority gate 1102 is inverted by inverter 1105 to generate output C32b. Output C33 of majority gate 1103 is inverted by inverter 1106 to generate output C33b. In various embodiments, each minority gate receives its respective reset signal. For example, majority gate 1101 is reset by rh1 and r11, majority gate 1102 is reset by rh2 and r12, and majority gate 1103 is reset by rh3 and r13.

To reset minority-gate chain 1100, inputs a, b, and c of minority gate 1101 are conditioned to C3=0, C2=1, and C1=0 logical states, respectively. Thereafter, at cycle 1, pull-up device Mp1 is turned on by rh1, and then at cycle 2 pull-down device Mn1 is turned on by ill. Note, when pull-down device Mn1 is turned on, pull-up device Mp1 is turned off. At cycle 3, r11 and rh1 are disabled (e.g., rh1=1 and rh1=0) and majority gate 1101 is allowed to operate in normal mode.

To reset minority-gate chain 1100, inputs a, b, and c of majority gate 1102 are conditioned to C31b=0, C21b=1, and C11b=0 logical states, respectively. This conditioning may happen at cycle 2. In cycle 1, majority gate 1102 operates in normal mode because majority gate 1101 is being reset in cycle 1. Thereafter, at cycle 2, pull-up device Mp3 is turned on by rh2, and then at cycle 3 pull-down device Mn1 is turned on by ill. Note, when pull-down device Mn3 is turned on, pull-up device Mp3 is turned off. At cycle 4 and onwards, rh2 and r12 are disabled (e.g., rh2=1 and rh2=0) and majority gate 1102 is allowed to operate in normal mode.

To reset majority-gate chain 1100, inputs a, b, and c of majority gate 1103 are conditioned to C32b=0, C22b=1, and C12b=0 logical states, respectively. This conditioning may happen at cycle 3. In cycles 1 and 2, majority gate 1103 operates in normal mode because majority gates 1101 and 1102 are being reset in cycles 1 and 2. Thereafter, at cycle 3, pull-up device Mp5 is turned on by rh3, and then at cycle 4 pull-down device Mn5 is turned on by r13. Note, when pull-down device Mn5 is turned on, pull-up device Mp3 is turned off. At cycle 5 and onwards, rh3 and r13 are disabled (e.g., rh3=1 and rh3=0) and majority gate 1103 is allowed to operate in normal mode. As such, chain 1100 is reset. This reset may happen after 1 to 2 microseconds of evaluation phase, in accordance with some embodiments.

In various embodiments, in a chain of minority gates having ferroelectric capacitors (e.g., the arrangement shown in FIG. 11), the reset mechanism sets the three inputs of the first minority gate to 0, 1, and 0 respectively. In that case, the summation node or floating node of the minority gates is then pulled-up and then pulled-down for every odd stage sequentially. In some embodiments, the reset mechanism sets the three inputs of the first minority gate to 0, 1, and 1 respectively. In that case, the summation node or floating node of the minority gates is then pulled-down and then pulled-up for every even stage sequentially.

In various embodiments, the reset for a chain of majority or minority gates happens sequentially over multiple cycles. This way, the reset mechanisms avoids having to place NOR, NAND or transmission gates in between majority or minority gates controlled by reset signals to allow proper reset of multiple gates. In some embodiments, multiple types of reset sequences and input logic value combinations such as 0, 0, and 1 to the input capacitors of the majority or minority or majority gates with a pull-up event and followed by a pull-down event can be utilized for further flexibility. Likewise, input logic value combinations such as 1, 1, and 0 to the input capacitors of the majority or minority or majority gates with a pull-down event followed by a pull-up event can be utilized for further flexibility. A similar reset mechanism can be established for threshold gates.

In some embodiments, the reset can take multiple cycles to pass through a chain of minority or majority gates. In some cases, there are other types of CMOS gates between two majority or minority gates, such as NAND, NOR, AND, OR, XOR, multiplexers, and/or complex gates, etc. controlled by other signals. In those cases, inputs to these CMOS gates are conditioned to receive a desired sequence of logic values for a particular majority or minority gate in the chain at the desired cycles.

Figure 12:
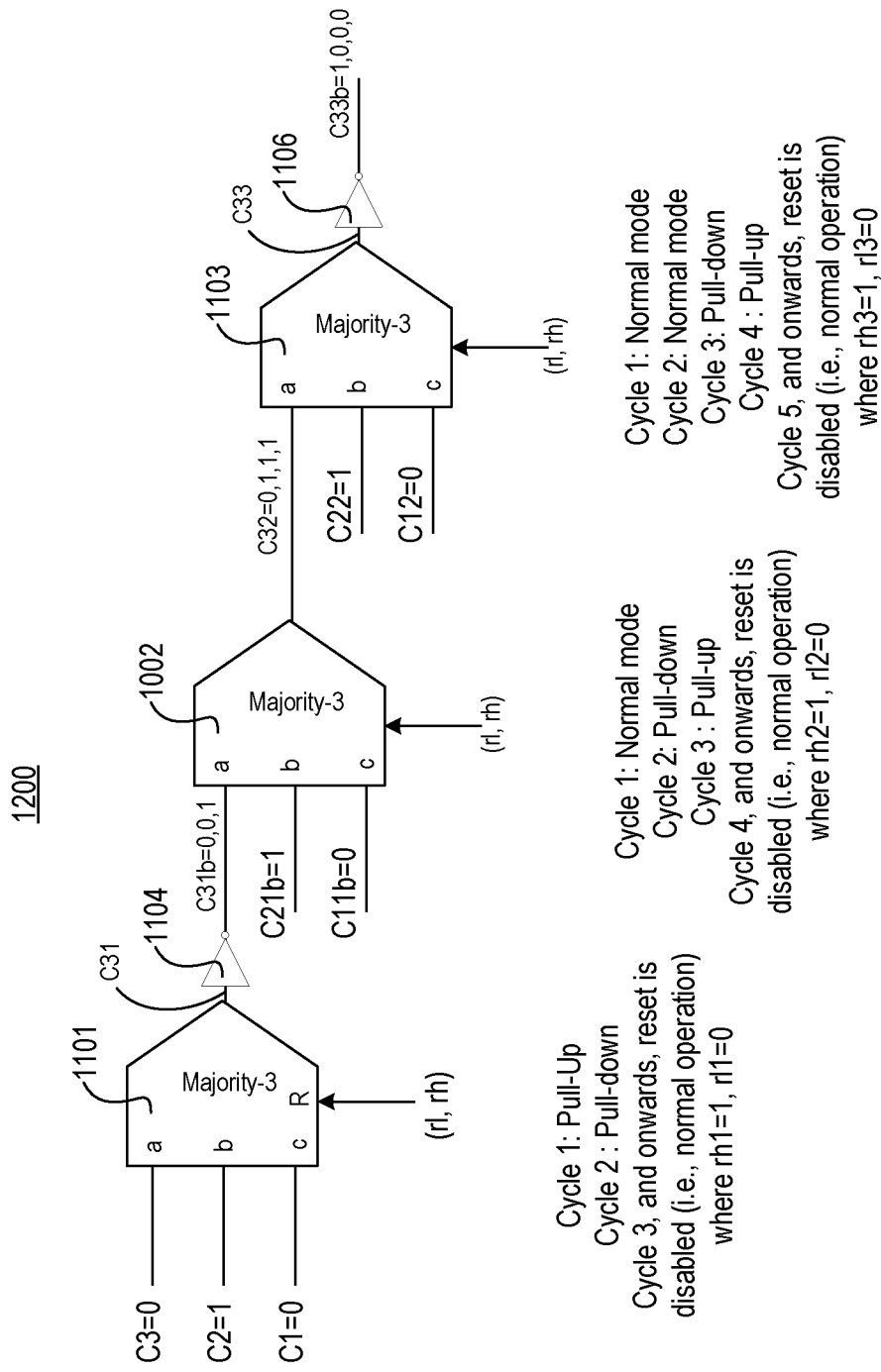
FIG. 12 illustrates a mix of majority-gate and minority gate in a chain comprising ferroelectric capacitors, wherein the chain of gates is sequentially reset, in accordance with some embodiments.

FIG. 12 illustrates a mix of majority-gate and minority gate in chain 1200 comprising ferroelectric capacitors, wherein the chain of gates is sequentially reset, in accordance with some embodiments. Chain 1200 is like chain 1100 but for replacing majority gate 1102 (which when combined with inverter 1105 is a minority gate) with 3-input majority gate 1002.

To reset chain 1200, inputs a, b, and c of minority gate 1101 are conditioned to C3=0, C2=1, and C1=0 logical states, respectively. Thereafter, at cycle 1, pull-up device Mp1 is turned on by rh1, and then at cycle 2 pull-down device Mn1 is turned on by ill. Note, when pull-down device Mn1 is turned on, pull-up device Mp1 is turned off. At cycle 3, rh1 and rh1 are disabled (e.g., rh1=1 and rh1=0) and majority gate 1101 is allowed to operate in normal mode.

To reset chain 1200, inputs a, b, and c of majority gate 1002 are conditioned to C31b=1, C21b=1, and C11b=0 logical states, respectively. This conditioning may happen at cycle 2. In cycle 1, majority gate 1102 operates in normal mode because majority gate 1101 is being reset in cycle 1. Thereafter, at cycle 2, pull-up device Mp3 is turned on by rh2, and then at cycle 3 pull-down device Mn3 is turned on by r12. Note, when pull-down device Mn3 is turned on, pull-up device Mp3 is turned off. At cycle 4 and onwards, rh2 and r12 are disabled (e.g., rh2=1 and rh2=0) and majority gate 1002 is allowed to operate in normal mode.

To reset chain 1200, inputs a, b, and c of majority gate 1103 are conditioned to C32=1, C22=1, and C12=0 logical states, respectively. This conditioning may happen at cycle 3. In cycles 1 and 2, majority gate 1103 operates in normal mode because minority gate 1101 (plus inverter 1104) and majority gate 1002 are being reset in cycles 1 and 2. Thereafter, at cycle 3, pull-up device Mp5 is turned on by rh3, and then at cycle 4 pull-down device Mn5 is turned on by r13. Note, when pull-down device Mn5 is turned on, pull-up device Mp3 is turned off. At cycle 5 and onwards, rh3 and r13 are disabled (e.g., rh3=1 and rh3=0) and majority gate 1103 is allowed to operate in normal mode. As such, chain 1200 is reset. This reset may happen after 1 to 2 microseconds of evaluation phase, in accordance with some embodiments.

Figure 13:
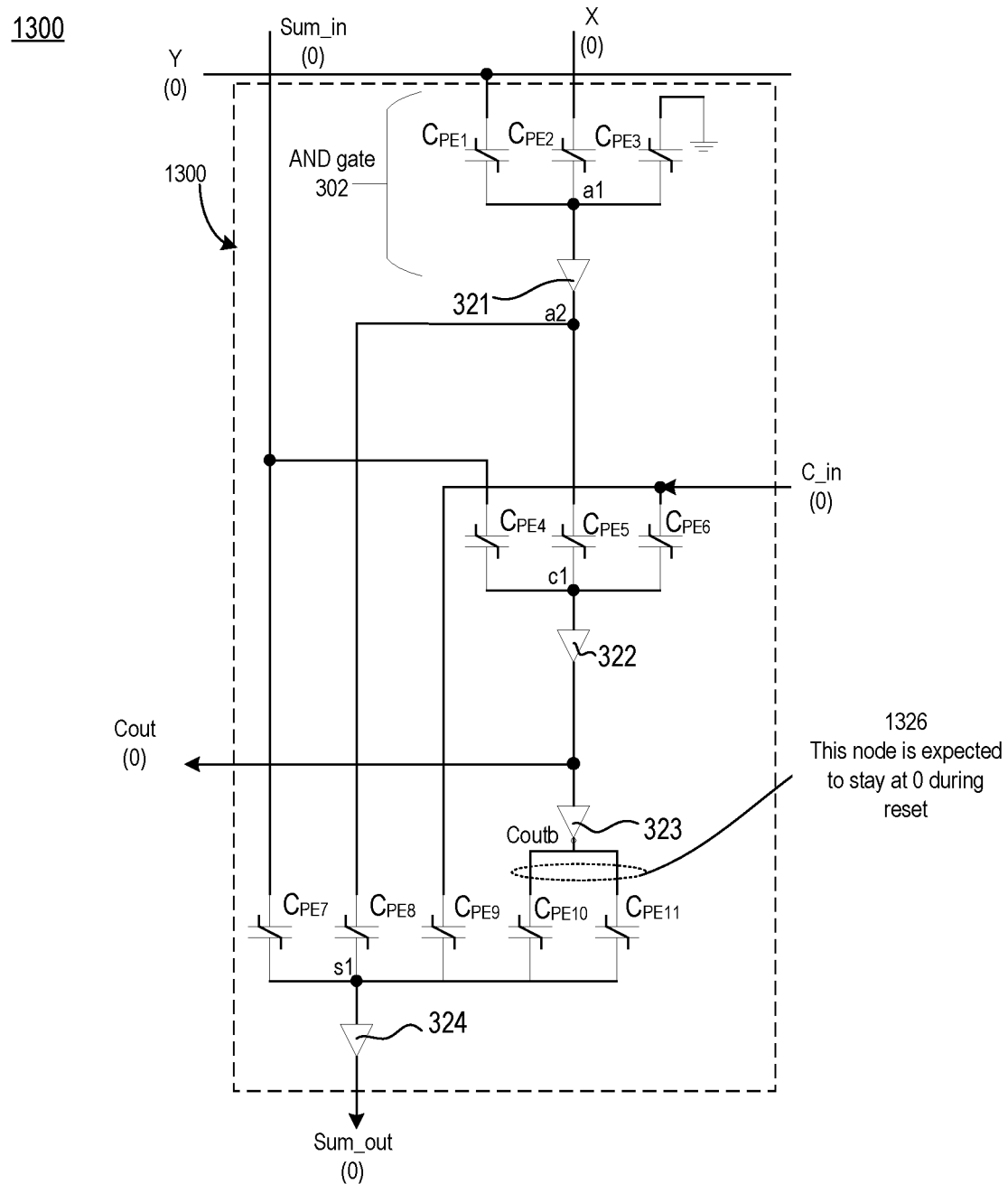
FIG. 13 illustrates a paraelectric based multiplier cell, in accordance with some embodiments.

FIG. 13 illustrates paraelectric based multiplier cell 1300, in accordance with some embodiments. Multiplier cell 1300 is like multiplier cell 320 but for replacing the ferroelectric capacitors with paraelectric capacitors. Ferroelectric capacitor $C_{FE1}$ is replaced with paraelectric capacitor $C_{PE1}$, ferroelectric capacitor $C_{FE2}$ is replaced with paraelectric capacitor $C_{FE2}$, ferroelectric capacitor $C_{FE3}$ is replaced with paraelectric capacitor $C_{PE3}$, ferroelectric capacitor $C_{FE4}$ is replaced with paraelectric capacitor $C_{PE0}$, ferroelectric capacitor $C_{FE5}$ is replaced with paraelectric capacitor $C_{PE5}$, ferroelectric capacitor $C_{FE6}$ is replaced with paraelectric capacitor $C_{PE6}$, ferroelectric capacitor $C_{FE7}$ is replaced with paraelectric capacitor $C_{PE7}$, ferroelectric capacitor $C_{FE8}$ is replaced with paraelectric capacitor $C_{PE8}$, ferroelectric capacitor $C_{FE9}$ is replaced with paraelectric capacitor $C_{PE9}$, ferroelectric capacitor $C_{FE10}$ is replaced with paraelectric capacitor $C_{PE10}$, and ferroelectric capacitor $C_{FE11}$ is replaced with paraelectric capacitor $C_{PE11}$. As such, AND gate 302 is a paraelectric based majority gate, and the 1-bit adder 301 comprises paraelectric based gates.

In various embodiments, to reset multiplier cell 1300, Coutb 1326 is expected to stay at logic 0 during reset phase. In some embodiments, when the non-linear polar material is a paraelectric material, all inputs (e.g., X, Y, Sum_in, C_in) to multiplier cell 1300 are set to 0. During reset phase, the floating nodes a1, c1, and s1 are pulled down, in accordance with some embodiments.

Figure 14A:
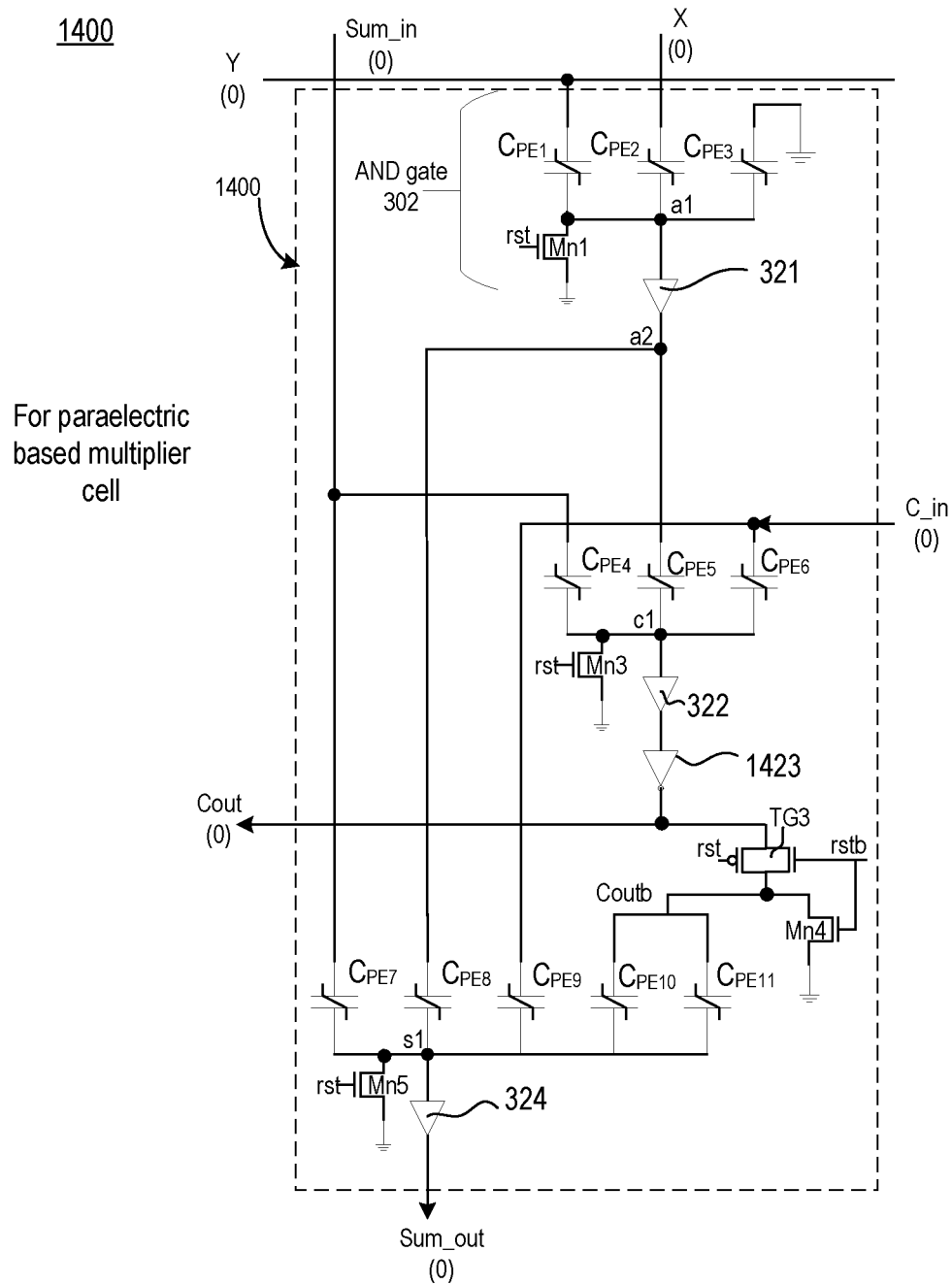
FIG. 14A illustrates a multiplier cell having a 1-bit full adder and an AND gate using majority or minority gates with paraelectric capacitors, wherein the multiplier cell includes a transmission-gate based reset mechanism, in accordance with some embodiments.

FIG. 14A illustrates multiplier cell 1400 having a 1-bit full adder and an AND gate using majority or minority gates with paraelectric capacitors, wherein the multiplier cell includes a transmission-gate based reset mechanism, in accordance with some embodiments. In some embodiments, an n-type pull-down transistor Mn1 is coupled to floating node a1 and controllable by rst. In some embodiments, an n-type pull-down transistor Mn3 is coupled to floating node c1 and controllable by rst. In some embodiments, an n-type pull-down transistor Mn5 is coupled to floating node s1 and controllable by rst.

In some embodiments, a transmission gate TG3 is coupled to node $C_{out}$ and is controllable by rst and rstb. In some embodiments, $C_{out}$ is generated by inverter 1423 which is coupled to buffer 322. TG3 is coupled to node $C_{out}$ and Coutb, where Coutb is coupled to paraelectric capacitors $C_{PE10}$ and $C_{PE11}$. In some embodiments, during reset phase, inputs X, Y, Sum_in and C_in are conditioned to logic 0, and then floating nodes a1, c1, and s1 are pulled down to ground. In some embodiments, floating nodes a1, c1, and s1 are pulled down simultaneously. In some embodiments, floating nodes a1, c1, and s1 are pulled down sequentially, where node a1 is pulled down first, followed by node c1, and then node s1. During the reset phase (e.g., rst=1), Coutb is forced to ground via pull-down transistor Mn5. After the reset phase (e.g., when rst=0), the evaluation phase begins. In some embodiments, there may be a difference of 1, 2 or more cycles between a reset phase after the evaluation phase. In some embodiments, the paraelectric capacitors are replaced with linear capacitors. The same reset mechanism may apply for linear capacitors, in accordance with some embodiments.

While the embodiments that use paraelectric capacitors illustrate a pull-down transistor on the floating nodes, a pull-up transistor may also be added to the floating nodes to balance leakage or to recondition the floating nodes when the input to the capacitors is changed. For example, when the input sequence to X, Y, and Sum_in is modified to logic 1, then the pull-up transistor is used to reset the floating nodes by pull-up the floating nodes to Vdd (e.g., power supply level).

Figure 14B:
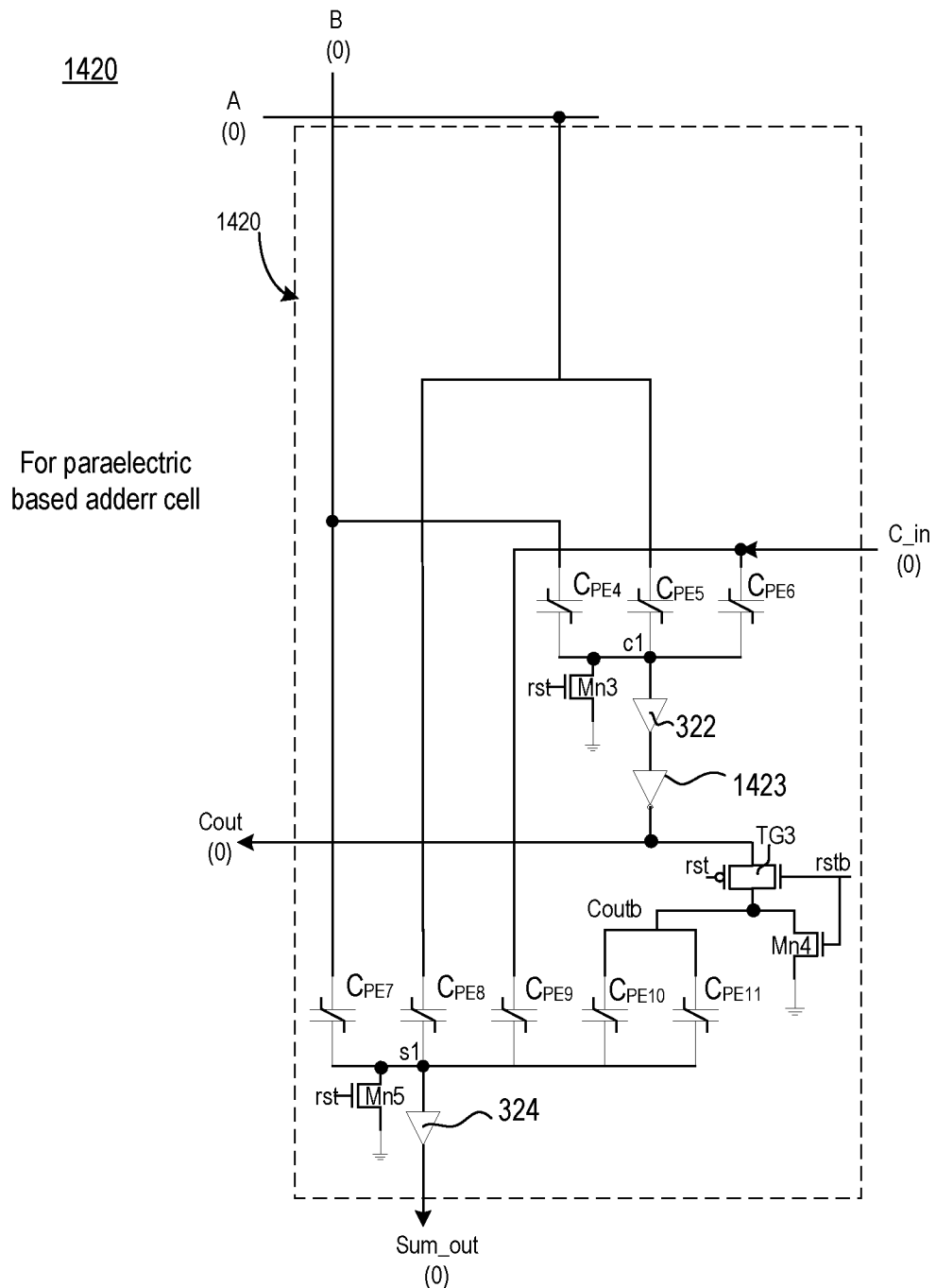
FIG. 14B illustrates a 1-bit full adder having paraelectric capacitors, wherein the 1-bit full adder has a reset mechanism that includes transmission-gate, in accordance with some embodiments.

FIG. 14B illustrates 1-bit full adder 1420 having paraelectric capacitors, wherein the 1-bit full adder has a reset mechanism that includes transmission-gate, in accordance with some embodiments. 1-bit full adder 1420 is derived from multiplier cell 1400 after AND gate 302, pull-up device Mp1, pull-down device Mn1, and buffer 321 are removed. Inputs X, Y, and Sum_in are repurposed. For example, input Sum_in is removed, input Y is relabeled as 'A' and input B is relabeled as 'B'. During reset phase, rst is asserted and rstb is de-asserted, and inputs A, B, and C_in are conditioned as 0, 0, and 0, respectively. Note, A, B, and $C_{in}$ are symmetric and can be swapped with one another. In this example, input terminals of capacitors $C_{PE4}$, $C_{PE5}$, and $C_{PE6}$ are conditioned to 0, 0, and 0, respectively while input terminals of capacitors $C_{PE7}$, $C_{PE8}$, $C_{PE9}$, $C_{PE10}$, and $C_{PE11}$ are conditioned to 0, 0, 0, 0, and 0 respectively. TG3 is closed during reset while Mn4 is turned on to condition logic 0 on node Coutb, and hence input of paraelectric capacitors $C_{PE10}$ and $C_{PE11}$. Floating node c1 is then pull-down by Mn3 via rst signal, in accordance with various embodiments. In some embodiments, floating node s1 is pulled down by Mn5 via rst at the same time (or substantially the same time) when floating node c1 is being pulled down. In some embodiments, during the reset phase, the outputs $C_{out}$ and Sum_out are forced to logical 0 outputs. After the reset phase is over, evaluation phase begins. In various embodiments, the evaluation phase begins after one or more cycles (or a 1 or more microseconds) to allow charges on both terminals of the paraelectric capacitors to settle or stabilize.

Figure 15A:
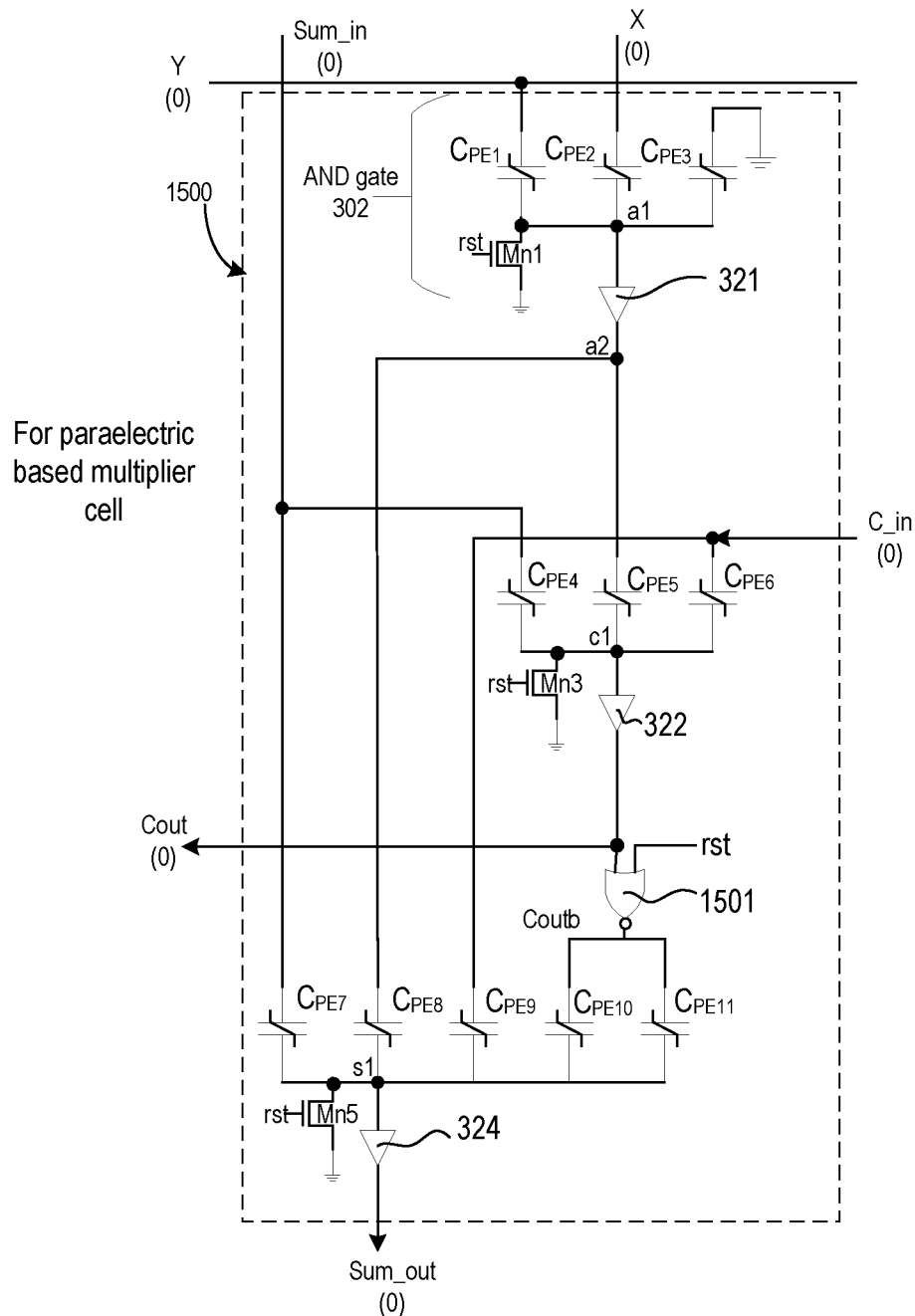
FIG. 15A illustrates a multiplier cell having a 1-bit full adder and an AND gate using majority or minority gates with paraelectric capacitors, wherein the multiplier cell includes a NOR gate based reset mechanism, in accordance with some embodiments.

FIG. 15A illustrates multiplier cell 1500 having a 1-bit full adder and an AND gate using majority or minority gates with paraelectric capacitors, wherein the multiplier cell includes a NOR gate based reset mechanism, in accordance with some embodiments. Multiplier cell is like multiplier cell 1400 but for replacing the TG3 with NOR gate 1501 which is coupled to nodes $C_{out}$, Coutb, and rst. The inputs to NOR gate are $C_{out}$ and rst, which the output of NOR gate 1501 is Coutb. The output of buffer 322 is directly input to NOR gate 1501.

In some embodiments, during reset phase, inputs X, Y, Sum_in and C_in are conditioned to logic 0, and then floating nodes a1, c1, and s1 are pulled down to ground. In some embodiments, floating nodes a1, c1, and s1 are pulled down simultaneously by pull-down transistors Mn1, Mn3, and Mn5, respectively. In some embodiments, floating nodes a1, c1, and s1 are pulled down sequentially, where node a1 is pulled down first, followed by node c1, and then node s1. During the reset phase (e.g., rst=1), Coutb is forced to logic 0 via NOR gate 1501. After the reset phase, the evaluation phase begins. In some embodiments, there may be a difference of 1 or 2 cycles between a reset phase after the evaluation phase to allow the paraelectric capacitors to settle down. The implementation of multiplier cell 1500 has 19 transistors, in accordance with some embodiments.

Figure 15B:
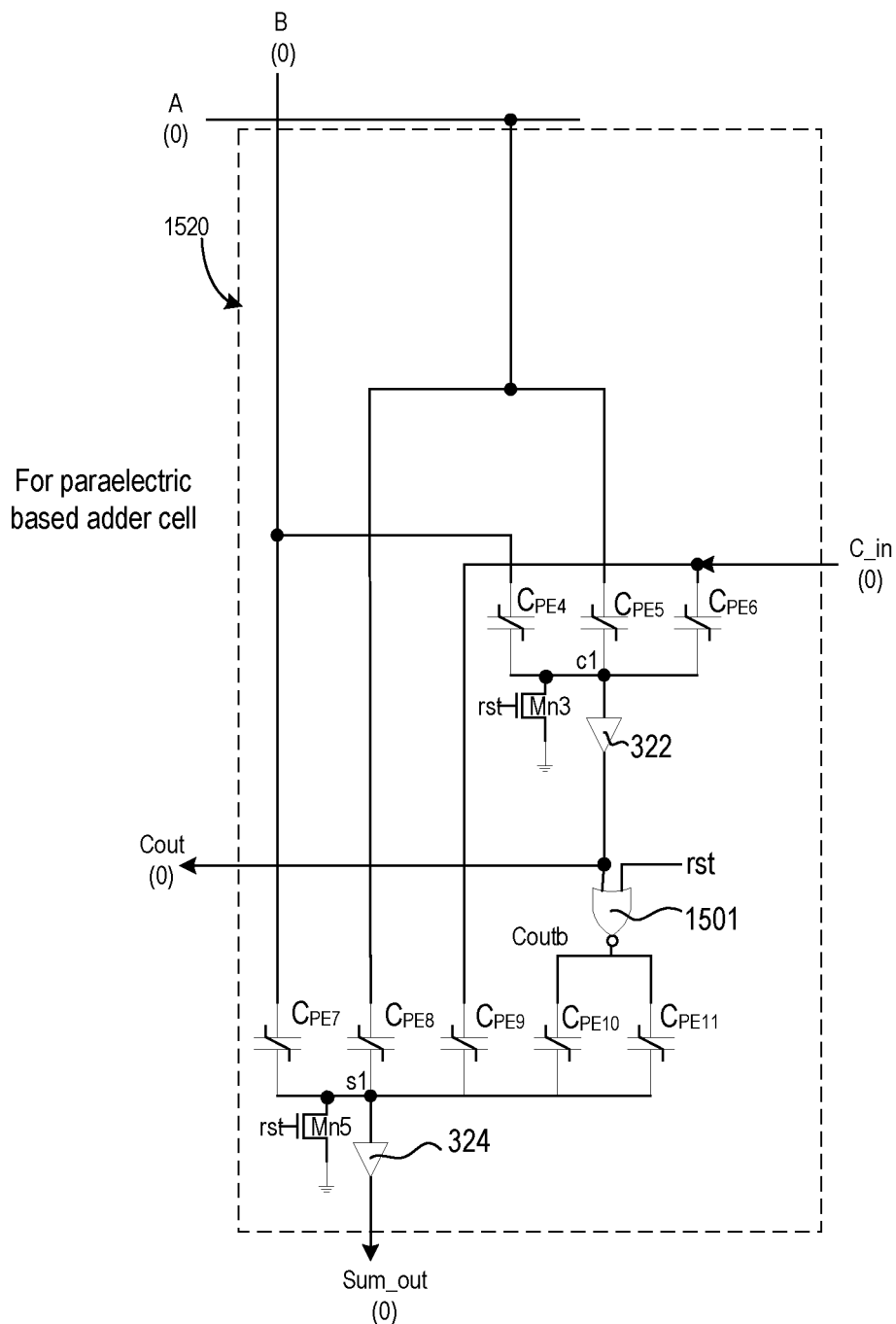
FIG. 15B illustrates a 1-bit full adder using majority or minority gates with paraelectric capacitors, wherein the 1-bit full adder cell includes a NOR gate based reset mechanism, in accordance with some embodiments.

FIG. 15B illustrates 1-bit full adder 1520 using majority or minority gates with paraelectric capacitors, wherein the 1-bit full adder cell includes a NOR gate based reset mechanism, in accordance with some embodiments. 1-bit full adder 1520 is derived from multiplier cell 1500 after AND gate 302, pull-up device Mp1, pull-down device Mn1, and buffer 321 are removed. Inputs X, Y, and Sum_in are repurposed. For example, input Sum_in is removed, input Y is relabeled as 'A' and input B is relabeled as 'B'. During reset phase, rst is asserted, and inputs A, B, and C_in are conditioned as 0, 0, and 0, respectively. Note, A, B, and $C_{in}$ are symmetric and can be swapped with one another. In this example, input terminals of capacitors $C_{PE4}$, $C_{PE5}$, and $C_{PE6}$ are conditioned to 0, 0, and 0, respectively while input terminals of capacitors $C_{PE7}$, $C_{PE8}$, $C_{PE9}$, $C_{PE10}$, and $C_{PE11}$ are conditioned to 0, 0, 0, 0, and 0 respectively. During reset, NOR gate 1501 conditions logic 0 on node Coutb, and hence input of paraelectric capacitors $C_{PE10}$ and $C_{PE11}$. Floating node c1 is then pulled down by Mn3 via rst signal, in accordance with various embodiments. In some embodiments, floating node s1 is pulled down by Mn5 via rst at the same time (or substantially the same time) when floating node c1 is being pulled down. In some embodiments, during the reset phase, the outputs $C_{out}$ and Sum_out are forced to logical 0 outputs. After the reset phase is over, evaluation phase begins. In various embodiments, the evaluation phase begins after one or more cycles (or a 1 or more microseconds) to allow charges on both terminals of the paraelectric capacitors to settle or stabilize.

Figure 16A:
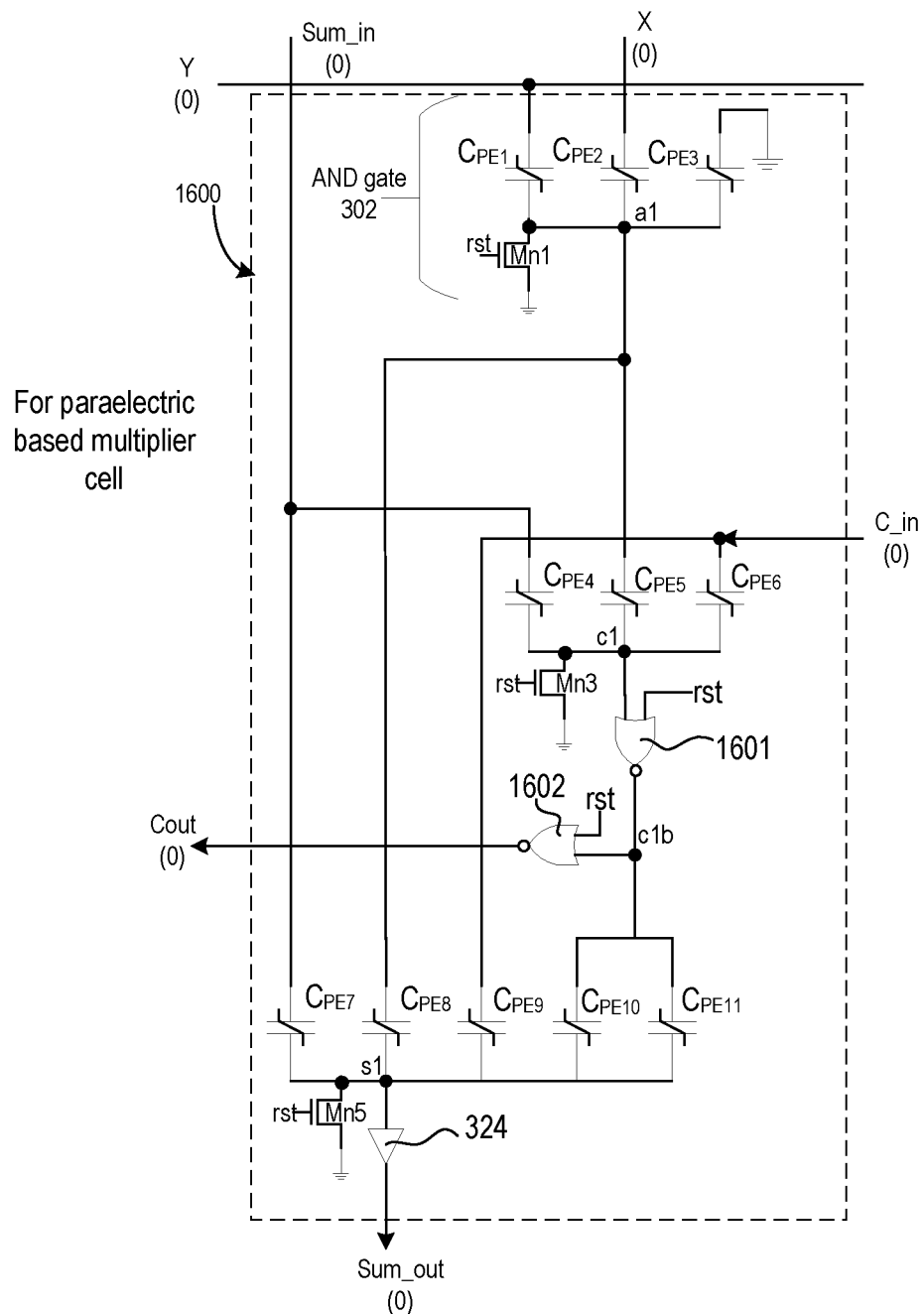
FIG. 16A illustrates a multiplier cell having a 1-bit full adder and an AND gate using majority or minority gates with paraelectric capacitors, wherein the AND gate is directly connected to the 1-bit full adder, wherein the multiplier cell includes a dual NOR gate based reset mechanism, in accordance with some embodiments.

FIG. 16A illustrates multiplier cell 1600 having a 1-bit full adder and an AND gate using majority or minority gates with paraelectric capacitors, wherein the AND gate is directly connected to the 1-bit full adder, wherein the multiplier cell includes a dual NOR gate based reset mechanism, in accordance with some embodiments. In some embodiments, floating node c1 is coupled to a first input of NOR gate 1601, which generates an output c1b. In various embodiments, node c1b is coupled to a first input of NOR gate 1602, which generates $C_{out}$. The second terminals of NOR gate 1601 and 1602 is coupled to rst.

In some embodiments, during reset phase, inputs X, Y, Sum_in and C_in are conditioned to logic 0, and then floating nodes a1, c1, and s1 are pulled down to ground by pull-down transistors Mn1, Mn3, and Mn5, respectively. In some embodiments, floating nodes a1, c1, and s1 are pulled down simultaneously. In some embodiments, floating nodes a1, c1, and s1 are pulled down sequentially, where node a1 is pulled down first, followed by node c1, and then node s1. During the reset phase, Coutb is forced to logic 0 via NOR gate 1601. During reset, $C_{out}$ is also forced to logic 0 by NOR gate 1602. After the reset phase, the evaluation phase begins. In some embodiments, there may be a difference of 1 or 2 cycles (or more) between a reset phase after the evaluation phase to allow for charges to settle on both terminals of the paraelectric capacitors. The implementation of multiplier cell 1600 has 15 transistors, in accordance with some embodiments. Compared to multiplier cell 1500, multiplier cell 1600 has lower energy consumption because the number of transistors is lower. The lower energy may come with a tradeoff in propagation delay.

Figure 16B:
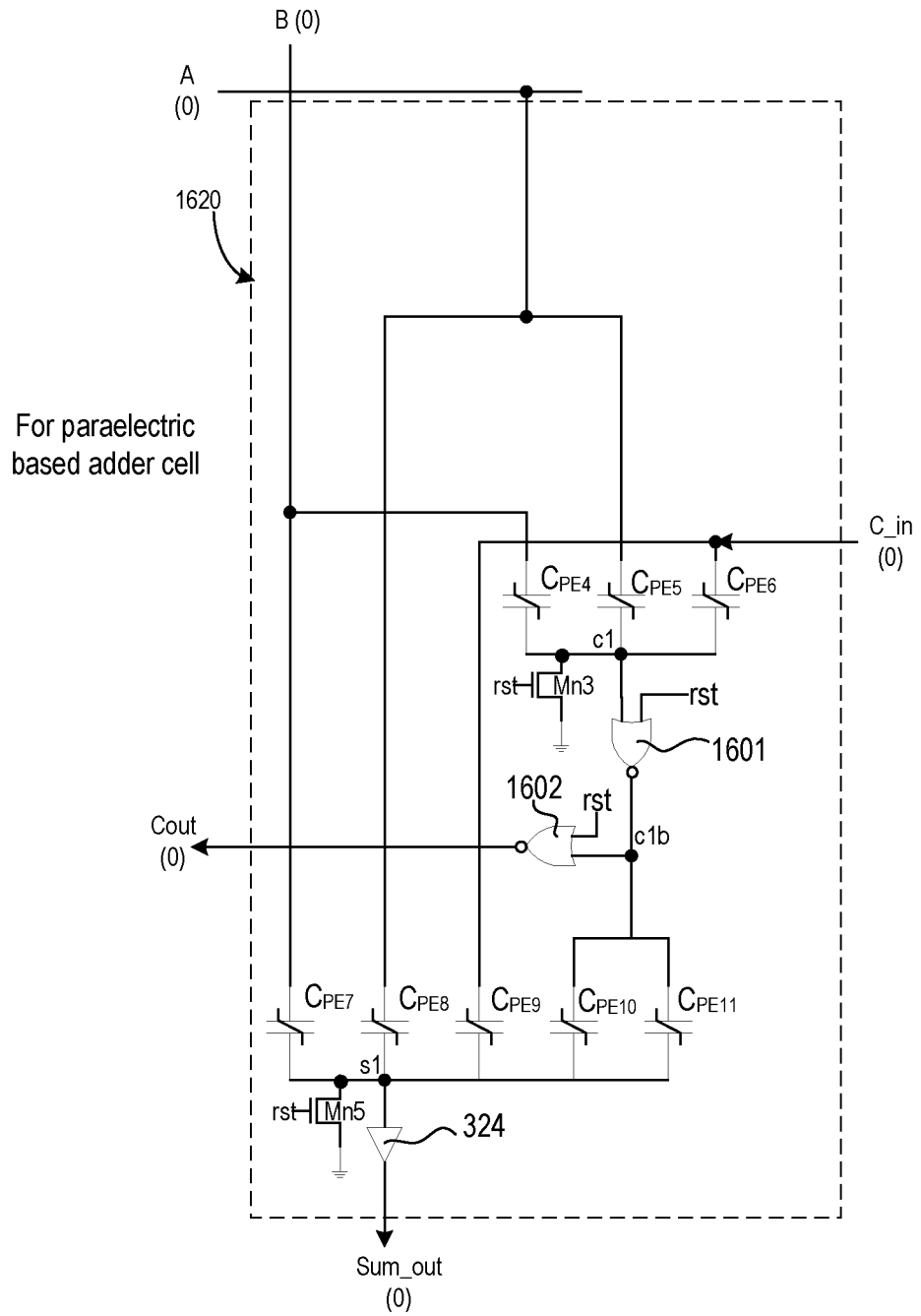
FIG. 16B illustrates a 1-bit full adder using majority or minority gates with paraelectric capacitors, wherein the 1-bit full adder cell includes a NOR gate based reset mechanism, in accordance with some embodiments.

FIG. 16B illustrates 1-bit full adder 1620 using majority or minority gates with paraelectric capacitors, wherein the 1-bit full adder cell includes a NOR gate based reset mechanism, in accordance with some embodiments. 1-bit full adder 1620 is derived from multiplier cell 1600 after AND gate 302, pull-up device Mp1, and pull-down device Mn1 are removed. Inputs X, Y, and Sum_in are repurposed. For example, input Sum_in is removed, input Y is relabeled as 'A' and input B is relabeled as 'B'. During reset phase, rst is asserted, and inputs A, B, and C_in are conditioned as 0, 0, and 0, respectively. Note, A, B, and $C_{in}$ are symmetric and can be swapped with one another. In this example, input terminals of capacitors $C_{PE4}$, $C_{PE5}$, and $C_{PE6}$ are conditioned to 0, 0, and 0, respectively while input terminals of capacitors $C_{PE7}$, $C_{PE8}$, $C_{PE9}$, $C_{PE10}$, and $C_{PE11}$ are conditioned to 0, 0, 0, 0, and 0 respectively. During reset, NOR gate 1601 conditions logic 0 on node c1b, and hence input of paraelectric capacitors $C_{PE10}$ and $C_{PE11}$. Floating node c1 is then pull-down by Mn3 via rst signal, in accordance with various embodiments. In some embodiments, floating node s1 is pulled down by Mn5 via rst at the same time (or substantially the same time) when floating node c1 is being pulled down. In some embodiments, during the reset phase, the outputs $C_{out}$ and Sum_out are forced to logical 0 outputs. For example, NOR gate 1602 forces $C_{out}$ to be 0 during the reset phase. After the reset phase is over, evaluation phase begins. In various embodiments, the evaluation phase begins after one or more cycles (or a 1 or more microseconds) to allow charges on both terminals of the paraelectric capacitors to settle or stabilize.

Figure 17:
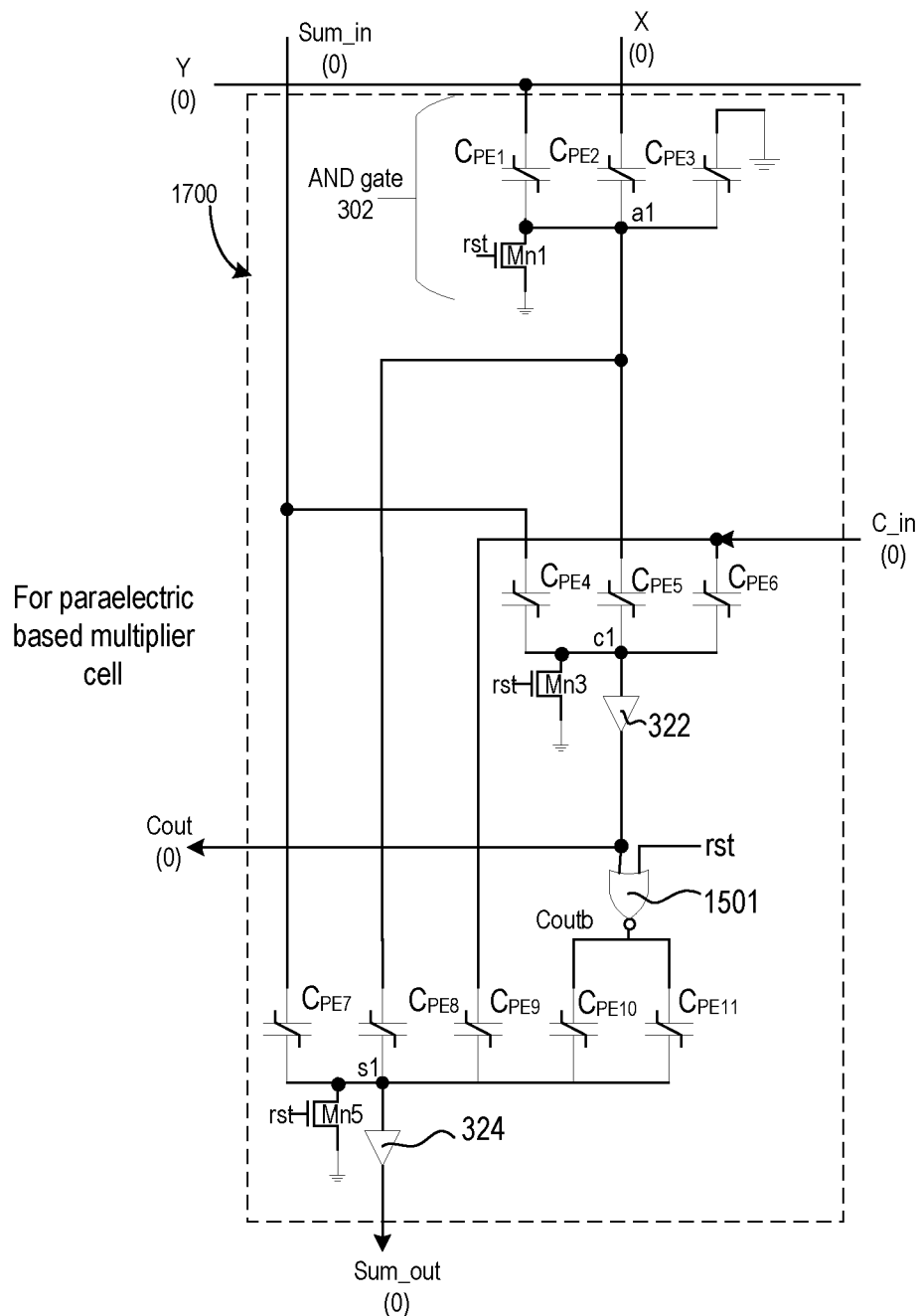
FIG. 17 illustrates a multiplier cell having a 1-bit full adder and an AND gate using majority or minority gates with paraelectric capacitors, wherein the AND gate is directly connected to the 1-bit full adder, wherein the multiplier cell includes a single NOR gate based reset mechanism, in accordance with some embodiments.

FIG. 17 illustrates multiplier cell 1700 having a 1-bit full adder and an AND gate using majority or minority gates with paraelectric capacitors, wherein the AND gate is directly connected to the 1-bit full adder, wherein the multiplier cell includes a single NOR gate based reset mechanism, in accordance with some embodiments. Multiplier cell 1700 is like multiplier cell 1500 but for removing buffer 321. Here, node a1 is directly connected to paraelectric capacitors $C_{PE8}$ and $C_{PE5}$. The implementation of multiplier cell 1700 has 15 transistors, in accordance with some embodiments.

Figure 18:
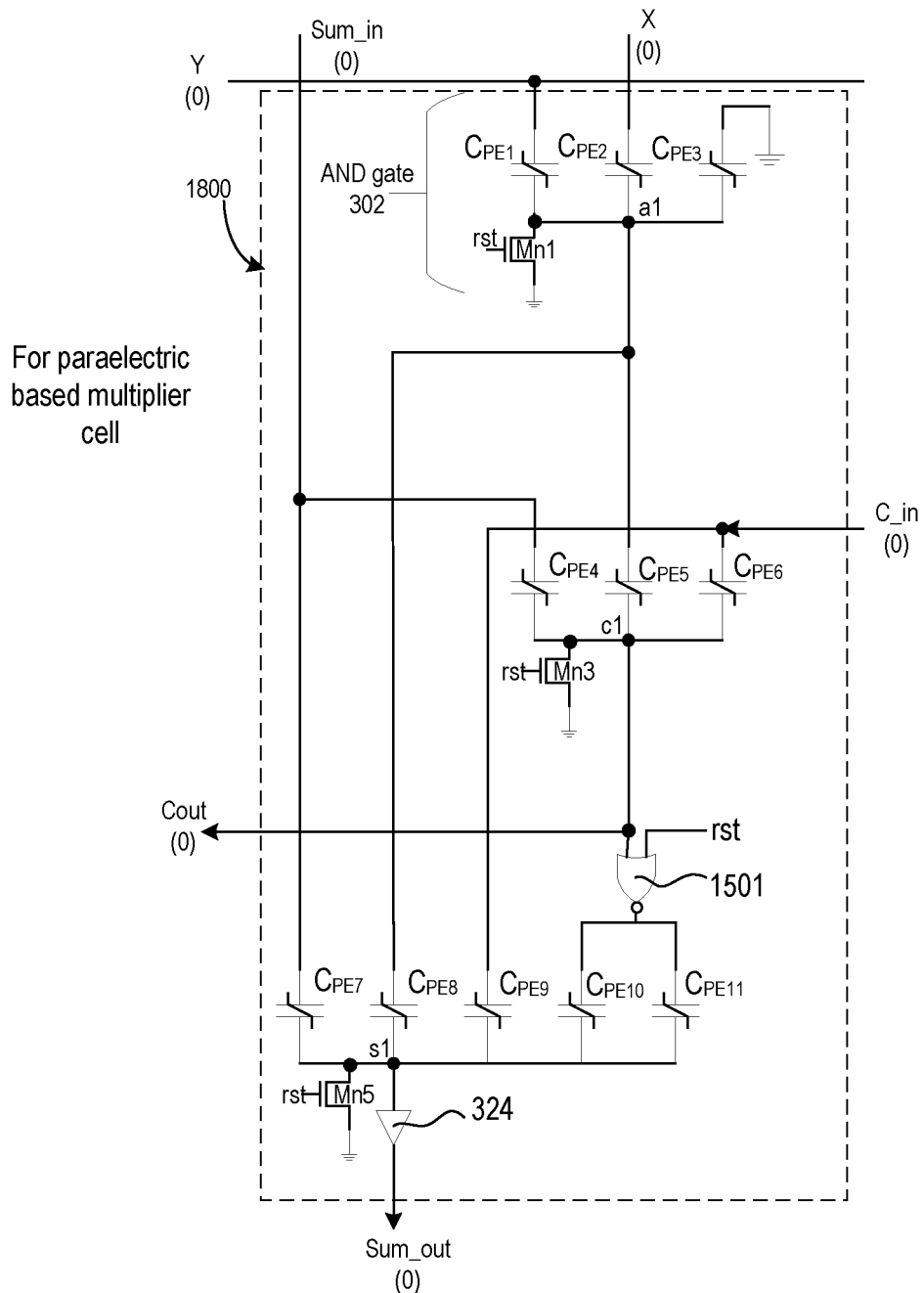
FIG. 18 illustrates a multiplier cell having a 1-bit full adder and an AND gate using majority or minority gates with paraelectric capacitors, wherein the AND gate is directly connected to the 1-bit full adder, wherein the 3-input majority gate is directly connected to the 5-input majority gate, wherein the multiplier cell includes a single NOR gate based reset mechanism, in accordance with some embodiments.

FIG. 18 illustrates multiplier cell 1800 having a 1-bit full adder and an AND gate using majority or minority gates with paraelectric capacitors, wherein the AND gate is directly connected to the 1-bit full adder, wherein the 3-input majority gate is directly connected to the 5-input majority gate, wherein the multiplier cell includes a single NOR gate based reset mechanism, in accordance with some embodiments. Multiplier cell 1800 is like multiplier cell 1500 but for buffers 321 and 322. Here, node a1 is directly connected to paraelectric capacitors $C_{PE8}$ and $C_{PE5}$. In some embodiments, node c1 is directly connected to the input of NOR gate 1501 (e.g., node c1 and $C_{out}$ are shorted). The implementation of multiplier cell 1800 has 11 transistors, in accordance with some embodiments.

Figure 19:
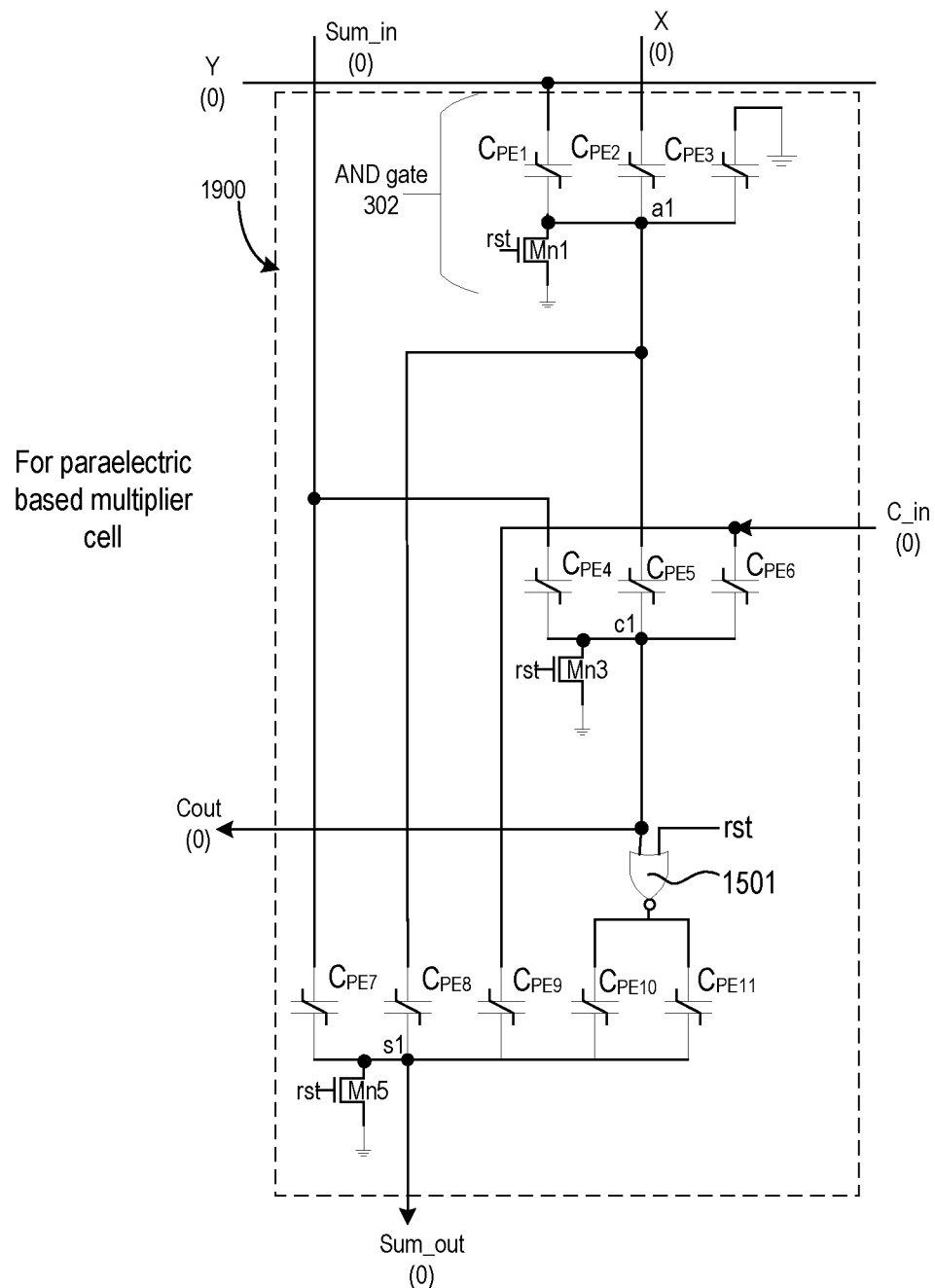
FIG. 19 illustrates a multiplier cell having a 1-bit full adder and an AND gate using majority or minority gates with paraelectric capacitors as showing in FIG. 18, but without output driving buffer, in accordance with some embodiments.

FIG. 19 illustrates multiplier cell 1900 having a 1-bit full adder and an AND gate using majority or minority gates with paraelectric capacitors as showing in FIG. 18, but without output driving buffer, in accordance with some embodiments. Multiplier cell 1900 is like multiplier cell 1500 but for removing buffers 321 and 322, and buffer 324. Here, node a1 is directly connected to paraelectric capacitors $C_{PE8}$ and $C_{PE5}$. In some embodiments, node c1 is directly connected to the input of NOR gate 1501 (e.g., node c1 and $C_{out}$ are shorted). In some embodiments, floating node s1 is directly connected to Sum_out. The implementation of multiplier cell 1900 has 7 transistors, in accordance with some embodiments. In some embodiments, the NOR gate can be replaced with a NAND gate and the pull-down transistors can be replaced with pull-up transistors to reset the floating nodes.

Figure 20:
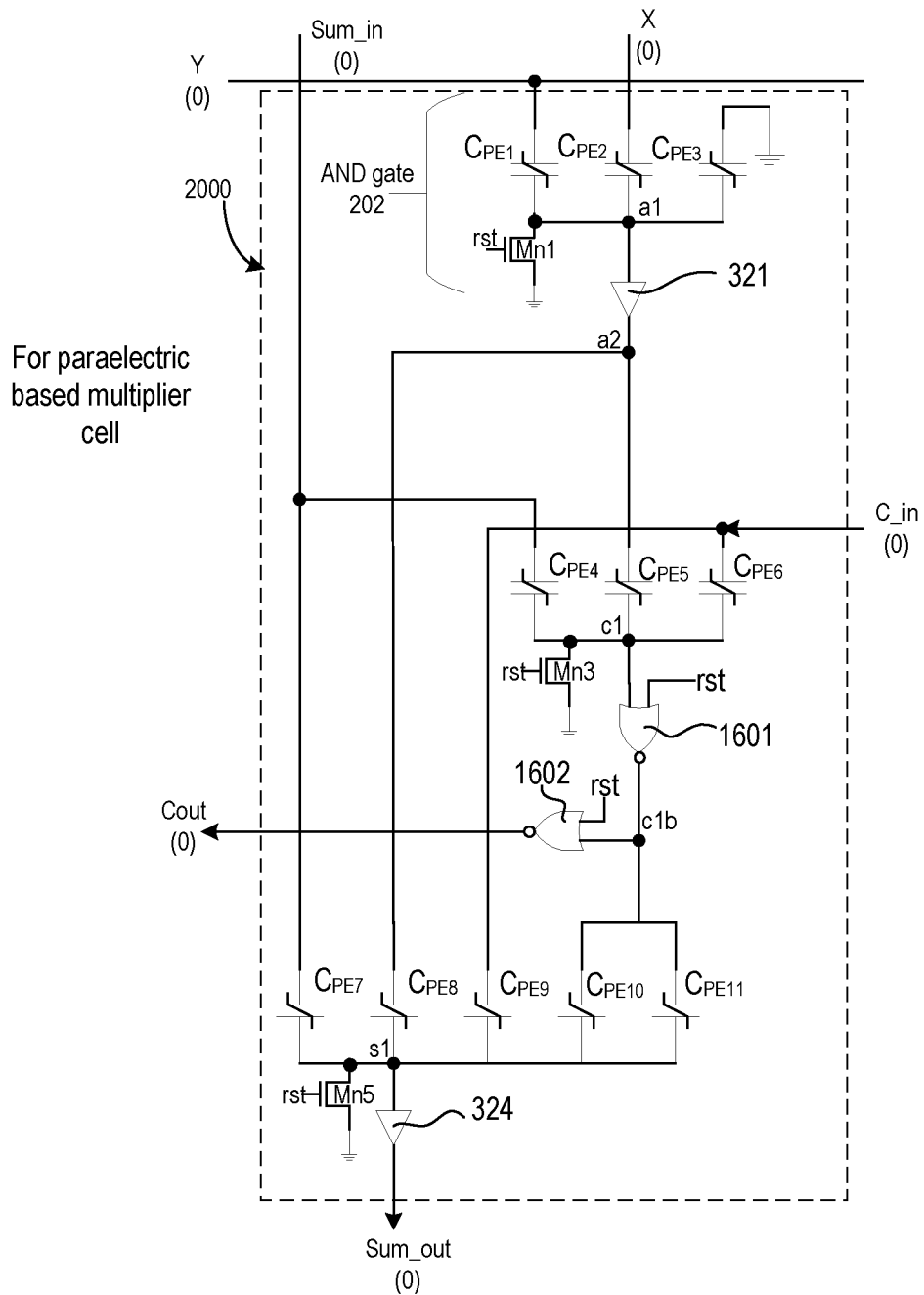
FIG. 20 illustrates a multiplier cell having a 1-bit full adder and an AND gate using majority or minority gates with paraelectric capacitors as showing in FIG. 16A, but with buffer between the AND gate and the 1-bit full adder, in accordance with some embodiments.

FIG. 20 illustrates multiplier cell 2000 having a 1-bit full adder and an AND gate using majority or minority gates with paraelectric capacitors as shown in FIG. 16A, but with buffer between the AND gate and the 1-bit full adder, in accordance with some embodiments. Multiplier cell 2000 is like multiplier cell 1600 but for introducing buffer 321 between nodes a1 and a2.

Figure 21A:
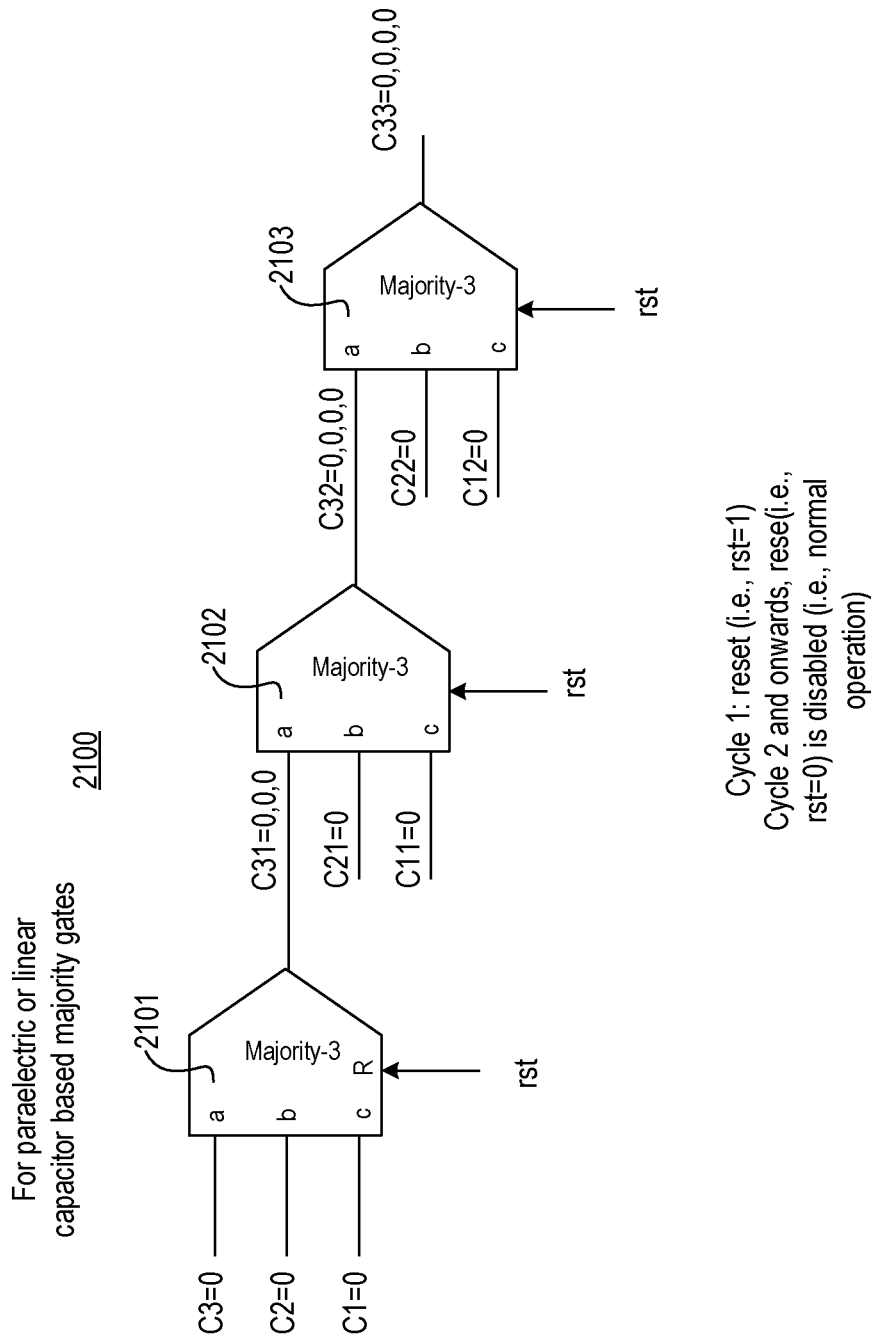
FIG. 21A illustrates a majority-gate chain with paraelectric material and with sequential reset mechanism, in accordance with some embodiments.

FIG. 21A illustrates majority-gate chain 2100 with paraelectric material (or linear dielectric) and with sequential reset mechanism, in accordance with some embodiments. Chain 2100 comprises majority gate 2101 coupled to majority gate 2102, which in turn is coupled to majority gate 2103. The output of majority gate 2101 is coupled to input 'a' of majority gate 2102. The output of majority gate 2102 is coupled to 'a' is coupled to input 'a' of majority gate 2103. In various embodiments, each majority gate receives its respective reset signal. In some embodiments, the reset signal (rst) is the same for all majority gate). While the embodiment here is illustrated with 3-input majority gates, the majority gates can have any number of odd inputs that are set to zero during the reset phase. During the evaluation phase, the inputs are no longer forced for reset purposes.

To reset majority-gate chain 2100, inputs a, b, and c of majority gates 2101, 2102, and 2013 are conditioned to C3=0, C2=0, and C1=0; C21=0, C11=0; and C22=0 and C12=0 logical states, respectively. Thereafter, at cycle 1, pull-down device Mn1 is turned on via reset signal (i.e., rst=1). At cycle 2, reset is disabled and majority gates 2101, 2102, and 2103 are allowed to operate in normal mode. As such, chain 2100 is reset. In some embodiments, evaluation may happen after 1, 2, or more microseconds or cycles of the completion of the reset phase.

Figure 21B:
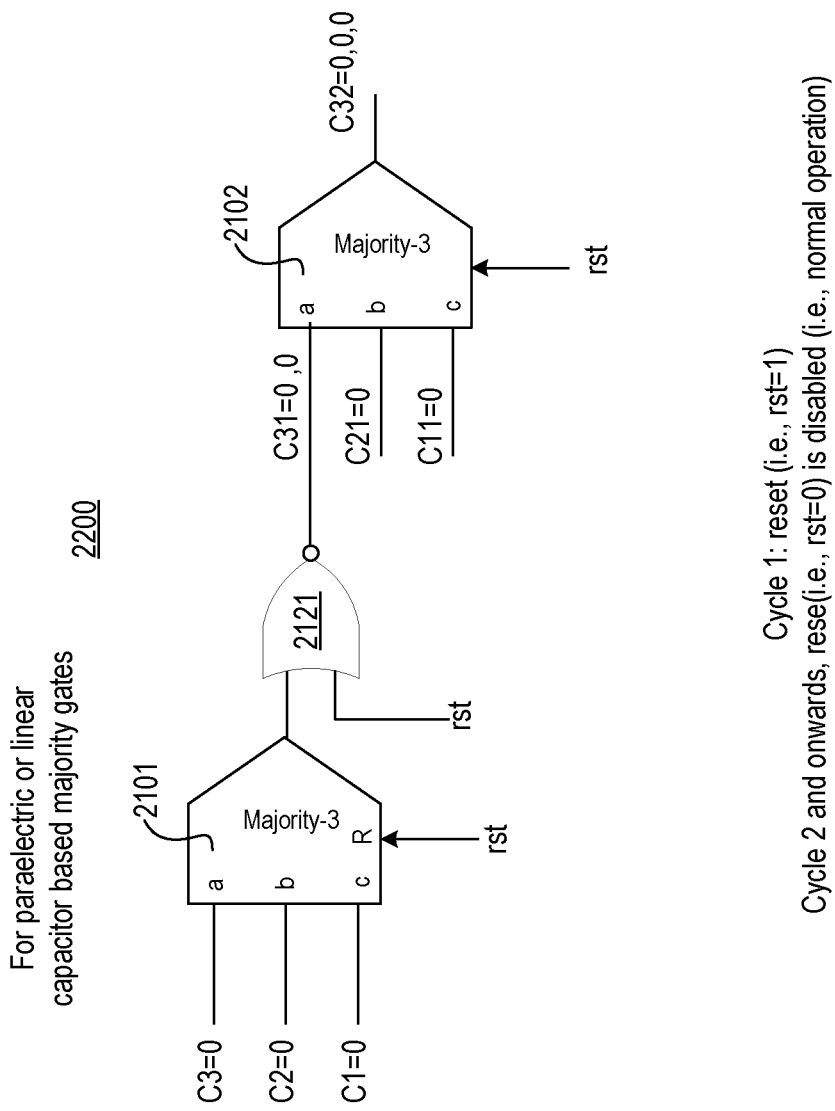
FIG. 21B illustrates a majority-gate chain with paraelectric material and with sequential reset mechanism, majority-gate chain includes a NOR gate between the majority gates, in accordance with some embodiments.

FIG. 21B illustrates majority-gate chain 2120 with paraelectric material and with sequential reset mechanism, majority-gate chain includes a NOR gate between the majority gates, in accordance with some embodiments. Compared to chain 2100, here NOR gate 2221 is coupled to the output of majority gate 2101 and the input 'a' of majority gate 2102. NOR gate 2201 is controlled by reset signal rst. During the reset phase, the pull-down transistors of majority gates 2101 and 2102 are turned on via the reset signa rst and inputs 'a', 'b', and 'c' of the majority gates are conditioned to logic 0. While chain 2120 shows two majority gates, any number of majority gates can be coupled in a chain. Likewise, the majority gates can have any number of inputs. In some embodiments, NOR gate 2201 can be replaced with a NAND gate. In one such embodiments, the pull-down transistor(s) on the floating nodes can be replaced with pull-up transistor(s).

Figure 22:
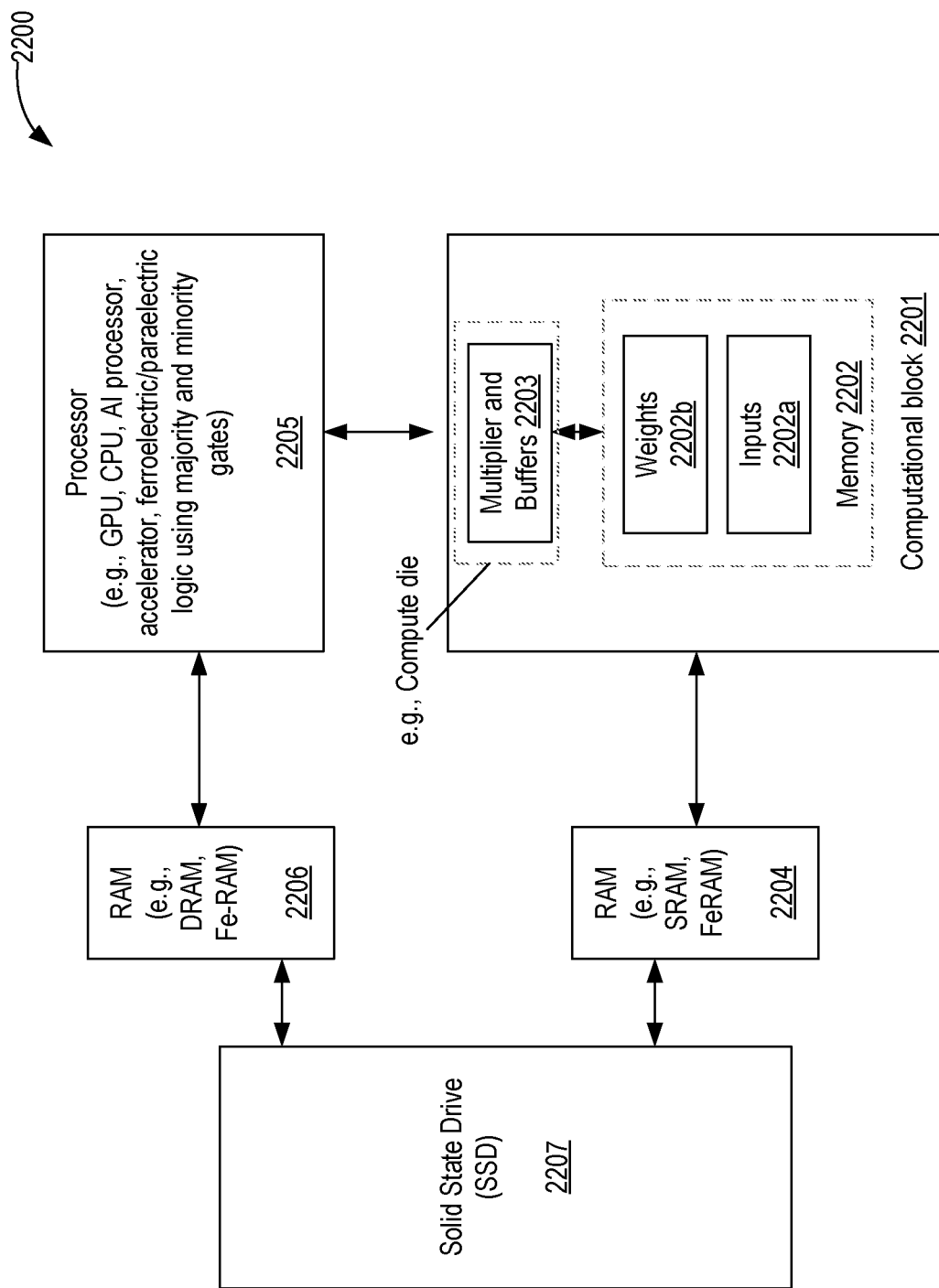
FIG. 22 illustrates a high-level architecture of an artificial intelligence (AI) machine comprising a compute die stacked with a memory die, wherein the compute die includes one or more multipliers or adders with their respective reset mechanisms, in accordance with some embodiments.

FIG. 22 illustrates a high-level architecture of an artificial intelligence (AI) machine comprising a compute die stacked with a memory die, wherein the compute die includes one or more multipliers and/or adders with their respective reset mechanisms, in accordance with some embodiments. AI machine 2200 comprises computational block 2201 or processor having random-access memory (RAM) 2202 and computational logic 2203; first random-access memory 2204 (e.g., static RAM (SRAM), ferroelectric or paraelectric RAM (FeRAM), ferroelectric or paraelectric static random-access memory (FeSRAM)), main processor 2205, second random-access memory 2206 (dynamic RAM (DRAM), FeRAM), and solid-state memory or drive (SSD) 2207. In some embodiments, some or all components of AI machine 2200 are packaged in a single package forming a system-on-chip (SoC). The SoC can be configured as a logic-on-logic configuration, which can be in a 3D configuration or a 2.5D configuration.

In some embodiments, computational block 2201 is packaged in a single package and then coupled to processor 2205 and memories 2204, 2206, and 2207 on a printed circuit board (PCB). In some embodiments, computational block 2201 is configured as a logic-on-logic configuration, which can be in a 3D configuration or a 2.5D configuration. In some embodiments, computational block 2201 comprises a special purpose compute die 2203 or microprocessor. For example, compute die 2203 is a compute chiplet that performs a function of an accelerator or inference. In some embodiments, memory 2202 is DRAM which forms a special memory/cache for the special purpose compute die 2203. The DRAM can be embedded DRAM (eDRAM) such as 1T-1C (one transistor and one capacitor) based memories. In some embodiments, RAM 2202 is ferroelectric or paraelectric RAM (Fe-RAM).

In some embodiments, compute die 2203 is specialized for applications such as Artificial Intelligence, graph processing, and algorithms for data processing. In some embodiments, compute die 2203 further has logic computational blocks, for example, for multipliers and buffers, a special data memory block (e.g., buffers) comprising DRAM, FeRAM, or a combination of them. In some embodiments, RAM 2202 has weights and inputs stored in-order to improve the computational efficiency. The interconnects between processor 2205 (also referred to as special purpose processor), first RAM 2204 and compute die 2203 are optimized for high bandwidth and low latency. The architecture of FIG. 22 allows efficient packaging to lower the energy, power, or cost and provides for ultra-high bandwidth between RAM 2202 and compute chiplet 2203 of computational block 2201.

In some embodiments, RAM 2202 is partitioned to store input data (or data to be processed) 2202a and weight factors 2202b. In some embodiments, input data 2202a is stored in a separate memory (e.g., a separate memory die) and weight factors 2202b are stored in a separate memory (e.g., separate memory die).

In some embodiments, computational logic or compute chiplet 2203 comprises matrix multiplier, adder, concatenation logic, buffers, and combinational logic. In various embodiments, compute chiplet 2203 performs multiplication operation on inputs 2202a and weights 2202b. In some embodiments, weights 2202b are fixed weights. For example, processor 2205 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2202. In various embodiments, the input data, that is to be analyzed using a trained model, is processed by computational block 2201 with computed weights 2202b to generate an output (e.g., a classification result).

In some embodiments, first RAM 2204 is ferroelectric or paraelectric based SRAM. For example, a six transistor (6T) SRAM bit-cells having ferroelectric or paraelectric transistors are used to implement a non-volatile FeSRAM. In some embodiments, SSD 2207 comprises NAND flash cells. In some embodiments, SSD 2207 comprises NOR flash cells. In some embodiments, SSD 2207 comprises multi-threshold NAND flash cells.

In various embodiments, the non-volatility of FeRAM is used to introduce new features such as security, functional safety, and faster reboot time of AI machine 2200. The non-volatile FeRAM is a low power RAM that provides fast access to data and weights. FeRAM 2204 can also serve as a fast storage for computational block 2201 (which can be an inference die or an accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type AA'BB' $O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, or Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: (La,Sr)CoO3, SrRuO3, (La,Sr)MnO3, YBa2Cu3O7, Bi2Sr2CaCu2O8, LaNiO3, etc. may be used for FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rate earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type AA'BB'$O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $O_5O_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, the FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, the FE material includes a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, the FE material includes Hafnium oxides of the form, Hf1-x Ex Oy where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Figure 23:
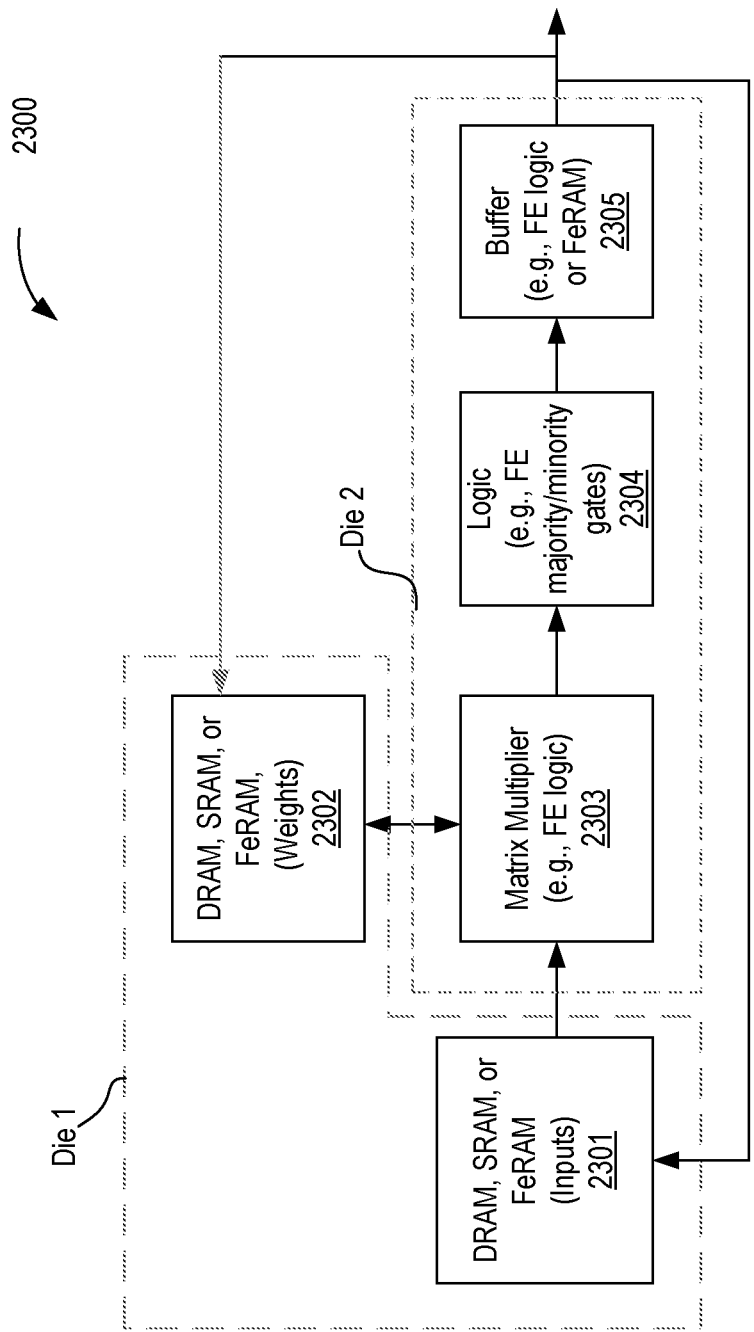
FIG. 23 illustrates an architecture of a computational block comprising a compute die stacked with a memory die, wherein the compute die includes one or more multipliers or adders with their respective reset mechanisms, in accordance with some embodiments.

FIG. 23 illustrates an architecture of computational block 2300 comprising a compute die stacked with a memory die, wherein the compute die includes one or more multipliers and/or adders with their respective reset mechanisms, in accordance with some embodiments. Any of the blocks here can include the adder of various embodiments. The architecture of FIG. 23 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 2301 to store input data and a second die 2302 to store weight factors. In some embodiments, the memory die is a single die that is partitioned such that first partition 2301 of the memory die is used to store input data and second partition 2302 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 2301 and 2302, or memory dies 2301 and 2302 include one or more of: DRAM, FE-SRAM, FE-DRAM, SRAM, and/or MRAM. In some embodiments, the input data stored in memory partition or die 2301 is the data to be analyzed by a trained model with fixed weights stored in memory partition or die 2302.

In some embodiments, the compute die comprises ferroelectric or paraelectric logic (e.g., majority, minority, and/or threshold gates) to implement matrix multiplier 2303, logic 2304, and temporary buffer 2305. Matrix multiplier 2303 performs multiplication operation on input data 'X' and weights 'W' to generate an output 'Y'. This output may be further processed by logic 2304. In some embodiments, logic 2304 performs a threshold operation, pooling and drop out operations, and/or concatenation operations to complete the AI logic primitive functions.

In some embodiments, the output of logic 2304 (e.g., processed output 'Y') is temporarily stored in buffer 2305. In some embodiments, buffer 2305 is memory such as one or more of: DRAM, Fe-SRAM, Fe-DRAM, MRAM, resistive RAM (Re-RAM) and/or SRAM. In some embodiments, buffer 2305 is part of the memory die (e.g., Die 1). In some embodiments, buffer 2305 performs the function of a re-timer. In some embodiments, the output of buffer 2305 (e.g., processed output 'Y') is used to modify the weights in memory partition or die 2302. In one such embodiment, computational block 2300 not only operates as an inference circuitry, but also as a training circuitry to train a model. In some embodiments, matrix multiplier 2303 includes an array of multiplier cells, wherein the DRAMs 2301 and 2302 include arrays of memory bit-cells, respectively, wherein each multiplier cell is coupled to a corresponding memory bit-cell of DRAM 2301 and/or DRAM 2302. In some embodiments, computational block 2300 comprises an interconnect fabric coupled to the array of multiplier cells such that each multiplier cell is coupled to the interconnect fabric.

Architecture 2300 provides reduced memory accesses for the compute die (e.g., die 2) by providing data locality for weights, inputs, and outputs. In one example, data from and to the AI computational blocks (e.g., matrix multiplier 2303) is locally processed within a same packaging unit. Architecture 2300 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 24:
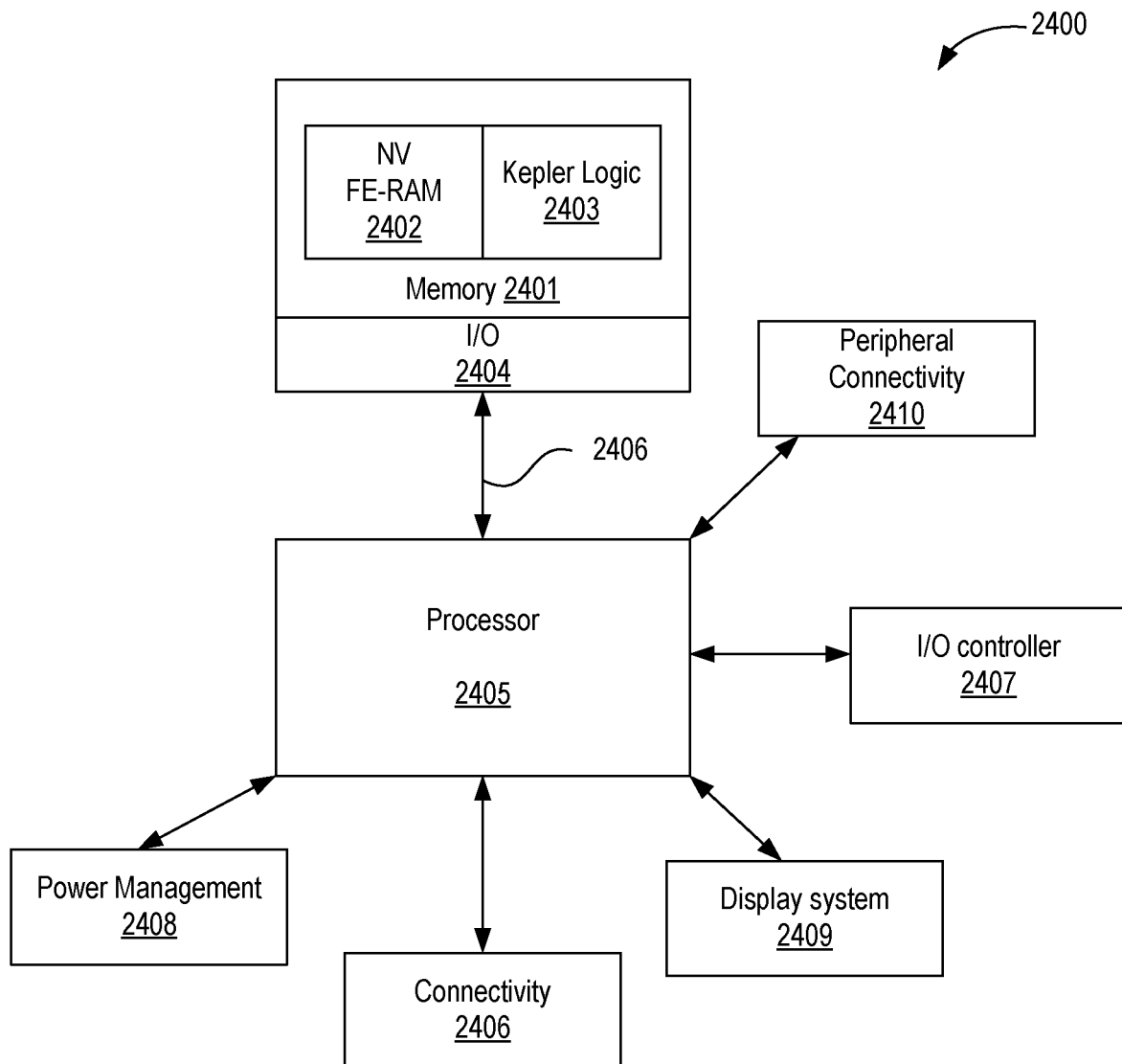
FIG. 24 illustrates a system-on-chip (SOC) that uses ferroelectric or paraelectric based multipliers or adders with their respective reset mechanisms, in accordance with some embodiments.

FIG. 24 illustrates a system-on-chip (SoC) 2400 that uses ferroelectric or paraelectric based multipliers and/or adders with their respective reset mechanisms, in accordance with some embodiments. Any of the blocks here can include the adder of various embodiments. SoC 2400 comprises memory 2401 having static random-access memory (SRAM) or FE based random-access memory FE-RAM, or any other suitable memory. The memory can be non-volatile (NV) or volatile memory. Memory 2401 may also comprise logic 2403 to control memory 2402. For example, write and read drivers are part of logic 2403. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 2404. The interface may be double-data rate (DDR) compliant interface or any other suitable interface to communicate with a processor. Processor 2405 of SoC 2400 can be a single core or multiple core processor. Processor 2405 can be a general-purpose processor (CPU), a digital signal processor (DSP), or an Application Specific Integrated Circuit (ASIC) processor. In some embodiments, processor 2405 is an artificial intelligence (AI) processor (e.g., a dedicated AI processor, a graphics processor configured as an AI processor). In various embodiments, processor 2405 executes instructions that are stored in memory 2401.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 2405 may be coupled to a number of other chip-lets that can be on the same die as SoC 2400 or on separate dies. These chip-lets include connectivity circuitry 2406, I/O controller 2407, power management 2408, and display system 2409, and peripheral connectivity 2406.

Connectivity 2406 represents hardware devices and software components for communicating with other devices. Connectivity 2406 may support various connectivity circuitries and standards. For example, connectivity 2406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 2406 may support non-cellular standards such as WiFi.

I/O controller 2407 represents hardware devices and software components related to interaction with a user. I/O controller 2407 is operable to manage hardware that is part of an audio subsystem and/or display subsystem. For example, input through a microphone or other audio device can provide input or commands for one or more applications or functions of SoC 2400. In some embodiments, I/O controller 2407 illustrates a connection point for additional devices that connect to SoC 2400 through which a user might interact with the system. For example, devices that can be attached to the SoC 2400 might include microphone devices, speaker or stereo systems, video systems or other display devices, keyboard or keypad devices, or other I/O devices for use with specific applications such as card readers or other devices.

Power management 2408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2408 may accordingly put such logic into low power state without the worry of losing data. Power management may select a power state according to Advanced Configuration and Power Interface (ACPI) specification for one or all components of SoC 2400.

Display system 2409 represents hardware (e.g., display devices) and software (e.g., drivers) components that provide a visual and/or tactile display for a user to interact with the processor 2405. In some embodiments, display system 2409 includes a touch screen (or touch pad) device that provides both output and input to a user. Display system 2409 may include a display interface, which includes the particular screen or hardware device used to provide a display to a user. In some embodiments, the display interface includes logic separate from processor 2405 to perform at least some processing related to the display.

Peripheral connectivity 2410 may represent hardware devices and/or software devices for connecting to peripheral devices such as printers, chargers, cameras, etc. In some embodiments, peripheral connectivity 2410 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 2400 includes a coherent cache or memory-side buffer chiplet (not shown) which include ferroelectric or paraelectric memory. The coherent cache or memory-side buffer chiplet can be coupled to processor 2405 and/or memory 2401 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a 1-bit full adder comprising a majority gate or a minority gate, wherein the 1-bit full adder comprises non-linear polar material; and a reset mechanism to reset nodes coupled to the non-linear polar material during a reset phase separate from an evaluation phase.

Example 2: The apparatus of example 1, wherein the 1-bit full adder comprises pull-up devices and pull-down devices connected to the non-linear polar material, wherein the pull-up devices and the pull-down devices are controlled by the reset mechanism during the reset phase.

Example 3: The apparatus of example 2, wherein the reset mechanism comprises one or more transmission gates to condition one or more inputs of the 1-bit full adder, wherein the one or more inputs are coupled the non-linear polar material, wherein the one or more transmission gates are controllable by a reset signal.

Example 4: The apparatus of example 1, comprising an AND gate coupled to the 1-bit full adder, wherein the AND gate includes a majority gate or a minority gate having non-linear polar material.

Example 5: The apparatus of example 4, wherein the nodes include a first node, wherein the reset mechanism comprises: a first pull-down device coupled to the AND gate such that the first pull-down device is connected to the first node which connects to the non-linear polar material, wherein the first pull-down device is controllable by a first control; and a first pull-up device coupled to the AND gate such that the first pull-up device is connected to the first node connecting the non-linear polar material, wherein the first pull-up device is controllable by a second control.

Example 6: The apparatus of example 5, wherein the reset mechanism includes: a first transmission gate which is controllable by a third control and a fourth control, wherein the first transmission gate is coupled to an output of the AND gate and an input of a 5-input majority gate of the 1-bit full adder; and a second pull-down device which is controllable by the third control, wherein the second pull-down device is coupled to the first transmission gate and the input of the 5-input majority gate of the 1-bit full adder.

Example 7: The apparatus of example 6, wherein the reset mechanism includes: a second transmission gate which is controllable by the third control and the fourth control, wherein the second transmission gate is coupled to the output of the AND gate and an input of a 3-input majority gate of the 1-bit full adder; and a second pull-up device which is controllable by the third control, wherein the second pull-up device is coupled to the second transmission gate and the input of a 3-input majority gate of the 1-bit full adder.

Example 8: The apparatus of example 7, wherein the reset mechanism includes: a third transmission gate which is controllable by the third control and the fourth control, wherein the third transmission gate is coupled to the output of the 3-input majority gate of the 1-bit full adder and a carry output; and a second pull-down device which is controllable by the third control, wherein the second pull-down device is coupled to the third transmission gate and carry output.

Example 9: The apparatus of example 8, wherein the nodes include a second node, wherein the apparatus comprises: a fourth pull-down device coupled to the second node, wherein the second node is coupled to the non-linear polar material of a 3-input majority gate of the 1-bit full adder, wherein the fourth pull-down device is controllable by a fifth control; and a third pull-up device coupled to the second node, wherein the second node is coupled to the non-linear polar material of the 3-input majority gate of the 1-bit full adder, wherein the third pull-up device is controllable by a sixth control.

Example 10: The apparatus of example 9, wherein the nodes include a third node, wherein the apparatus comprises: a fifth pull-down device coupled to the third node, wherein the third node is coupled to the non-linear polar material of the 5-input majority gate of the 1-bit full adder, wherein the fifth pull-down device is controllable by a seventh control; and a fourth pull-up device coupled to the third node, wherein the third node is coupled to the non-linear polar material of the 5-input majority gate of the 1-bit full adder, wherein the fourth pull-up device is controllable by an eighth control.

Example 11: The apparatus of example 10, comprises a buffer coupled to the third node, wherein the reset mechanism includes: a fourth transmission gate controllable by the third control and the fourth control, wherein the fourth transmission gate is coupled to an output of the buffer and a sum output; and a sixth pull-down device controllable by the third control, wherein the sixth pull-down device is coupled to the fourth transmission gate and sum output.

Example 12: The apparatus of example 4, wherein the reset nodes include a first node, wherein the AND gate is to receive a multiplier and a multiplicand, wherein the AND gate comprises: a first capacitor to receive the multiplier, the first capacitor coupled to the first node; a second capacitor to receive the multiplicand, the second capacitor coupled to the first node; a third capacitor coupled to a ground node, wherein the third capacitor is coupled to the first node, wherein the first capacitor, the second capacitor, and the third capacitor include non-linear polar material; and a driver circuitry having a capacitive input coupled to the first node, and an output which is to provide a majority logic function of the multiplier, the multiplicand, and a voltage on the ground node.

Example 13: The apparatus of example 1, comprising an AND gate coupled to the 1-bit full adder, wherein the AND gate includes a CMOS AND gate.

Example 14: The apparatus of example 1, wherein the non-linear polar material includes ferroelectric material, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: BaTiO3, PbTiO3, KNbO3, or NaTaO3; a hexagonal ferroelectric which includes one of: YMnO3, or LuFeO3; a hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hfl -x Ex Ox where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100.

Example 15: An apparatus comprising: an AND gate comprising a majority gate or a minority gate having non-linear polar material, wherein the AND gate is to receive a multiplier and a multiplicand; a 1-bit full adder comprising a majority gate or a minority gate coupled to the AND gate, wherein the 1-bit full adder comprises non-linear polar material, wherein the 1-bit full adder is to receive a sum input and a carry input; and a reset mechanism to reset nodes coupled to the non-linear polar material, wherein the reset mechanism is to apply a predetermined input to the multiplier, the multiplicand, the sum input, and the carry input during a reset phase, and to sequentially pull-up and pull-down the nodes during the reset phase, and to allow the nodes to float during an evaluation phase.

Example 16: The apparatus of example 15, wherein the reset mechanism includes: a first transmission gate at an output of the AND gate; a second transmission gate at an output of a 3-input majority gate of the 1-bit full adder; and a third transmission gate at an output of a 5-input majority gate of the 1-bit full adder.

Example 17: A system comprising: a processor circuitry to execute one or more instructions; a communication interface communicatively coupled to the processor circuitry; and a memory coupled to the processor circuitry, wherein the processor circuitry comprises a multiplier circuitry which includes: a majority gate or a minority gate having non-linear polar material, wherein the majority gate or the minority gate is coupled to a transmission gate; and a reset mechanism to reset a set of nodes coupled to the non-linear polar material during a reset phase separate from an evaluation phase, wherein a node from the set of nodes is coupled to the transmission gate, wherein the transmission gate is controllable by the reset mechanism.

Example 18: The system of example 17, wherein the set of nodes includes a first node, wherein the reset mechanism comprises: a pull-down device coupled to the majority gate or the minority gate such that the pull-down device is connected to the first node which connects to the non-linear polar material, wherein the pull-down device is controllable by a first control; and a pull-up device coupled to the majority gate or the minority gate such that the pull-up device is connected to the first node connecting the non-linear polar material, wherein the pull-up device is controllable by a second control.

Example 19: The system of example 18, wherein the reset mechanism is to condition inputs to the majority gate or the minority gate, and to sequentially pull-up and pull-down the pull-up device and the pull-down device, respectively, during the reset phase.

Example 20: The system of example 18, wherein the reset mechanism is to sequence a pull-up event and a pull-down event according to logic condition of inputs to the majority gate or the minority gate.

Example 1a: An apparatus comprising: a 1-bit full adder comprising a majority gate or a minority gate, wherein the 1-bit full adder comprises non-linear polar material; and a reset mechanism comprising logic to condition first terminals of capacitors of the 1-bit full adder, the capacitors comprising the non-linear polar material, wherein the reset mechanism is to reset second terminals of the capacitors during a reset phase separate from an evaluation phase, wherein the logic comprises one or more NAND gate and NOR gates.

Example 2a: The apparatus of example 1a comprising: an AND gate which includes a majority gate or a minority gate having non-linear polar material, wherein the AND gate is coupled to the 1-bit full adder.

Example 3a: The apparatus of example 2a, wherein the logic comprises: an inverter which is coupled to the AND gate; and a NAND gate coupled to an output of the inverter, wherein an output of the NAND gate is coupled a 3-input majority gate of the 1-bit full adder, wherein the NAND gate is to receive a first reset to condition the output of the NAND gate during the reset phase.

Example 4a: The apparatus of example 3a, wherein the inverter is a first inverter, wherein the logic comprises: a first NOR gate coupled to an output of the inverter, wherein the first NOR gate receives a second reset, wherein the second reset is inverse of the first reset, wherein an output of the first NOR gate is coupled to a 5-input majority gate of the 1-bit full adder, wherein the second reset is to condition the output of the first NOR gate during the reset phase; a second inverter which is coupled to the 3-input majority gate; and a second NOR gate coupled to an output of the second inverter, wherein the second NOR gate is controllable by the second reset, wherein an output of the second NOR gate is a carry output, wherein the second reset is to condition the output of the second NOR gate during the reset phase.

Example 5a: The apparatus of example 4a comprises a third inverter coupled to the output of the second NOR gate, wherein an output of the third inverter is coupled to the 5-input majority gate.

Example 6a: The apparatus of example 5a, wherein the logic comprises: a fourth inverter coupled to the 5-input majority gate; and a third NOR gate coupled to an output of the fourth inverter, wherein the third NOR gate is controllable by the second reset, wherein the second reset is to condition the output of the third NOR gate during the reset phase, wherein the output of the third NOR gate is a sum output.

Example 7a: The apparatus of example 6a, wherein the reset mechanism comprises: a first pull-up device coupled to the AND gate such that the first pull-up device is connected to the second terminals of a first set of capacitors of the AND gate, wherein the first pull-up device is controllable by a first control; and a first pull-down device controllable by a second control, wherein the first pull-down device is coupled to the second terminals of the first set of capacitors of the AND gate.

Example 8a: The apparatus of example 7a, wherein the reset mechanism includes: a second pull-up device which is controllable by a third control, wherein the second pull-up device is coupled to the second terminals of a second set of capacitors of the 1-bit full adder; and a second pull-down device which is controllable by a fourth control, wherein the second pull-down device is coupled to the second terminals of the second set of capacitors of the 1-bit full adder.

Example 9a: The apparatus of example 8a, wherein the apparatus comprises: a third pull-up device which is controllable by a fifth control, wherein the third pull-up device is coupled to the second terminals of a third set of capacitors of the 1-bit full adder; and a second pull-down device which is controllable by a sixth control, wherein the second pull-down device is coupled the second terminals of the third set of capacitors of the 1-bit full adder.

Example 10a: The apparatus of example 1a, wherein the non-linear polar material includes ferroelectric material.

Example 11a: An apparatus comprising: an AND gate comprising a majority gate or a minority gate having non-linear polar material, wherein the AND gate is to receive a multiplier and a multiplicand; a 1-bit full adder comprising a majority gate or a minority gate coupled to the AND gate, wherein the 1-bit full adder comprises non-linear polar material, wherein the 1-bit full adder is to receive a sum input and a carry input; and a reset mechanism comprising logic to condition first terminals of capacitors of the AND gate and the 1-bit full adder, the capacitors comprising the non-linear polar material, wherein the reset mechanism is to reset second terminals of the capacitors during a reset phase separate from an evaluation phase, wherein the reset mechanism is to apply a predetermined input to the multiplier, the multiplicand, the sum input, and the carry input during the reset phase.

Example 12a: The apparatus of example 11a, wherein the reset mechanism is to sequentially pull-up and pull-down the second terminals during the reset phase, and to allow the second terminals to float during the evaluation phase.

Example 13a: The apparatus of example 11a, wherein the logic includes at least one NOR gate and a NAND gate to condition the first terminals of the capacitors.

Example 14a: The apparatus of example 11a, wherein the non-linear polar material comprises ferroelectric material.

Example 15a: The apparatus of example 11a, wherein the reset mechanism is to reset the second terminals of the capacitors substantially simultaneously.

Example 16a: A system comprising: a processor circuitry to execute one or more instructions; a communication interface communicatively coupled to the processor circuitry; and a memory coupled to the processor circuitry, wherein the processor circuitry comprises a multiplier circuitry which includes: a majority gate or a minority gate having non-linear polar material, wherein the majority gate or the minority gate is coupled to a NOR gate or a NAND gate; and a reset mechanism to a reset a set of nodes coupled to the non-linear polar material during a reset phase separate from an evaluation phase, wherein a node from the set of nodes is coupled to the NOR gate or the NAND gate, wherein the NOR gate or the NAND gate is controllable by the reset mechanism.

Example 17a: The system of example 16a, wherein the set of nodes includes a first node, wherein the reset mechanism comprises: a pull-down device coupled to the majority gate or the minority gate such that the pull-down device is connected to the first node which connects to the non-linear polar material, wherein the pull-down device is controllable by a first control; and a pull-up device coupled to the majority gate or the minority gate such that the pull-up device is connected to the first node connecting the non-linear polar material, wherein the pull-up device is controllable by a second control.

Example 18a: The system of example 17a, wherein the reset mechanism is to condition inputs to the majority gate or the minority gate, and to sequentially pull-up and pull-down the pull-up device and the pull-down device, respectively, during the reset phase.

Example 19a: The system of example 17a, wherein the reset mechanism is to sequence a pull-up event and a pull-down event according to logic condition of inputs to the majority gate or the minority gate.

Example 20a: The system of example 17a, wherein the non-linear polar material includes one of a ferroelectric material or paraelectric material.

Example 1b: An apparatus comprising: a CMOS based AND gate; a 1-bit full adder comprising a majority gate or a minority gate coupled to an output of the CMOS based AND gate, wherein the 1-bit full adder comprises non-linear polar material; and a reset mechanism comprising logic to condition first terminals of capacitors of the 1-bit full adder, the capacitors comprising the non-linear polar material, wherein the reset mechanism is to reset second terminals of the capacitors during a reset phase separate from an evaluation phase.

Example 2b: The apparatus of example 1b comprises: a first inverter which is coupled to a 3-input majority gate of the 1-bit full adder; and a first NOR gate coupled to an output of the first inverter, wherein the first NOR gate is controllable by a first reset, wherein an output of the first NOR gate is a carry output, wherein the first reset is to condition the output of the first NOR gate during the reset phase.

Example 3b: The apparatus of example 2b comprises a second inverter coupled to the output of the first NOR gate, wherein an output of the second inverter is coupled to a 5-input majority gate of the 1-bit full adder.

Example 4b: The apparatus of example 3b comprises: a third inverter coupled to the 5-input majority gate; and a second NOR gate coupled to an output of the third inverter, wherein the second NOR gate is controllable by the first reset, wherein the first reset is to condition the output of the second NOR gate during the reset phase, wherein the output of the second NOR gate is a sum output.

Example 5b: The apparatus of example 3b, wherein the reset mechanism comprises: a first pull-down device which is coupled to the 3-input majority gate such that the first pull-down device is connected to the second terminals of a first set of capacitors of the 3-input majority gate, wherein the first pull-down device is controllable by a first control; and a first pull-up device which is coupled to the 3-input majority gate such that the first pull-down device is connected to the second terminals of the first set of capacitors of the 3-input majority gate, wherein the first pull-down device is controllable by a second control.

Example 6b: The apparatus of example 5b, wherein the reset mechanism includes: a second pull-down device which is controllable by a third control, wherein the second pull-down device is coupled to the 5-input majority gate such that the second pull-down device is connected to the second terminals of a second set of capacitors of the 5-input majority gate; and a second pull-up device which is controllable by a fourth control, wherein the second pull-up device is coupled to the 5-input majority gate such that the second pull-up device is connected to the second terminals of the second set of capacitors of the 5-input majority gate.

Example 7b: The apparatus of example 1b, wherein the non-linear polar material includes ferroelectric material.

Example 8b: An apparatus comprising: a CMOS AND gate to receive a multiplier and a multiplicand; a 1-bit full adder comprising a majority gate or a minority gate coupled to the CMOS AND gate, wherein the 1-bit full adder comprises non-linear polar material, wherein the 1-bit full adder is to receive a sum input and a carry input; and a reset mechanism comprising logic to condition first terminals of capacitors of the 1-bit full adder, the capacitors comprising the non-linear polar material, wherein the reset mechanism is to reset second terminals of the capacitors during a reset phase separate from an evaluation phase, wherein the reset mechanism is to apply a predetermined input to the multiplier, the multiplicand, the sum input, and the carry input during the reset phase.

Example 9b: The apparatus of example 8b, wherein the reset mechanism is to sequentially pull-up and pull-down the second terminals during the reset phase, and to allow the second terminals to float during the evaluation phase.

Example 10b: The apparatus of example 8b, wherein the logic includes at least one NOR gate to condition the first terminals of a first set of capacitors of a 5-input majority gate of the 1-bit full adder.

Example 11b: The apparatus of example 8b, wherein the non-linear polar material comprises ferroelectric material.

Example 12b: The apparatus of example 8b, wherein the reset mechanism comprises a first pull-down device coupled to a 3-input majority gate of the 1-bit full adder such that the first pull-down device is connected to the second terminals of a first set of capacitors of the 3-input majority gate, wherein the first pull-down device is controllable by a first control.

Example 13b: The apparatus of example 12b, wherein the reset mechanism comprises a first pull-up device coupled to the 3-input majority gate such that the first pull-down device is connected to the second terminals of a first set of capacitors of the 3-input majority gate, wherein the first pull-down device is controllable by a second control.

Example 14b: The apparatus of example 13b, wherein the reset mechanism includes a second pull-down device controllable by a third control, wherein the second pull-down device is coupled to a 5-input majority gate such that the second pull-down device is connected to the second terminals of a second set of capacitors of the 5-input majority gate.

Example 15b: The apparatus of example 14b, wherein the reset mechanism includes a second pull-up device controllable by a fourth control, wherein the second pull-up device is coupled to the 5-input majority gate such that the second pull-up device is connected to the second terminals of the second set of capacitors of the 5-input majority gate.

Example 16b: A system comprising: a processor circuitry to execute one or more instructions; a communication interface communicatively coupled to the processor circuitry; and a memory coupled to the processor circuitry, wherein the processor circuitry comprises a multiplier circuitry which includes a reset mechanism comprising logic to condition first terminals of capacitors and reset second terminals of the capacitors during a reset phase separate from an evaluation phase, wherein the capacitors include non-linear polar material.

Example 17b: The system of example 16b, wherein the multiplier circuitry comprises: a CMOS based AND gate; and a 1-bit full adder comprising a majority gate or a minority gate coupled to and output of the CMOS based AND gate, wherein the 1-bit full adder comprises non-linear polar material.

Example 18b: The system of example 17b, wherein the first terminals of the capacitors are of the 1-bit full adder, wherein the capacitors include non-linear polar material.

Example 19b: The system of example 18b, wherein the non-linear polar material includes ferroelectric material.

Example 20b: The system of example 16b, wherein the reset mechanism is to sequentially pull-up and pull-down the second terminals during the reset phase, and to allow the second terminals to float during the evaluation phase.

Example 1c: An apparatus comprising: a 1-bit full adder comprising a majority gate or a minority gate, wherein the 1-bit full adder comprises non-linear polar material; and a reset mechanism comprising logic to condition first terminals of a set of capacitors of the 1-bit full adder, the set of capacitors comprising the non-linear polar material, wherein the reset mechanism is to reset second terminals of the set of capacitors sequentially during a reset phase separate from an evaluation phase.

Example 2c: The apparatus of example 1c comprises: a first inverter which is coupled to a 3-input majority gate of the 1-bit full adder; and a first NOR gate coupled to an output of the first inverter, wherein the first NOR gate is controllable by a reset, wherein an output of the first NOR gate is a carry output, wherein the reset is to condition the output of the first NOR gate during the reset phase.

Example 3c: The apparatus of example 2c wherein an output of the first inverter is coupled to a 5-input majority gate of the 1-bit full adder.

Example 4c: The apparatus of example 3c comprises: a second inverter coupled to the 5-input majority gate; and a second NOR gate coupled to an output of the second inverter, wherein the second NOR gate is controllable by the reset, wherein the reset is to condition the output of the second NOR gate during the reset phase, wherein the output of the second NOR gate is a sum output.

Example 5c: The apparatus of example 4c, wherein the set of capacitors comprises a first set of capacitors, wherein the reset mechanism comprises: a first pull-down device coupled to the 3-input majority gate such that the first pull-down device is connected to the second terminals of the first set of capacitors of the 3-input majority gate, wherein the first pull-down device is controllable by a first control; and a first pull-up device coupled to the 3-input majority gate such that the first pull-down device is connected to the second terminals of the first set of capacitors of the 3-input majority gate, wherein the first pull-down device is controllable by a second control.

Example 6c: The apparatus of example 5c, wherein the set of capacitors includes a second set of capacitors, wherein the reset mechanism includes: a second pull-down device which is controllable by a third control, wherein the second pull-down device is coupled to the 5-input majority gate such that the second pull-down device is connected to the second terminals of the second set of capacitors of the 5-input majority gate; and a second pull-up device which is controllable by a fourth control, wherein the second pull-up device is coupled to the 5-input majority gate such that the second pull-up device is connected to the second terminals of the second set of capacitors of the 5-input majority gate.

Example 7c: The apparatus of example 6c, wherein the reset mechanism is to turn on and off the first pull-up device and the first pull-down device before the reset mechanism is to turn on and off the second pull-up device and the second pull-down device.

Example 8c: The apparatus of example 1c, wherein the non-linear polar material includes ferroelectric material.

Example 9c: An apparatus comprising: an AND gate to receive a multiplier and a multiplicand; a 1-bit full adder comprising a majority gate or a minority gate directly connected to an output of the AND gate, wherein the 1-bit full adder comprises non-linear polar material, wherein the 1-bit full adder is to receive a sum input and a carry input; and a reset mechanism comprising logic to condition first terminals of a set of capacitors of the 1-bit full adder, the set of capacitors comprising the non-linear polar material, wherein the reset mechanism is to reset second terminals of the set of capacitors sequentially during a reset phase separate from an evaluation phase, wherein the reset mechanism is to apply a predetermined input to the multiplier, the multiplicand, the sum input, and the carry input during the reset phase.

Example 10c: The apparatus of example 9c, wherein the reset mechanism is to sequentially pull-up and pull-down the second terminals during the reset phase, and to allow the second terminals to float during the evaluation phase.

Example 11c: The apparatus of example 9c, wherein the non-linear polar material comprises ferroelectric material.

Example 12c: The apparatus of example 9c, wherein the set of capacitors comprises a first set of capacitors, wherein the reset mechanism comprises: a first pull-down device coupled to a 3-input majority gate such that the first pull-down device is connected to the second terminals of the first set of capacitors of the 3-input majority gate, wherein the first pull-down device is controllable by a first control; and a first pull-up device coupled to the 3-input majority gate such that the first pull-down device is connected to the second terminals of the first set of capacitors of the 3-input majority gate, wherein the first pull-down device is controllable by a second control.

Example 13c: The apparatus of example 12c, wherein the set of capacitors includes a second set of capacitors, wherein the reset mechanism includes: a second pull-down device controllable by a third control, wherein the second pull-down device is coupled to a 5-input majority gate such that the second pull-down device is connected to the second terminals of the second set of capacitors of the 5-input majority gate; and a second pull-up device controllable by a fourth control, wherein the second pull-up device is coupled to the 5-input majority gate such that the second pull-up device is connected to the second terminals of the second set of capacitors of the 5-input majority gate.

Example 14c: The apparatus of example 13c, wherein the reset mechanism is to turn on and off the first pull-up device and the first pull-down device before the reset mechanism is to turn on and off the second pull-up device and the second pull-down device.

Example 15c: A system comprising: a processor circuitry to execute one or more instructions; a communication interface communicatively coupled to the processor circuitry; and a memory coupled to the processor circuitry, wherein the processor circuitry comprises a multiplier circuitry which includes: an AND gate comprising non-linear polar material; and a reset mechanism comprising logic to condition first terminals of a set of capacitors of the AND gate, the set of capacitors comprising non-linear polar material, wherein the reset mechanism is to reset second terminals of the set of capacitors sequentially during a reset phase separate from an evaluation phase.

Example 16c: The system of example 15c, wherein the multiplier circuitry: a 1-bit full adder comprising a majority gate or a minority gate directly connected to an output of the AND gate, wherein the 1-bit full adder comprises non-linear polar material.

Example 17c: The system of example 16c, wherein the non-linear polar material includes ferroelectric material or paraelectric material.

Example 18c: The system of example 15c, wherein the reset mechanism is to sequentially pull-up and pull-down the second terminals during the reset phase, and to allow the second terminals to float during the evaluation phase.

Example 19c: The system of example 18c comprises: a first inverter which is coupled to a 3-input majority gate of 1-bit full adder; and a first NOR gate coupled to an output of the first inverter, wherein the first NOR gate is controllable by a first reset, wherein an output of the first NOR gate is a carry output, wherein the first reset is to condition the output of the first NOR gate during the reset phase, wherein an output of the first inverter is coupled to a 5-input majority gate of the 1-bit full adder.

Example 20c: The system of example 19c comprises: a second inverter coupled to the 5-input majority gate; and a second NOR gate coupled to an output of the second inverter, wherein the second NOR gate is controllable by the first reset, wherein the first reset is to condition the output of the second NOR gate during the reset phase, wherein the output of the second NOR gate is a sum output.

Example 1d: An apparatus comprising: a first logic comprising a first majority gate or a first minority gate, the first majority gate or the first minority gate comprising a first non-linear polar material; a second logic comprising a second majority gate or a second minority gate, the second majority gate or the second minority gate comprising a second non-linear polar material; a third logic comprising a third majority gate or a third minority gate, the third majority gate or the third minority gate comprising a third non-linear polar material, wherein an output of the first logic is coupled to an input of the second logic, and wherein an output of the second logic is coupled to an input of the third logic; and a reset mechanism to sequentially reset a first terminal coupled to the first non-linear polar material, a second terminal coupled to the second non-linear polar material, and a third terminal coupled to the third non-linear polar material in a reset phase separate from an evaluation phase.

Example 2d: The apparatus of example 1d, wherein the first terminal is coupled to a first set of capacitors, wherein an individual capacitor comprises the first non-linear polar material, wherein the reset mechanism is to condition inputs to the first set of capacitors in the reset phase.

Example 3d: The apparatus of example 1d, wherein the second terminal is coupled to a second set of capacitors, wherein an individual capacitor comprises the second non-linear polar material, wherein the reset mechanism is to condition inputs to the second set of capacitors in the reset phase.

Example 4d: The apparatus of example 1d, wherein the third terminal is coupled to a third set of capacitors, wherein an individual capacitor comprises the third non-linear polar material, wherein the reset mechanism is to condition inputs to the third set of capacitors in the reset phase.

Example 5d: The apparatus of example 1d, wherein the reset mechanism is to pull-up the first terminal to a supply level, and then pull-down the first terminal to ground in a first cycle and a second cycle, respectively, wherein the reset mechanism is to disable reset of the first majority gate in a third cycle, wherein the first cycle is before the second cycle, and wherein the second cycle is before the third cycle.

Example 6d: The apparatus of example 5d, wherein the reset mechanism is to pull-up the second terminal to a supply level, and then pull-down the second terminal to ground in the second cycle and the third cycle, respectively, wherein the reset mechanism is to disable reset of the second majority gate in a fourth cycle, wherein the fourth cycle is after the third cycle.

Example 7d: The apparatus of example 6d, wherein the reset mechanism is to pull-up the third terminal to a supply level, and then pull-down the third terminal to ground in the third cycle and the fourth cycle, respectively, wherein the reset mechanism is to disable reset of the third majority gate in a fifth cycle, wherein the fifth cycle is after the fourth cycle.

Example 8d: The apparatus of example 5d, wherein the second majority gate operates in the evaluation phase during the first cycle, wherein the reset mechanism is to pull-down the second terminal to a ground level, and then pull-up the second terminal to power supply level in the second cycle and the third cycle, respectively, wherein the reset mechanism is to disable reset of the second majority gate in a fourth cycle, wherein the fourth cycle is after the third cycle.

Example 9d: The apparatus of example 7d, wherein the third logic operates in the evaluation phase during the first cycle and the second cycle.

Example 10d: The apparatus of example 6d, wherein at least two inputs of the second logic are conditioned to logic 1 and logic 0 by the reset mechanism during the reset phase.

Example 11d: The apparatus of example 7d, wherein at least two inputs of the third logic are conditioned to logic 1 and logic 0 by the reset mechanism during the reset phase.

Example 12d: The apparatus of example 2d, wherein the reset mechanism is to condition the inputs to the first set of capacitors to logic 0, logic 1, and logic 0, during the reset phase.

Example 13d: The apparatus of example 1d, wherein the first non-linear polar material, the second non-linear polar material, and the third non-linear polar material are same.

Example 14d: The apparatus of example 1d, wherein the first non-linear polar material, the second non-linear polar material, and the third non-linear polar material are different.

Example 15d: The apparatus of example 1d, wherein the first non-linear polar material, the second non-linear polar material, or the third non-linear polar material include ferroelectric material.

Example 16d: An apparatus comprising: a serial chain of majority gates or minority gates, wherein an individual majority gate or an individual minority gate of the serial chain comprises non-linear polar material; and a reset mechanism to sequentially reset the majority gates or the minority gates of the serial chain to adjust charge on the non-linear polar material.

Example 17d: The apparatus of example 16d, wherein the reset mechanism is to condition at least two inputs of the majority gates or the minority gates of the serial chain during a reset phase.

Example 18d: The apparatus of example 16d, wherein the reset mechanism is to: pull-up, in a first cycle, a first common terminal of a first set of capacitors with the non-linear polar material of a first majority gate of the serial chain of majority gates; pull-down, in a second cycle, the first common terminal, wherein the second cycle is after the first cycle; and allow, in a third cycle, the first common terminal to float, wherein the third cycle is after the second cycle.

Example 19d: The apparatus of example 18d, wherein the reset mechanism is to: allow, in the first cycle, a second common terminal to float, wherein the second common terminal is of a second set of capacitors with the non-linear polar material of a second majority gate of the serial chain of majority gates; pull-up, in the second cycle, the second common terminal; pull-down, in the third cycle, the second common terminal; and allow, in a fourth cycle, the second common terminal to float, wherein the fourth cycle is after the third cycle.

Example 20d: A system comprising: a processor circuitry to execute one or more instructions; a communication interface communicatively coupled to the processor circuitry; and a memory coupled to the processor circuitry, wherein the processor circuitry includes: a serial chain of majority gates or minority gates, wherein an individual majority gate or an individual minority gate of the serial chain; and a reset mechanism to sequentially reset the majority gates or the minority gates of the serial chain.

Example 1e: An apparatus comprising: a first logic comprising a 5-input majority gate including a first input, a second input connected to the first input, a third input, a fourth input coupled to a carry input, and a fifth input coupled to a sum input, wherein an output of the first logic is a sum output; a second logic coupled to the first logic, wherein the second logic includes a 3-input majority or minority gate, wherein the 3-input majority or minority gate includes a sixth input, a seventh input coupled to the carry input, and an eighth input coupled to the sum input; and a reset mechanism to reset the first logic and the second logic in at least two cycles, wherein the reset mechanism is to condition the first input, the second input, the third input, the fourth input, the fifth input, the sixth input, the seventh input, and the eighth input in a reset phase separate from an evaluation phase.

Example 2e: The apparatus of example 1e, wherein at least one input to the first logic or the second logic is modified during the at least two cycles.

Example 3e: The apparatus of example 1e comprising: a third logic comprising a second 3-input majority gate, the second 3-input majority gate comprising a ninth input, a tenth input, an eleventh input, wherein an output of the third logic is coupled to the sixth input of the second logic, wherein the reset mechanism is to condition, in the reset phase, the ninth input, the tenth input to logic high, wherein the eleventh input is coupled to ground.

Example 4e: The apparatus of example 3e, wherein the reset mechanism is to pull-down a first floating node coupled to a first set of capacitors of the third logic during a first cycle.

Example 5e: The apparatus of example 4e, wherein the reset mechanism is to pull-down a second floating node coupled to a second set of capacitors of the second logic during the first cycle, and wherein the reset mechanism is to set the carry input to a logic low in the reset phase during the first cycle.

Example 6e: The apparatus of example 5e, wherein the reset mechanism is to pull-up a third floating node coupled to a third set of capacitors of the third logic during the first cycle, and wherein the reset mechanism is to set the sum input to a logic high in the reset phase during the first cycle.

Example 7e: The apparatus of example 4e, wherein the reset mechanism is to pull-up the first floating node coupled to the first set of capacitors of the third logic during a second cycle, wherein the second cycle is after the first cycle.

Example 8e: The apparatus of example 5e, wherein the reset mechanism is to pull-up the second floating node coupled to the second set of capacitors of the second logic during a second cycle, wherein the second cycle is after the first cycle, and wherein the reset mechanism is to set the carry input to a logic high in the reset phase during the second cycle.

Example 9e: The apparatus of example 6e, wherein the reset mechanism is to pull-down the third floating node coupled to the third set of capacitors of the third logic during a second cycle, wherein the reset mechanism is to set the sum input to a logic low in the reset phase during the second cycle, wherein the second cycle is after the first cycle.

Example 10e: The apparatus of example 1e, wherein the first logic and the second logic comprise a non-linear polar material.

Example 11e: The apparatus of example 10e, wherein the non-linear polar material includes ferroelectric material.

Example 12e: An apparatus comprising: a 1-bit full adder; and a reset mechanism to reset a set of capacitors in the 1-bit full adder during a reset phase over multiple cycles, wherein at least one input to the 1-bit full adder is modified during the multiple cycles.

Example 13e: The apparatus of example 12e, comprises an AND gate coupled to the 1-bit full adder, wherein the AND gate and the 1-bit full adder comprises a non-linear polar material.

Example 14e: The apparatus of example 13e, wherein the reset mechanism is to pull-down a first floating node coupled to a first set of capacitors of the AND gate during a first cycle.

Example 15e: The apparatus of example 14e, wherein the reset mechanism is to pull-down a second floating node coupled to a second set of capacitors of the 1-bit full adder during the first cycle, and wherein the reset mechanism is to set a carry input to the 1-bit full adder in the reset phase during the first cycle.

Example 16e: The apparatus of example 15e, wherein the reset mechanism is to pull-up a third floating node coupled to a third set of capacitors of the 1-bit full adder during the first cycle, and wherein the reset mechanism is to set a sum input to 1-bit full adder in the reset phase during the first cycle.

Example 17e: The apparatus of example 14e, wherein the reset mechanism is to pull-up the first floating node coupled to the first set of capacitors of the AND gate during a second cycle, wherein the second cycle is after the first cycle.

Example 18e: The apparatus of example 15e, wherein the reset mechanism is to pull-up the second floating node coupled to the second set of capacitors of the 1-bit full adder during a second cycle, wherein the second cycle is after the first cycle, and wherein the reset mechanism is to set the carry input to a logic high in the reset phase during the second cycle.

Example 19e: The apparatus of example 16e, wherein the reset mechanism is to pull-down the third floating node coupled to the third set of capacitors of the 1-bit full adder during a second cycle, wherein the reset mechanism is to set the sum input to a logic low in the reset phase during the second cycle, wherein the second cycle is after the first cycle.

Example 20e: A system comprising: a processor circuitry to execute one or more instructions; a communication interface communicatively coupled to the processor circuitry; and a memory coupled to the processor circuitry, wherein the processor circuitry includes: a 1-bit full adder; and a reset mechanism to reset a set of capacitors in the 1-bit full adder during a reset phase over two separate cycles, wherein at least one input to the 1-bit full adder is modified during the two separate cycles.

Example 1f: An apparatus comprising: a 1-bit full adder comprising a majority gate or a minority gate, wherein the 1-bit full adder comprises paraelectric material; and a reset mechanism comprising logic to condition first terminals of a set of capacitors of the 1-bit full adder, the set of capacitors comprising the paraelectric material, wherein the reset mechanism is to reset second terminals of the set of capacitors during a reset phase separate from an evaluation phase, wherein the logic comprises one or more NOR gates controllable by a reset control.

Example 2f: The apparatus of example 1f comprising: an AND gate coupled to the 1-bit full adder.

Example 3f: The apparatus of example 2f, wherein: the AND gate comprises a majority gate or a minority gate having the paraelectric material; the AND gate comprises paraelectric material; or the AND gate is a CMOS based AND gate.

Example 4f: The apparatus of example 1f, wherein the logic comprises a NOR gate having an input coupled to a 3-input majority gate of the 1-bit full adder, wherein the NOR gate is controllable by the reset control.

Example 5f: The apparatus of example 4f, wherein the NOR gate is a first NOR gate, wherein the logic comprises a second NOR gate, wherein the second NOR gate is coupled to an output of the first NOR gate, wherein the second NOR gate is controllable by the reset control, wherein an output of the second NOR gate is a carry out.

Example 6f: The apparatus of example 4f, wherein an output of the NOR gate is coupled to a 5-input majority gate of the 1-bit full adder.

Example 7f: The apparatus of example 6f comprises a buffer coupled to an output of the 5-input majority gate.

Example 8f: The apparatus of example 2f, wherein the reset mechanism comprises: a first pull-up device or a first pull-down device coupled to the AND gate such that the first pull-up device is connected to the second terminals of a first set of capacitors of the AND gate, wherein the first pull-up device or the first pull-down device is controllable by a first control.

Example 9f: The apparatus of example 1f, wherein the reset mechanism includes: a second pull-up device or a second pull-down device which is controllable by a second control, wherein the second pull-up device or the second pull-down device is coupled to the second terminals of a second set of capacitors of the 1-bit full adder.

Example 10f: The apparatus of example 1f, wherein the apparatus comprises: a third pull-up device or a third pull-down device which is controllable by a third control, wherein the third pull-up device or the third pull-down device is coupled to the second terminals of a third set of capacitors of the 1-bit full adder.

Example 11f: The apparatus of example 1f, wherein the paraelectric material includes one of: SrTiO3, Ba(x)Sr(y)TiO3 (where x is −0.5, and y is 0.95)), HfZrO2, Hf—Si—O, La-substituted PbTiO3, and/or PMN-PT based relaxor ferroelectrics.

Example 12f: An apparatus comprising: a 1-bit full adder comprising a majority gate or a minority gate, wherein the 1-bit full adder comprises paraelectric material; and a reset mechanism comprising logic to condition first terminals of a set of capacitors of the 1-bit full adder, the set of capacitors comprising the paraelectric material, wherein the reset mechanism is to reset second terminals of the set of capacitors during a reset phase separate from an evaluation phase, wherein the logic comprises a transmission gate controllable by a reset control, wherein the transmission gate is coupled to the set of capacitors.

Example 13f: The apparatus of example 12f comprising: an AND gate coupled to the 1-bit full adder.

Example 14f: The apparatus of example 13f, wherein: the AND gate comprises a majority gate or a minority gate having the paraelectric material; the AND gate comprises paraelectric material; or the AND gate is a CMOS based AND gate.

Example 15f: The apparatus of example 12f, wherein the transmission gate is coupled to a pull-down device or a pull-up device which is to force a condition on some capacitors of a set of capacitors.

Example 16f: The apparatus of example 13f, wherein the reset mechanism comprises: a first pull-up device or a first pull-down device coupled to the AND gate such that the first pull-up device is connected to the second terminals of a first set of capacitors of the AND gate, wherein the first pull-up device or the first pull-down device is controllable by a first control.

Example 17f: The apparatus of example 12f, wherein the reset mechanism includes: a second pull-up device or a second pull-down device which is controllable by a second control, wherein the second pull-up device or the second pull-down device is coupled to the second terminals of a second set of capacitors of the 1-bit full adder.

Example 18f: The apparatus of example 12f, wherein the apparatus comprises: a third pull-up device or a third pull-down device which is controllable by a third control, wherein the third pull-up device or the third pull-down device is coupled to the second terminals of a third set of capacitors of the 1-bit full adder.

Example 19f: A system comprises: a memory to store one or more instructions; a processor circuitry coupled to the memory, wherein the processor circuitry is to execute the one or more instructions; and a communication interface to allow the processor circuitry to communicate with another device, wherein the processor circuitry includes: a 1-bit full adder comprising a majority gate or a minority gate, wherein the 1-bit full adder comprises paraelectric material; and a reset mechanism comprising logic to condition first terminals of a set of capacitors of the 1-bit full adder, the set of capacitors comprising the paraelectric material, wherein the reset mechanism is to reset second terminals of the set of capacitors during a reset phase separate from an evaluation phase, wherein the logic comprises one or more NOR gates controllable by a reset control.

Example 20f: The system of example 19f comprising: an AND gate coupled to the 1-bit full adder.

Example 1g: An apparatus comprising: a first logic comprising a first majority gate or a first minority gate, the first majority gate or the first minority gate comprising a first paraelectric material; a second logic comprising a second majority gate or a second minority gate, the second majority gate or the second minority gate comprising a second paraelectric material; a third logic comprising a third majority gate or a third minority gate, the third majority gate or the third minority gate comprising a third paraelectric material, wherein an output of the first logic is coupled to an input of the second logic, and wherein an output of the second logic is coupled to an input of the third logic; and a reset mechanism to simultaneously or substantially simultaneously reset a first terminal coupled to the first paraelectric material, a second terminal coupled to the second paraelectric material, and a third terminal coupled to the third paraelectric material in a reset phase separate from an evaluation phase.

Example 2g: The apparatus of example 1g, wherein the first terminal is coupled to a first set of capacitors, wherein an individual capacitor comprises the first paraelectric material, wherein the reset mechanism is to condition inputs to the first set of capacitors in the reset phase.

Example 3g: The apparatus of example 1g, wherein the second terminal is coupled to a second set of capacitors, wherein an individual capacitor comprises the second paraelectric material, wherein the reset mechanism is to condition inputs to the second set of capacitors in the reset phase.

Example 4g: The apparatus of example 1g, wherein the third terminal is coupled to a third set of capacitors, wherein an individual capacitor comprises the third paraelectric material, wherein the reset mechanism is to condition inputs to the third set of capacitors in the reset phase.

Example 5g: The apparatus of example 1g, wherein the reset mechanism is to pull-up or pull-down the first terminal to a supply level or to a ground, respectively.

Example 6g: The apparatus of example 5g, wherein the reset mechanism is to pull-up or pull-down the second terminal to the supply level or to the ground.

Example 7g: The apparatus of example 6g, wherein the reset mechanism is to pull-up or pull-down the third terminal to the supply level of the ground.

Example 8g: The apparatus of example 1g, wherein at least two inputs of the first logic, the second logic, and the third logic are conditioned to logic 1 or logic 0 by the reset mechanism during the reset phase.

Example 9g: The apparatus of example 1g, wherein the first paraelectric material, the second paraelectric material, and the third paraelectric material are same.

Example 10g: The apparatus of example 1g, wherein the first paraelectric material, the second paraelectric material, and the third paraelectric material are different.

Example 11g: The apparatus of example 1g, wherein the first paraelectric material, the second paraelectric material, or the third paraelectric material includes one of: SrTiO3, Ba(x)Sr(y)TiO3 (where x is −0.5, and y is 0.95)), HfZrO2, Hf—Si—O, La-substituted PbTiO3, and/or PMN-PT based relaxor ferroelectrics.

Example 12g: An apparatus comprising: a serial chain of majority gates or minority gates, wherein an individual majority gate or an individual minority gate of minority gate of the serial chain comprises paraelectric material; and a reset mechanism to simultaneously or substantially simultaneously reset the majority gates or the minority gates of the serial chain to adjust charge on the paraelectric material.

Example 13g: The apparatus of example 12g, wherein the reset mechanism is to condition at least two inputs of the majority gates or the minority gates of the serial chain during a reset phase.

Example 14g: The apparatus of example 12g, wherein the reset mechanism is to: pull-up or pull-down, in a first cycle, a first common terminal of a first set of capacitors with the paraelectric material of a first majority gate or a first minority gate of the serial chain of majority gates; pull-up or pull-down, in the first cycle, a second common terminal of a second set of capacitors with the paraelectric material of a second majority gate or a second minority gate of the serial chain of majority gates; and pull-up or pull-down, in the first cycle, a third common terminal of a third set of capacitors with the paraelectric material of a third majority gate or a third minority gate of the serial chain of majority gates.

Example 15g: The apparatus of example 14g, wherein the reset mechanism is to: allow, in a second cycle, the first common terminal, the second common terminal, and the third common terminal to float, wherein the second cycle is after the first cycle.

Example 16g: The apparatus of example 12g, wherein the reset mechanism comprises a NOR gate or NAND gate coupled to an output of a first of the majority gates or minority gates of the serial chain to a second of the majority gates or minority gates of the serial chain, wherein the NOR gate or the NAND gate is controllable by a reset control during a reset phase separate from an evaluation phase.

Example 17g: A system comprising: a processor circuitry to execute one or more instructions; a communication interface communicatively coupled to the processor circuitry; and a memory coupled to the processor circuitry, wherein the processor circuitry includes: a serial chain of majority gates or minority gates, wherein an individual majority gate or an individual minority gate of the serial chain comprises paraelectric material; and a reset mechanism to simultaneously or substantially simultaneously reset the majority gates or the minority gates of the serial chain to adjust charge on the paraelectric material.

Example 18g: The system of example 17g, wherein the reset mechanism is to condition at least two inputs of the majority gates or the minority gates of the serial chain during a reset phase.

Example 19g: The system of example 17g, wherein the reset mechanism is to: pull-up or pull-down, in a first cycle, a first common terminal of a first set of capacitors with the paraelectric material of a first majority gate or a first minority gate of the serial chain of majority gates; pull-up or pull-down, in the first cycle, a second common terminal of a second set of capacitors with the paraelectric material of a second majority gate or a second minority gate of the serial chain of majority gates; and pull-up or pull-down, in the first cycle, a third common terminal of a third set of capacitors with the paraelectric material of a third majority gate or a third minority gate of the serial chain of majority gates.

Example 20g: The system of example 19g, wherein the reset mechanism is to: allow, in a second cycle, the first common terminal, the second common terminal, and the third common terminal to float, wherein the second cycle is after the first cycle.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a 1-bit full adder comprising a majority gate or a minority gate, wherein the 1-bit full adder comprises non-linear polar material; and
    a reset mechanism comprising logic to condition first terminals of capacitors of the 1-bit full adder, the capacitors comprising the non-linear polar material, wherein the reset mechanism is to reset second terminals of the capacitors during a reset phase separate from an evaluation phase, and wherein the logic comprises one or more NAND gate and NOR gates.

2. The apparatus of claim 1 comprising: an AND gate which includes a majority gate or a minority gate having non-linear polar material, wherein the AND gate is coupled to the 1-bit full adder.

3. The apparatus of claim 2, wherein the logic comprises:
    an inverter which is coupled to the AND gate; and
    a NAND gate coupled to an output of the inverter, wherein an output of the NAND gate is coupled a 3-input majority gate of the 1-bit full adder, and wherein the NAND gate is to receive a first reset to condition the output of the NAND gate during the reset phase.

4. The apparatus of claim 3, wherein the inverter is a first inverter, wherein the logic comprises:
    a first NOR gate coupled to an output of the inverter, wherein the first NOR gate receives a second reset, wherein the second reset is inverse of the first reset, wherein an output of the first NOR gate is coupled to a 5-input majority gate of the 1-bit full adder, and wherein the second reset is to condition the output of the first NOR gate during the reset phase;
    a second inverter which is coupled to the 3-input majority gate; and
    a second NOR gate coupled to an output of the second inverter, wherein the second NOR gate is controllable by the second reset, wherein an output of the second NOR gate is a carry output, and wherein the second reset is to condition the output of the second NOR gate during the reset phase.

5. The apparatus of claim 4 comprises a third inverter coupled to the output of the second NOR gate, wherein an output of the third inverter is coupled to the 5-input majority gate.

6. The apparatus of claim 5, wherein the logic comprises:
    a fourth inverter coupled to the 5-input majority gate; and
    a third NOR gate coupled to an output of the fourth inverter, wherein the third NOR gate is controllable by the second reset, wherein the second reset is to condition the output of the third NOR gate during the reset phase, and wherein the output of the third NOR gate is a sum output.

7. The apparatus of claim 6, wherein the reset mechanism comprises:
    a first pull-up device coupled to the AND gate such that the first pull-up device is connected to the second terminals of a first set of capacitors of the AND gate, wherein the first pull-up device is controllable by a first control; and
    a first pull-down device controllable by a second control, wherein the first pull-down device is coupled to the second terminals of the first set of capacitors of the AND gate.

8. The apparatus of claim 7, wherein the reset mechanism includes:
    a second pull-up device which is controllable by a third control, wherein the second pull-up device is coupled to the second terminals of a second set of capacitors of the 1-bit full adder; and
    a second pull-down device which is controllable by a fourth control, wherein the second pull-down device is coupled to the second terminals of the second set of capacitors of the 1-bit full adder.

9. The apparatus of claim 8, wherein the apparatus comprises:
    a third pull-up device which is controllable by a fifth control, wherein the third pull-up device is coupled to the second terminals of a third set of capacitors of the 1-bit full adder; and a second pull-down device which is controllable by a sixth control, wherein the second pull-down device is coupled the second terminals of the third set of capacitors of the 1-bit full adder.

10. The apparatus of claim 1, wherein the non-linear polar material includes ferroelectric material, wherein the ferroelectric material includes one of:
Bismuth ferrite (BFO) with a first doping material wherein the first doping material is one of Lanthanum or elements from lanthanide series of periodic table;
Lead zirconium titanate (PZT) or PZT with a second doping material, wherein the second doping material is one of La or Nb;
a relaxor ferroelectric which includes one of: lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
a perovskite which includes one of: $BaTiO_3$, $PbTiO_3$, $KNbO_3$, or $NaTaO_3$;
a first hexagonal ferroelectric which includes one of: $YMnO_3$ or $LuFeO_3$;
a second hexagonal ferroelectric of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides;
Hafnium oxides as $Hf_{1-x}E_xO_y$, where E can be Al, Ca, Ce, Dy, Er, Gd, Ge, La, Sc, Si, Sr, Sn, Zr, or Y, wherein x and y are first and second fractions, respectively;
$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where x and y and third and fourth fractions, respectively;
y doped $HfO_2$, where y includes one of: Al, Ca, Ce, Dy, Er, Gd, Ge, La, Sc, Si, Sr, Sn, or Y;
Niobate type compounds $LiNbO_3$, $LiTaO_3$, Lithium iron Tantalum Oxy Fluoride, Barium Strontium Niobate, Sodium Barium Niobate, or Potassium strontium niobate; or
an improper ferroelectric which includes one of: [PTO/STO]n or [LAO/STO]n, where 'n' is between 1 to 100.

11. An apparatus comprising:
an AND gate comprising a majority gate or a minority gate having non-linear polar material, wherein the AND gate is to receive a multiplier and a multiplicand;
a 1-bit full adder comprising a majority gate or a minority gate coupled to the AND gate, wherein the 1-bit full adder comprises non-linear polar material, and wherein the 1-bit full adder is to receive a sum input and a carry input; and
a reset mechanism comprising logic to condition first terminals of capacitors of the AND gate and the 1-bit full adder, the capacitors comprising the non-linear polar material, wherein the reset mechanism is to reset second terminals of the capacitors during a reset phase separate from an evaluation phase, and wherein the reset mechanism is to apply a predetermined input to the multiplier, the multiplicand, the sum input, and the carry input during the reset phase.

12. The apparatus of claim 11, wherein the reset mechanism is to sequentially pull-up and pull-down the second terminals during the reset phase, and to allow the second terminals to float during the evaluation phase.

13. The apparatus of claim 11, wherein the logic includes at least one NOR gate and a NAND gate to condition the first terminals of the capacitors.

14. The apparatus of claim 11, wherein the non-linear polar material comprises ferroelectric material.

15. The apparatus of claim 11, wherein the reset mechanism is to reset the second terminals of the capacitors substantially simultaneously.

16. A system comprising:
a processor circuitry to execute one or more instructions;
a communication interface communicatively coupled to the processor circuitry; and
a memory coupled to the processor circuitry, wherein the processor circuitry comprises a multiplier circuitry which includes:
a majority gate or a minority gate having non-linear polar material, wherein the majority gate or the minority gate is coupled to a NOR gate or a NAND gate; and
a reset mechanism to a reset a set of nodes coupled to the non-linear polar material during a reset phase separate from an evaluation phase, wherein a node from the set of nodes is coupled to the NOR gate or the NAND gate, and wherein the NOR gate or the NAND gate is controllable by the reset mechanism.

17. The system of claim 16, wherein the set of nodes includes a first node, wherein the reset mechanism comprises:
a pull-down device coupled to the majority gate or the minority gate such that the pull-down device is connected to the first node which connects to the non-linear polar material, wherein the pull-down device is controllable by a first control; and
a pull-up device coupled to the majority gate or the minority gate such that the pull-up device is connected to the first node connecting the non-linear polar material, wherein the pull-up device is controllable by a second control.

18. The system of claim 17, wherein the reset mechanism is to condition inputs to the majority gate or the minority gate, and to sequentially pull-up and pull-down the pull-up device and the pull-down device, respectively, during the reset phase.

19. The system of claim 17, wherein the reset mechanism is to sequence a pull-up event and a pull-down event according to logic condition of inputs to the majority gate or the minority gate.

20. The system of claim 17, wherein the non-linear polar material includes one of a ferroelectric material or paraelectric material.

* * * * *